United States Patent
McCarron et al.

(10) Patent No.: US 10,541,663 B2
(45) Date of Patent: *Jan. 21, 2020

(54) MULTI-STAGE DEPOSITION SYSTEM FOR GROWTH OF INCLINED C-AXIS PIEZOELECTRIC MATERIAL STRUCTURES

(71) Applicant: Qorvo US, Inc., Greensboro, NC (US)

(72) Inventors: Kevin McCarron, Bend, OR (US); John Belsick, Bend, OR (US)

(73) Assignee: QORVO US, INC., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/293,091

(22) Filed: Oct. 13, 2016

(65) Prior Publication Data

US 2017/0111022 A1 Apr. 20, 2017

Related U.S. Application Data

(60) Provisional application No. 62/241,264, filed on Oct. 14, 2015.

(51) Int. Cl.
*C23C 14/34* (2006.01)
*H03H 3/02* (2006.01)
(Continued)

(52) U.S. Cl.
CPC ............ *H03H 3/02* (2013.01); *C30B 25/06* (2013.01); *C30B 25/186* (2013.01); *C30B 29/403* (2013.01); *H01J 37/32715* (2013.01); *H01J 37/3447* (2013.01); *H01L 41/35* (2013.01); *H03H 9/02015* (2013.01);
(Continued)

(58) Field of Classification Search
CPC ................................. H01J 37/3447
See application file for complete search history.

(56) References Cited

U.S. PATENT DOCUMENTS 3,766,041 A 10/1973 Wasa et al.
3,781,721 A 12/1973 Judd et al.
(Continued)

FOREIGN PATENT DOCUMENTS

JP 0693435 A 4/1994
JP 08316147 A * 11/1996
(Continued)

OTHER PUBLICATIONS abstract of JP-08316147-A (Year: 1996).*
(Continued)

*Primary Examiner* — Jason Berman
(74) *Attorney, Agent, or Firm* — Mueting, Raasch & Gebhardt, P.A.

(57) ABSTRACT

Systems and methods for growing hexagonal crystal structure piezoelectric material with a c-axis that is tilted (e.g., 25 to 50 degrees) relative to normal of a face of a substrate are provided. A deposition system includes a linear sputtering apparatus, a translatable multi-aperture collimator, and a translatable substrate table arranged to hold multiple substrates, with the substrate table and/or the collimator being electrically biased to a nonzero potential. An enclosure includes first and second deposition stations each including a linear sputtering apparatus, a collimator, and a deposition aperture.

22 Claims, 35 Drawing Sheets

(51) Int. Cl.
*H01J 37/34* (2006.01)
*H01L 41/35* (2013.01)
*C30B 25/06* (2006.01)
*C30B 25/18* (2006.01)
*C30B 29/40* (2006.01)
*H03H 9/02* (2006.01)
*H03H 9/205* (2006.01)
*H03H 9/125* (2006.01)
*H01J 37/32* (2006.01)

(52) U.S. Cl.
CPC .... *H03H 9/02047* (2013.01); *H03H 9/02157* (2013.01); *H03H 9/125* (2013.01); *H03H 9/205* (2013.01)

(56) References Cited

U.S. PATENT DOCUMENTS

| | | | |
|---|---|---|---|
| 4,640,756 | A | 2/1987 | Wang et al. |
| 4,719,383 | A | 1/1988 | Wang et al. |
| 5,518,594 | A | 5/1996 | Marcquart et al. |
| 5,728,276 | A | 3/1998 | Katsuki et al. |
| 5,958,193 | A | 9/1999 | Brugge |
| 6,827,824 | B1* | 12/2004 | Blalock ............ C23C 14/345 204/192.12 |
| 7,033,461 | B2 | 4/2006 | Tani et al. |
| 7,047,792 | B1 | 5/2006 | Bhethanabotla et al. |
| 7,468,608 | B2 | 12/2008 | Feucht et al. |
| 7,675,388 | B2 | 3/2010 | Cardona |
| 8,409,875 | B2 | 4/2013 | Johal et al. |
| 2003/0159919 | A1* | 8/2003 | Fairbairn ............ C23C 14/568 204/192.2 |
| 2004/0216992 | A1* | 11/2004 | Ando ............ C23C 14/225 204/192.12 |
| 2005/0145477 | A1* | 7/2005 | Kaas ............ C23C 14/044 204/192.12 |
| 2005/0194545 | A1* | 9/2005 | Lee ............ H01J 37/34 250/438 |
| 2008/0197750 | A1 | 8/2008 | Katardjiev et al. |
| 2008/0247264 | A1 | 10/2008 | Gabl et al. |
| 2009/0134011 | A1* | 5/2009 | Rohrmann ............ C23C 14/34 204/192.2 |
| 2009/0246385 | A1 | 10/2009 | Felmetsger et al. |
| 2016/0197593 | A1 | 7/2016 | Hurwitz et al. |
| 2017/0110300 | A1 | 4/2017 | McCarron et al. |
| 2017/0111021 | A1 | 4/2017 | McCarron et al. |
| 2017/0111023 | A1 | 4/2017 | McCarron et al. |
| 2017/0111028 | A1 | 4/2017 | McCarron et al. |
| 2017/0168018 | A1 | 6/2017 | Morton et al. |
| 2017/0168026 | A1 | 6/2017 | Morton et al. |

FOREIGN PATENT DOCUMENTS

| | | |
|---|---|---|
| JP | 09-181369 A | 7/1997 |
| WO | WO 2006/101450 A1 | 9/2006 |
| WO | WO 2012/003994 A1 | 1/2012 |
| WO | WO 2017/066448 A1 | 4/2017 |
| WO | WO 2017/066449 A1 | 4/2017 |
| WO | WO 2017/106489 A3 | 6/2017 |

OTHER PUBLICATIONS

Qorvo US, Inc., "Summary of Sales Activity of Predecessor to Applicant Concerning Tilted C-Axis Aluminum Nitride Products," Unpublished, Jan. 10, 2017, 1 page.
Author Unknown, "Understanding Planar Magnetrons for PVD Coatings," Semicore Equipment, Inc., May 14, 2013, 4 pages, www.azonano.com/article.aspx?ArticleID=3454.
Bjurström, Johan, "Advanced Thin Film Electroacoustic Devices," Digital Comprehensive Summaries of Uppsala Dissertations from the Faculty of Science and Technology, 280, ISSN 1651-6214, 2007, 86 pages.
Bjurström, Johan et al., "Synthesis of Textured Thin Piezoelectric AlN Films With a Nonzero C-Axis Mean Tilt for the Fabrication of Shear Mode Resonators," IEEE Transactions on Ultrasonics, Ferroelectrics, and Frequency Control, vol. 53, No. 11, Nov. 2006, pp. 2095-2100.
Demiguel-Ramos, M. et al., "Induced Surface Roughness to Promote the Growth of Tilted-AlN Films for Shear Mode Resonators," 2013 Joint UFFC, EFTF and PFM Symposium Proceedings, 2013, IEEE, pp. 274-277.
Fardeheb-Mammeri, A. et al., "Growth and characterization of c-axis inclined AlN films for shear wave devices," Semiconductor Science and Technology, vol. 23, Aug. 12, 2008, 7 pages.
Fardeheb-Mammeri, A. et al., "Growth of inclined c-axis AlN films in planar system for BAW devices," Journal of Electron Devices, vol. 5, 2007, pp. 132-137.
García-Gancedo, L. et al., "AlN-based BAW resonators with CNT electrodes for gravimetric biosensing," Sensors and Actuators B: Chemical, vol. 160, No. 1, Dec. 15, 2011, pp. 1386-1393.
García-Gancedo, L. et al., "Dual-Mode Thin Film Bulk Acoustic Wave Resonators for Parallel Sensing of Temperature and Mass Loading," Biosensors and Bioelectronics, vol. 38, No. 1, Oct.-Dec. 2012, pp. 369-374.
Iriarte, Gonzalo F. et al., "Synthesis of C-Axis-Oriented Ain Thin Films on High-Conducting Layers: Al, Mo, Ti, TiN, and Ni," IEEE Transactions on Ultrasonics, Ferroelectrics, and Frequency Control, vol. 52, No. 7, Jul. 2005, pp. 1170-1174.
Link, Mathias, "Study and realization of shear wave mode solidly mounted film bulk acoustic resonators (FBAR) made of c-axis inclined zinc oxide (ZnO) thin films: application as gravimetric sensors in liquid environments," Université Henri Poincaré—Nancy I, Thesis, Sep. 14, 2006, 225 pages.
Milyutin, Evgeny, "Theoretical and Experimental Study of Piezoelectric Modulated AlN Thin Films for Shear Mode BAW Resonators," EPFL, Thesis No. 5113, Nov. 4, 2011, 109 pages.
Moreria, Milena et al., "Synthesis of c-tilted AlN films with a good tilt and thickness uniformity," 2011 IEEE International Ultrasonics Symposium Proceedings, 2011, pp. 1238-1241.
Moreira, Milena De Albuquerque, "Synthesis of Thin Piezoelectric AlN Films in View of Sensors and Telecom Applications," Digital Comprehensive Summaries of Uppsala Dissertations from the Faculty of Science and Technology, 1160, ISSN 1651-6214, 2014, 84 pages.
Munir, Farasat, "A Fast, Scalable Acoustic Resonator-Based Biosensor Array System for Simultaneous Detection of Multiple Biomarkers," Thesis, Georgia Institute of Technology, Dec. 2012, 160 pages.
Nirschl, Martin et al., "CMOS-Integrated Film Bulk Acoustic Resonators for Label-Free Biosensing," Sensors, vol. 10, No. 5, Apr. 27, 2010, pp. 4180-4193.
Stan, G. E. et al., "Tilt c Axis Crystallite Growth of Aluminium Nitride Films by Reactive RF-Magnetron Sputtering," Digest Journal of Nanomaterials and Biostructures, vol. 7, No. 1, Jan.-Mar. 2012, pp. 41-50.
Suzuki, Masashi et al., "C-axis parallel oriented AlN film resonator fabricated by ion-beam assisted RF magnetron sputtering," 2011 IEEE International Ultrasonics Symposium Proceedings, 2011, pp. 1230-1233.
Waite, Matthew M. et al., "Sputtering Sources," 50 Years of Vacuum Coating Technology and the growth of the Society of Vacuum Coaters, Chapter 15, 2007, Society of Vacuum Coaters, Spring Bulletin, 2010, pp. 42-50.
Yang, J.S. et al., "Sputtered C-Axis Inclined Piezoelectric Films and Shear Wave Resonators," IEEE 37th Annual Symposium on Frequency Control, 1983, IEEE, pp. 144-150.
Yanagitani, T. et al., "Pure-shear mode BAW resonators consisting of (11-20) textured ZnO films," Acoustics 08 Paris, 2008, pp. 4987-4992.
Zhou, Yan et al., "Interfacial Structures and Properties of Organic Materials for Biosensors: An Overview," Sensors, vol. 12, Nov. 6, 2012, pp. 15036-15062.
Chapter 22, Yanagitani, "Shear Mode Piezoelectric Thin Film Resonators," in *Acoustic Waves—From Microdevices to Helioseismology*. Beghi (:Ed.), InTech; Nov. 14, 2011. pp. 501-520.

(56) References Cited

OTHER PUBLICATIONS

Chen et al., "Characteristics of Dual Mode AlN Thin Film Bulk Acoustic Wave Resonators," IEEE International Frequency Control Symposium [online]. May 19-21, 2008, published in: May 2008, *IEEE*, 609-14.

Chen et al., "The Liquid Sensor Using Thin Film Bulk Acoustic Resonator with C-Axis Tilted AlN Films," 2013, *Journal of Nanomaterials*, 2013:8.

Connolly, "Diffraction Basics, Part 2," Spring 2012, *EPS400-002, Introduction to X-Ray Powder Diffraction*, 12 pages.

Depla et al. "Sputter Deposition Process," 2010. *Handbook of Deposition Technologies for Films and Coatings: Science, Applications and Technology*, 253-96.

Jamneala et al. "Modified Mason Model for Bulk Acoustic Wave Resonators," Sep. 2008, *IEEE Transactions on Ultrasonics, Ferroelectrics, and Frequency Control*, 55(9):2025-29.

Kobayashi, "X-ray thin film measurement techniques: IV. In-plan XRD measurements," 2010, *The Rigaku Journal*, 26(1):3-11.

Montagut, Yeison et al. "QCM Technology in Biosensors," Biosensors—Emerging Materials and Applications, Chapter 9, 2011, INTECH Open Access Publisher, pp. 153-178.

Qin et al., "Analytical Study of Dual-Mode Thin Film Bulk Acoustic Resonators (FBARs) Based on ZnO and AlN Films with Tilted c-Axis Orientation," Aug. 2010, *IEEE Trans. UFFC*, 57(8):1840-53.

Thornton, "Influence of apparatus geometry and deposition conditions on the structure and topography of thick sputtered coatings," 1974. *J. Vac. Sci. Technology*, A 11:666.

Ye, Tao et al. "Photoreactivity of Alkysiloxane Self-Assembled Monolayers on Silicon Oxide Surfaces," Langmuir, vol. 17, No. 15, Jun. 21, 2001, pp. 4497-4500.

Yu, Hongyu et al., "Ultra Temperature-Stable Bulk-Acoustic-Wave Resonators with $SiO_2$ Compensation Layer," IEEE Transactions on Ultrasonics, Ferroelectrics, and Frequency Control, vol. 54, No. 10, Oct. 2007, pp. 2102-2109—4010.

Zhang, X et al. "Excimer laser ablation of thin gold films on quartz crustal microbalance at various argon background pressures," Applied Physics A, vol. 64, No. 6, Jun. 1997 pp. 545-552.

U.S. Appl. No. 15/380,482, filed Dec. 15, 2016, Morton et al.
U.S. Appl. No. 15/380,551, filed Dec. 15, 2016, Morton et al.
U.S. Appl. No. 15/293,063, filed Oct. 13, 2016, McCarron et al.
U.S. Appl. No. 15/293,071, filed Oct. 13, 2016, McCarron et al.
U.S. Appl. No. 15/293,082, filed Oct. 13, 2016, McCarron et al.
U.S. Appl. No. 15/293,108, filed Oct. 13, 2016, McCarron et al.
PCT/US2016/056840, filed Oct. 13, 2016, McCarron et al.
PCT/US2016/056843, filed Oct. 13, 2016, McCarron et al.
PCT/US2016/066913, filed Dec. 15, 2016, Morton et al.
International Patent Application No. PCT/US2016/066913, filed Dec. 15, 2016; International Search Report/Written Opinion dated Jul. 11, 2017; 22 pages.
International Patent Application No. PCT/US2016/066913, filed Dec. 15, 2016; International Preliminary Report on Patentability dated Jun. 28, 2018; 13 pages.
International Patent Application No. PCT/US2016/056840, filed Oct. 13, 2016; International Search Report/Written Opinion dated Jan. 20, 2017; 19 pages.
International Patent Application No. PCT/US2016/056840, filed Oct. 13, 2016; International Preliminary Report on Patentability dated Apr. 26, 2018; 14 pages.
International Patent Application No. PCT/US2016/056843, filed Oct. 13, 2016; International Search Report/Written Opinion dated Jan. 26, 2017; 18 pages.
International Patent Application No. PCT/US2016/056843, filed Oct. 13, 2016; International Preliminary Report on Patentability dated Apr. 26, 2018; 13 pages.

Bjurström, et al., "Design and Fabrication of Temperature Compensated Liquid Fbar Sensors," *2006 IEEE Ultrasonics Symposium*, Oct. 2-6, 2006, pp. 894-897.

Chang et al., "The influence of Mg doped ZnO thin films on the properties of Love wave sensors," May 28, 2008, *Sensors and Actuators B*, 132(1):290-295.

Chen et al., "Temperature stability of ZnO-based Love wave biosensor with SiO2 buffer layer," Dec. 1, 2009, *Sensors and Actuators A*, 156(2):317-22.

Corso, et al., "Development of a Simple Inexpensive Bulk Acoustic Wave (BAW) Nanosensor for Cancer Biomarkers: Detection on Secreted Sonic Hedgehog from Prostate Cancer Cells", Abstract #8866, Winship Cancer Institute, Emory University, Georgia Institute of Technology, Oct. 2012, 1 page.

Koskenvuori et al., "Temperature Measurement and Compensation Based on Two Vibrating Modes of a Bulk Acoustic Mode Microresonator," *MEMS 2008*, Tucson, Arizona, Jan. 13-17, 2008, pp. 78-81.

Lee et al., "Microfluidic Mixing: A Review," May 18, 2011, *International Journal of Molecular Sciences*, 12:3263-87.

Petit, D., et al., "Temperature Compensated BAW Resonator and Its Integrated Thermistor for a 2.5 GHz Electrically Thermally Compensated Oscillator," IEEE Radio Frequency Integrated Circuits Symposium, Jun. 7-9, 2009, pp. 339-342.

Pierce, D.E., et al., "A Temperature Insensitive Quartz Microbalance," IEEE Transactions on Ultrasonics, Ferroelectrics, and Frequency Control, vol. 45, No. 5, Sep. 1998, pp. 1238-1245.

Rabus et al., "A high sensitivity open loop electronics for gravimetric acoustic wave-based sensors," Jun. 2013, *IEEE Transactions on Ultrasonics, Ferroelectrics, and Frequency Control*, 60(6):1219-1226.

Smith, et al., "Self-Consistent Temperature Compensation for Resonant Sensor with Application to Quartz Bulk Acoustic Wave Chemical Sensors," 8th International Conference on Solid-State Sensors and Actuators, 1995, and Eurosensors IX, Transducers '95, vol. 2, Jun. 25-29, 1995, pp. 724-727.

U.S. Appl. No. 15/293,063, filed Oct. 13, 2016.
U.S. Appl. No. 15/293,071, filed Oct. 13, 2016.
U.S. Appl. No. 15/293,082, filed Oct. 13, 2016.
U.S. Appl. No. 15/293,108, filed Oct. 13, 2016.
U.S. Appl. No. 62/646,208, filed Mar. 21, 2018, Deniz et al.
U.S. Appl. No. 62/646,212, filed Mar. 21, 2018, Deniz et al.
U.S. Appl. No. 62/646,213, filed Mar. 21, 2018, Deniz et al.

Lakin, "Modeling of Thin Film Resonators and Filters," 1992, *IEEE MTT-S Microwave Symposium Digest*, pp. 149-152.

* cited by examiner

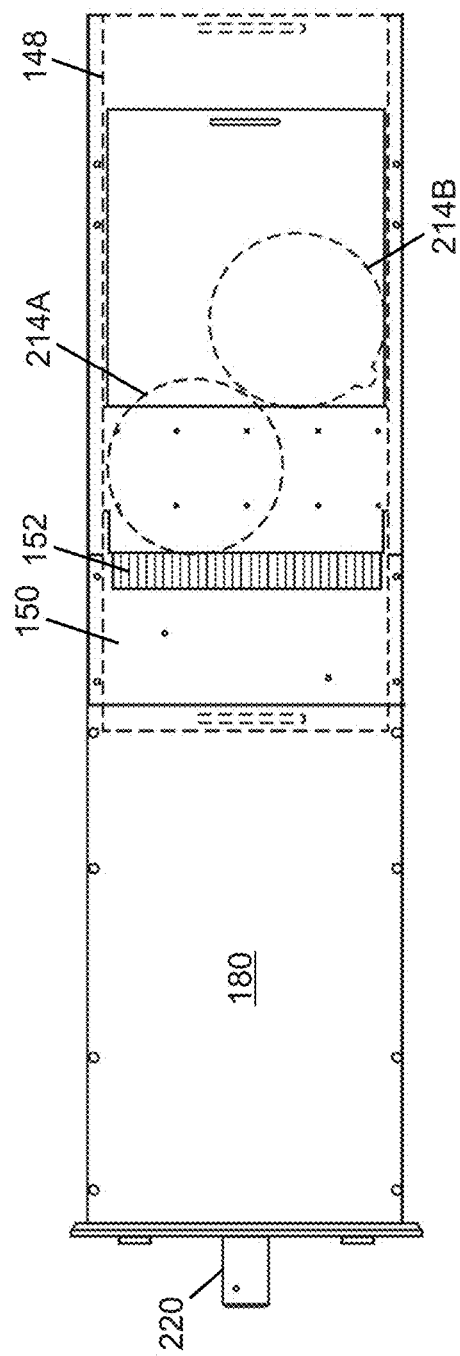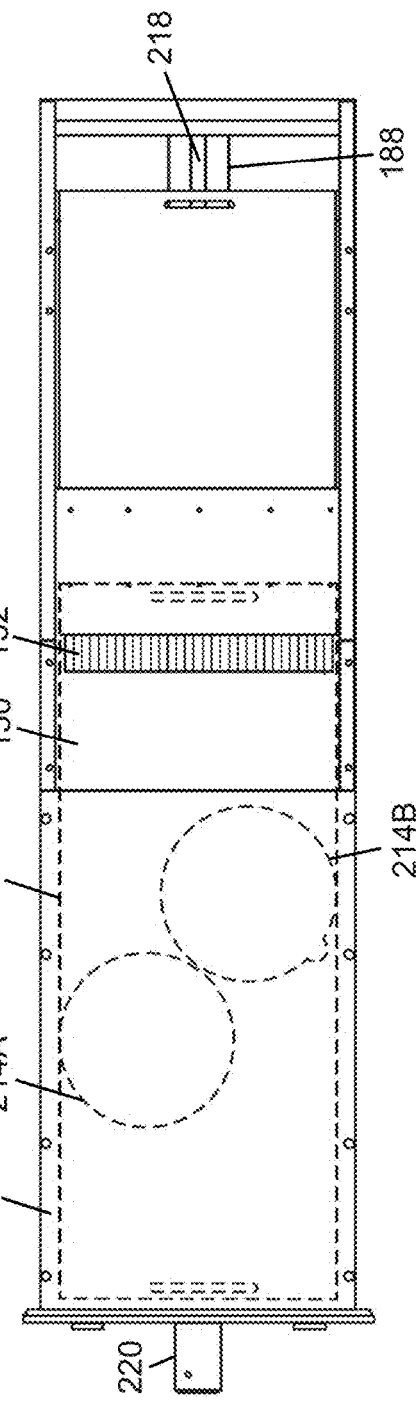
FIG. 14A
FIG. 14B

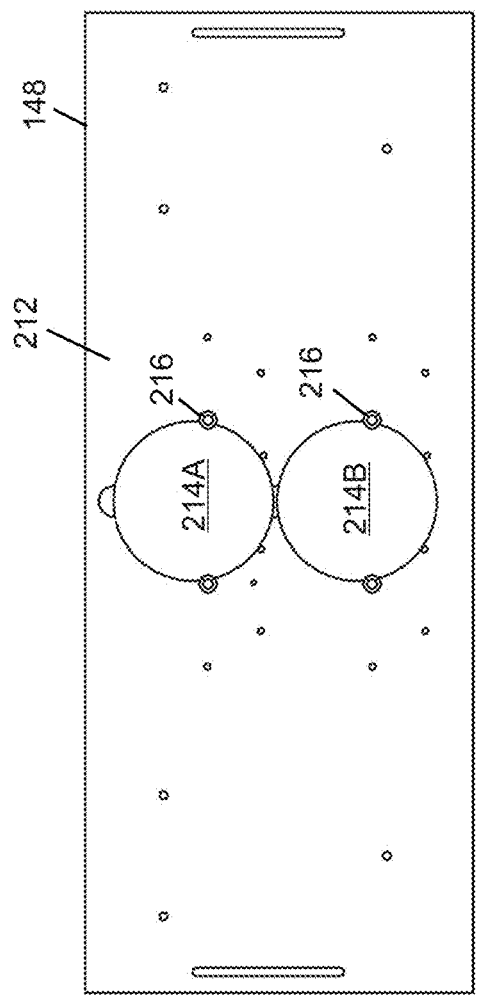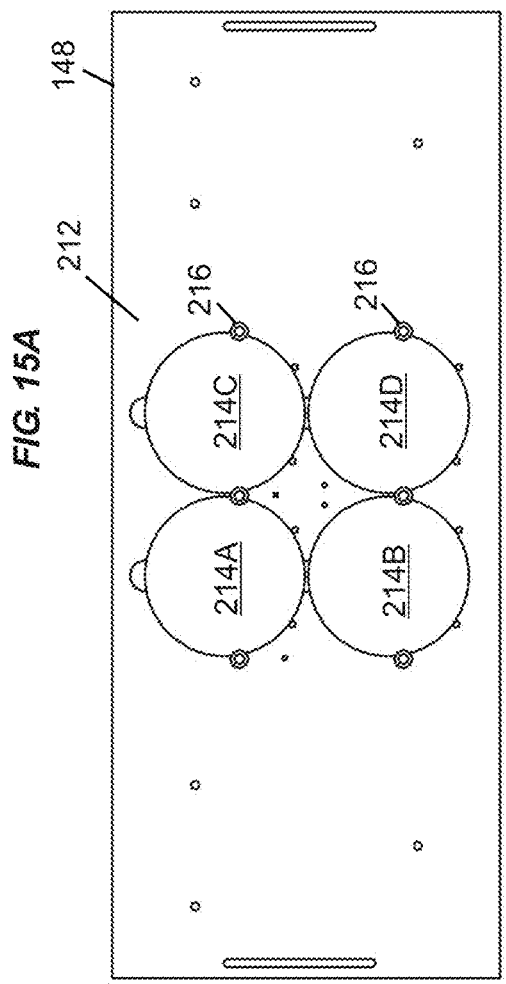

MULTI-STAGE DEPOSITION SYSTEM FOR GROWTH OF INCLINED C-AXIS PIEZOELECTRIC MATERIAL STRUCTURES

STATEMENT OF RELATED APPLICATIONS

This application is a non-provisional of U.S. Provisional Patent Application No. 62/241,264 filed on Oct. 14, 2015, wherein the entire contents of the foregoing application is hereby incorporated by reference as if set forth fully herein. Subject matter disclosed herein also relates to the following four U.S. patent applications each filed or to be filed on Oct. 14, 2016, and each claiming priority to U.S. Provisional Patent Application No. 62/241,264: (1) U.S. patent application Ser. No. 15/293,063 entitled "Deposition System for Growth of Inclined C-Axis Piezoelectric Material Structures;" (2) U.S. patent application Ser. No. 15/293,071 entitled "Methods for Fabricating Acoustic Structure with Inclined C-Axis Piezoelectric Bulk and Crystalline Seed Layers;" (3) U.S. patent application Ser. No. 15/293,082 entitled "Acoustic Resonator Structure with Inclined C-Axis Piezoelectric Bulk and Crystalline Seed Layers;" and (4) U.S. patent application Ser. No. 15/293,108 entitled "Methods for Producing Piezoelectric Bulk and Crystalline Seed Layers of Different C-Axis Orientation Distributions," wherein the contents of the foregoing four U.S. patent applications are hereby incorporated by reference as if set forth fully herein.

TECHNICAL FIELD

The present disclosure relates to structures including inclined c-axis hexagonal crystal structure piezoelectric materials such as aluminum nitride (AlN) and zinc oxide (ZnO), as well as systems and methods for producing inclined c-axis hexagonal crystal structure piezoelectric material. Inclined c-axis hexagonal crystal structure piezoelectric materials may be used, for example, in various resonators as well as in thin film electroacoustic and/or sensor devices, particularly for sensors operating in liquid/viscous media (e.g., chemical and biochemical sensors), and the like.

BACKGROUND

Hexagonal crystal structure piezoelectric materials such as AlN and ZnO are of commercial interest due to their piezoelectric and electroacoustic properties. Beneficial properties in this regard include a high quality factor, moderate coupling coefficient, moderate piezoelectric constant, high acoustic velocity, and low propagation losses. In addition to these characteristics, AlN thin films are chemically stable and compatible with various integrated circuit fabrication technologies, thereby making AlN an attractive material for fabrication of electroacoustic devices, including bulk acoustic wave (BAW) devices such as bandpass filters and the like.

A primary use of electroacoustic technology has been in the telecommunication field (e.g., for oscillators, filters, delay lines, etc.). More recently, there has been a growing interest in using electroacoustic devices in high frequency sensing applications due to the potential for high sensitivity, resolution, and reliability. However, it is not trivial to apply electroacoustic technology in certain sensor applications—particularly sensors operating in liquid/viscous media (e.g., chemical and biochemical sensors)—since longitudinal and surface waves exhibit considerable acoustic leakage into such media, thereby resulting in reduced resolution.

In the case of a piezoelectric crystal resonator, an acoustic wave may embody either a bulk acoustic wave (BAW) propagating through the interior (or 'bulk') of a piezoelectric material, or a surface acoustic wave (SAW) propagating on the surface of the piezoelectric material. SAW devices involve transduction of acoustic waves (commonly including two-dimensional Rayleigh waves) utilizing interdigital transducers along the surface of a piezoelectric material, with the waves being confined to a penetration depth of about one wavelength. BAW devices typically involve transduction of an acoustic wave using electrodes arranged on opposing top and bottom surfaces of a piezoelectric material. In a BAW device, different vibration modes can propagate in the bulk material, including a longitudinal mode and two differently polarized shear modes, wherein the longitudinal and shear bulk modes propagate at different velocities. The longitudinal mode is characterized by compression and elongation in the direction of the propagation, whereas the shear modes consist of motion perpendicular to the direction of propagation with no local change of volume. The propagation characteristics of these bulk modes depend on the material properties and propagation direction respective to the crystal axis orientations. Since shear waves exhibit a very low penetration depth into a liquid, a device with pure or predominant shear modes can operate in liquids without significant radiation losses (in contrast with longitudinal waves, which can be radiated in liquid and exhibit significant propagation losses). Restated, shear mode vibrations are beneficial for operation of acoustic wave devices with fluids because shear waves do not impart significant energy into fluids.

Certain piezoelectric thin films are capable of exciting both longitudinal and shear mode resonance. To excite a wave including a shear mode using a standard sandwiched electrode configuration device, a polarization axis in a piezoelectric thin film must generally be non-perpendicular to (e.g., tilted relative to) the film plane. Hexagonal crystal structure piezoelectric materials such as (but not limited to) aluminum nitride (AlN) and zinc oxide (ZnO) tend to develop their polarization axis (i.e., c-axis) perpendicular to the film plane, since the (0001) plane typically has the lowest surface density and is thermodynamically preferred. Certain high temperature (e.g., vapor phase epitaxy) processes may be used to grow tilted c-axis films, but providing full compatibility with microelectronic structures such as metal electrodes or traces requires a low temperature deposition process (e.g., typically below about 300° C.).

Low temperature deposition methods such as reactive radio frequency magnetron sputtering have been used for preparing tilted AlN films having angles that vary significantly with position over the area of a substrate. FIG. 1 is a simplified schematic of an axial sputtering deposition apparatus arranged to eject metal atoms from a target 2 (adjacent to a cathode (not shown)) toward a substrate 4 supported by a substrate holder 6 that is substantially parallel to the target 2 in a reactive gas-containing environment. The target 2 and the substrate 4 are aligned with one another and share a single central axis 8; however, a typical geometry of sputtering deposition results in a cosine distribution 10 of piezoelectric material molecules (e.g., AlN molecules created by metal atoms reacting with nitrogen in the sputtering gas) being received by the substrate 4. This phenomenon leads to a c-axis direction of the deposited piezoelectric material that varies with radial position, from an angle of zero (corresponding to a vertical c-axis) at the center of the substrate 4, to a c-axis direction with a tilt angle that increases with distance from the center.

The above-described variation with radial position of c-axis direction of a deposited piezoelectric material is disclosed by Stan, G. E., et al., "Tilt c Axis Crystallite Growth of Aluminium Nitride Films by Reactive RF-Magnetron Sputtering," Digest Journal of Nanomaterials and Biostructures, vol. 7, no. 1, pp. 41-50 (2012) (hereinafter, "Stan"). FIG. 2A is a schematic representation (reproduced from Stan) of a rocking curve measurement geometry of an AlN film structure obtained by radio frequency magnetron sputtering in a reactive gas environment in an axially aligned planar sputtering system without tilting a 50 mm Si substrate. FIG. 2A shows that the AlN film structure according to Stan exhibits zero c-axis tilt angle at the center, and a radially symmetrical variation of tilt angle of crystallites in the AlN film structure, analogous to a circular "race track" with banked walls. FIG. 2B is a plot of tilt angle versus distance from center (also derived from Stan) for the AlN film structure described in connection with FIG. 2A, showing a nearly linear variation of tilt angle with increasing distance away from a center of the AlN film structure, to a maximum tilt angle of about 6.5 degrees near the margins of the 50 mm wafer. One effect of the lack of uniformity of c-axis tilt angle of the AlN film structure over the substrate is that if the AlN film-covered substrate were to be diced into individual chips, the individual chips would exhibit significant variation in c-axis tilt angle and concomitant variation in acoustic wave propagation characteristics. Such variation in c-axis tilt angle would render it difficult to efficiently produce large numbers of resonator chips with consistent and repeatable performance. Moreover, use of a target surface axially aligned with a substrate holder that is parallel to the target surface enables attainment of only a limited range of c-axis tilt angles, as evidenced by the 0-6.5 degree tilt angle range shown in FIG. 2A.

Before describing other techniques for preparing tilted AlN films, desirable regimes for c-axis tilt angle (or angle of inclination) will be discussed. An electromechanical coupling coefficient is a numerical value that represents the efficiency of piezoelectric materials in converting electrical energy into acoustic energy for a given acoustic mode. Changing the c-axis angle of inclination for hexagonal crystal structure piezoelectric materials causes variation in shear and longitudinal coupling coefficients, as shown in FIG. 3. FIG. 3 embodies plots of shear coupling coefficient ($K_s$) and longitudinal coupling coefficient (KO each as a function of c-axis angle of inclination for AlN. It can be seen that a maximum electromechanical coupling coefficient of shear mode resonance in AlN is obtained at a c-axis angle of inclination of about 35 degrees, that a pure shear response (with zero longitudinal coupling) is obtained at a c-axis angle of inclination of about 46 degrees, and that the shear coupling coefficient exceeds the longitudinal coupling coefficient for c-axis angle of inclination values in a range of from about 19 degrees to about 63 degrees. The longitudinal coupling coefficient is also zero at a c-axis angle of inclination of 90 degrees, but it is impractical to grow AlN at very steep c-axis inclination angles. For electroacoustic resonators intended to operate in liquids or other viscous media, it would be desirable to provide piezoelectric films with a c-axis tilt angle sufficient to provide a shear coupling coefficient that exceeds a longitudinal coupling coefficient—in certain embodiments, at a c-axis tilt angle in which the longitudinal coupling coefficient approaches zero, or at a c-axis-tilt angle at or near a value where shear coupling is maximized. Thus, for an electroacoustic resonator including an AlN piezoelectric layer, it would be desirable to provide a c-axis tilt angle in a range of from about 19 degrees to about 63 degrees, and particularly desirable to provide a c-axis tilt angle of 35 or 46 degrees.

Various low temperature deposition methods that have been devised for growing AlN films at c-axis tilt angles greater than those attainable with the axial sputtering apparatus of FIG. 1 are described in connection with FIGS. 4A-4C. FIG. 4A (which is adapted from Moreira, Milena De Albuquerque, "Synthesis of Thin Piezoelectric AlN Films in View of Sensors and Telecom Applications," 2014, Digital Comprehensive Summaries of Uppsala Dissertations from the Faculty of Science and Technology, 1651-6214; 1160) (hereinafter, "Moreira") is a simplified schematic of an off-axis sputtering deposition apparatus arranged to eject metal atoms from a target surface 12 toward a substrate 14 supported by a substrate holder 16 that is substantially parallel to the target surface 12, with central axes of the substrate 14 and the target surface 12 being parallel but offset relative to one another, with an angle θ representing an angle between a central axis 18 of the target surface 12 and a center of the substrate 14. A distribution 20 of piezoelectric material molecules created by reaction of metal atoms and gas is received by the substrate 14, resulting in a tilted c-axis direction of deposited piezoelectric material (including tilted 'columns' of piezoelectric material with a preferential growth direction due to alignment with the tilted flux), with the c-axis tilt angle of the piezoelectric material varying with respect to position along the substrate 14. In particular, a portion of the deposited piezoelectric material that is closer to the central axis 18 of the target surface 12 will exhibit a c-axis tilt angle that is shallower than a portion of the piezoelectric material that is farther from the central axis 18 of the target surface 12. Due to the lateral offset of the substrate 14 relative to the central axis 18 of the target surface 12, the off-axis sputtering deposition apparatus of FIG. 4A is capable of attaining piezoelectric films with c-axis tilt angles that are larger than those attainable with the apparatus of FIG. 1.

Additional low temperature deposition sputtering apparatuses capable of growing piezoelectric films with even larger c-axis tilt angles are described in connection with FIGS. 4B and 4C (which are also adapted from Moreira). FIG. 4B is a simplified schematic of a sputtering deposition apparatus arranged to eject metal atoms from a target surface 22 toward a substrate 24 supported by a substrate holder 26 that is non-parallel to the target surface 22 (i.e., wherein the substrate holder 26 is tilted by an angle θ relative to a plane parallel with the target surface 22), wherein a central axis 28 of the target surface 22 extends through a center point of the substrate 24. A distribution 30 of piezoelectric material molecules created by reaction of metal atoms and gas is received by the substrate 24, resulting in a tilted c-axis direction of deposited piezoelectric material (including tilted 'columns' of piezoelectric material with a preferential growth direction due to alignment with the tilted flux), with the c-axis tilt angle of the piezoelectric material varying with respect to position along the substrate 24. FIG. 4C is a simplified schematic of a sputtering deposition apparatus arranged to eject metal atoms from a target surface 32 toward a substrate 34 supported by a substrate holder 36 that is non-parallel to the target surface 32. A central axis 38B of the substrate 34 extends through a center point of the target surface 32, with a central axis 38A of the target surface 32 being separated from the central axis 38B of the substrate 34 by a first angle $\theta_1$, and with substrate holder 36 being tilted by a second angle $\theta_2$ relative to a plane parallel with the target surface 32. A distribution 40 of piezoelectric material molecules created by reaction of metal atoms and gas is received by the substrate 34, resulting in a tilted c-axis direction of deposited piezoelectric material (including tilted 'columns' of piezoelectric material with a preferential growth direction due to alignment with the tilted flux), with the c-axis tilt angle of the piezoelectric material varying with respect to position along the substrate 34.

Yet another method for growing a tilted c-axis AlN film involves two-step sputtering deposition as described by Moreira, including first step growth of an initial, non-textured seed layer at a relatively high process pressure while keeping the substrate at room temperature, followed by second step growth of a film at a lower process pressure and an elevated substrate temperature. FIG. 5A is a cross-sectional schematic view of a seed layer 44 exhibiting multiple textures deposited via the first sputtering step over a substrate 42, and FIG. 5B is a similar view of the seed layer 44 and substrate 42 of FIG. 5A following deposition via a second sputtering step of a tilted axis AlN film 46 over the seed layer 44. As described by Moreira, the seed layer exhibits different textures, most notably (103) and (002). Additionally, the film growth tends to follow the crystallographic texture of the seed layer, and the low pressure deposition in combination with a small distance between the target and substrate yields a directional deposition flux that results in competitive column growth in which cones having a c-axis along the direction of the deposition flux grow fastest. This results in a film with a c-axis lying in the plane of the deposition flux at any given point along the substrate. As noted by Moreira, even though there is no intentional tilt of the flux, the magnetron disposition at the target surface generates a "race track", which in turn provides the tilted flux direction towards the substrate. Such a "race track" described by Moreira is understood to correspond to a radially symmetric variation of tilt angle of crystallites in the film structure, similar to that described hereinabove in connection with FIGS. 2A and 2B.

Each of the foregoing apparatuses and tilted piezoelectric material growth methods are understood to produce film-covered substrates exhibiting significant variation in c-axis tilt angle with respect to position on the substrate. As noted previously, one effect of a lack of uniformity of c-axis tilt angle of a piezoelectric film arranged on the substrate is that if the film-covered substrate were to be diced into individual chips, then the individual chips would exhibit significant variation in c-axis tilt angle and concomitant variation in acoustic wave propagation characteristics. Such variation in c-axis tilt angle would render it difficult to efficiently produce large numbers of resonator chips with consistent and repeatable performance.

Accordingly, there is a need for systems and methods for producing inclined c-axis hexagonal crystalline material films over large area substrates without significant variation in c-axis tilt angle, such as to enable economical production of bulk acoustic wave resonator structures with repeatable performance characteristics. It would further be desirable for such systems and methods to be compatible with integrated circuit fabrication technologies and enable fabrication of piezoelectric films with c-axis tilt angles sufficient to provide high shear coupling coefficients, so as to enable production of resonator devices suitable for use in liquids and other viscous media.

SUMMARY

The present disclosure provides bulk acoustic wave resonator structures, methods for fabricating such resonator structures, and deposition systems suitable for producing inclined c-axis hexagonal crystal structure piezoelectric material that may be incorporated in such resonator structures. A bulk acoustic wave resonator structure includes a hexagonal crystal structure piezoelectric material bulk layer arranged over a crystalline seed layer and supported by a substrate, wherein at least 50% (or at least 75%, or at least 90%, or at least 95%) of the bulk layer includes a c-axis with an orientation distribution predominantly in a range of from 25 degrees to 50 degrees (or in a subrange of from 30 degrees to 40 degrees) relative to normal of a face of the substrate. Such c-axis orientation distribution is preferably substantially uniform over the area of a large area substrate (e.g., having a diameter in a range of at least about 50 mm, about 100 mm, or about 150 mm), thereby enabling multiple chips having the same or similar acoustic wave propagation characteristics to be derived from a single substrate. A deposition system suitable for growing tilted c-axis hexagonal crystal structure piezoelectric material includes a linear sputtering apparatus, a multi-aperture collimator, and a translatable substrate table having a support surface arranged non-parallel to a target surface of the linear sputtering apparatus, with the substrate table and/or the collimator being electrically biased to a potential other than ground. In certain embodiments, the collimator is grounded while the substrate table is electrically biased, or vice-versa. Another deposition system includes multiple linear sputtering apparatuses, a substrate table that is translatable between different positions proximate to different linear sputtering apparatuses, and multiple collimators arranged between the substrate table and the respective linear sputtering apparatuses, with a support surface of the substrate table being non-parallel to at least one target surface of the different linear sputtering apparatuses. A method for fabricating at least one bulk acoustic wave resonator structure includes growth of a crystalline seed layer over at least one resonator device complex during a first step, followed by growth of a hexagonal crystal structure piezoelectric material bulk layer of a defined c-axis distribution range (e.g., from about 25 degrees to 50 degrees, or 30 to 40 degrees, relative to normal of a face of a substrate), with at least one of the growth steps including transit of metal atoms from a target surface of a linear sputtering apparatus through a collimator and a deposition aperture to react with a gas species and be received by the at least one resonator device complex, and with the target surface being arranged non-parallel to a substrate. Another method for fabricating at least one bulk acoustic wave resonator structure utilizes a substrate table that is movable between first and second stations including first and second linear sputtering apparatuses and a first collimator (optionally, further including a second collimator), wherein a crystalline seed layer is grown by reactive sputtering in the first station, and a hexagonal crystal structure piezoelectric material bulk layer comprising a different c-axis orientation distribution than the crystalline seed layer is grown by reactive sputtering in the second station.

In one aspect, a deposition system includes a linear sputtering apparatus including a target surface configured to eject metal atoms; a substrate table including a support surface that is configured to receive at least one wafer and is coupled to a translation element, wherein the translation element is configured to translate the substrate table and the at least one wafer during operation of the linear sputtering apparatus; and a collimator including a plurality of guide members defining a plurality of collimator apertures arranged between the linear sputtering apparatus and the substrate table; wherein the target surface is arranged non-parallel to the support surface; and wherein at least one of the substrate table or the collimator is electrically biased to a potential other than ground.

In certain embodiments, the plurality of guide members of a collimator is arranged non-perpendicular to the support surface. The guide members preferably serve to redirect metal atoms ejected by the target surface toward the support surface to reduce variability in atom trajectory and thereby promote uniformity (e.g., in c-axis tilt angle) of material deposition. In certain embodiments, only the substrate table or only the collimator is electrically biased to a potential other than ground; in other embodiments, each of the substrate table and the collimator is electrically biased to a potential other than ground. Electrical biasing of the substrate table and/or the collimator desirably enhances control of material deposition, while movement (e.g., translation) of the at least one wafer during sputtering may desirably promote uniform material deposition.

In certain embodiments, the linear sputtering apparatus comprises a linear magnetron that includes a sputtering cathode operatively coupled to the target surface to promote ejection of metal atoms from the target surface. In other embodiments, the linear sputtering apparatus comprises a linear ion beam sputtering apparatus. In certain embodiments, the collimator is configured to move (e.g., translate) during operation of the linear sputtering apparatus. Movement of the collimator during sputtering desirably prevents formation of "shadow" pattern (corresponding to the shape and position of guide members of the collimator) that would otherwise be formed on a surface receiving piezoelectric material following transit of metal atoms through the collimator. In alternative embodiments, a rotating magnetron may be used in lieu of a linear magnetron.

In certain embodiments, the plurality of guide members includes a plurality of longitudinal members and a plurality of transverse members that form a grid. In certain embodiments, the plurality of guide members includes a plurality of longitudinal members biased to a first electrical potential other than ground and includes a plurality of transverse members biased to a second electrical potential other than ground, and wherein the second electrical potential differs from the first electrical potential. Electrically biasing different groups of guide members may desirably enhance control of material deposition.

In certain embodiments, the deposition system further includes a deposition aperture arranged between the collimator and the substrate table. In certain embodiments, the deposition system further includes a uniformity shield configured to adjust dimensions (e.g., size and shape) of the deposition aperture. Utilization of a uniformity shield may desirably prevent localized accumulation of deposited material on a substrate or resonator device complex that could otherwise result in undesirable thickness variation of a deposited film.

In certain embodiments, the support surface is configured to receive multiple (e.g., at least two, at least three, at least four, or five or more) wafers. In certain embodiments, the target surface includes aluminum or zinc and is configured to eject aluminum atoms or zinc atoms, such as may be useful for deposition of aluminum nitride or zinc oxide films. Other metals may be used for formation of hexagonal crystal structure piezoelectric materials other than aluminum nitride and zinc oxide. In certain embodiments, the target surface is oriented 15 to 55 degrees apart from the substrate table.

In certain embodiments, the deposition system is configured to receive a supply of sputtering gas, wherein the sputtering gas includes a gas species adapted to react with the metal atoms. In certain embodiments, the deposition system is operatively coupled to a source of sputtering gas including nitrogen (such as may be useful to react with aluminum ions to form aluminum nitride). In certain embodiments, the deposition system is operatively coupled to a source of sputtering gas including oxygen (such as may be useful to react with zinc ions to form zinc oxide). Other gas constituents may be present, such as (but not limited to) argon or other noble gases.

In certain embodiments, the deposition system includes at least one wafer received by the support surface, wherein the at least one wafer includes a substrate, an acoustic reflector structure arranged over the substrate, and an electrode structure arranged over at least a portion of the acoustic reflector structure. In certain embodiments, following deposition of a hexagonal crystal structure piezoelectric material bulk layer over the acoustic reflector structure and the electrode structure, a second electrode structure may be formed over the hexagonal crystal structure piezoelectric material to form a bulk acoustic wave resonator structure. In certain embodiments, the deposition system includes at least one wafer received by the support surface, wherein the at least one wafer includes a substrate defining a recess, a support layer is arranged over the recess, and an electrode structure is arranged over the support layer.

In certain embodiments, the deposition system is configured for growth of a hexagonal crystal structure piezoelectric material bulk layer over a seed layer that overlies a wafer received by the support surface, wherein at least 50% (or at least 75%, or at least 90%, or at least 95%) of the hexagonal crystal structure piezoelectric material bulk layer includes a c-axis having an orientation distribution predominantly in a range of from 25 degrees to 50 degrees (or in a subrange of from 30 degrees to 40 degrees) relative to normal of a face of the wafer.

In another aspect, a method for fabricating at least one bulk acoustic wave resonator structure includes a first growth step including deposition of a crystalline seed layer over at least one resonator device complex, wherein each resonator device complex of the at least one resonator device complex includes a substrate and at least one first electrode structure arranged over at least a portion of the substrate; and a second growth step including deposition of a hexagonal crystal structure piezoelectric material bulk layer over the crystalline seed layer that is arranged over the at least one resonator device complex, and being configured to yield at least 50% (or at least 75%, or at least 90%, or at least 95%) of the hexagonal crystal structure piezoelectric material bulk layer including a c-axis having an orientation distribution predominantly in a range of from 25 degrees to 50 degrees (or in a subrange of from 30 degrees to 40 degrees) relative to normal of a face of the substrate; wherein at least one of the first growth step or the second growth step includes ejection of metal atoms from a target surface of a linear sputtering apparatus to (i) transit through a collimator including multiple collimator apertures and through a deposition aperture, and (ii) react with a gas species and be received by the at least one resonator device complex, wherein the target surface is arranged non-parallel to a face of the substrate. In certain embodiments, the crystalline seed layer is compositionally matched to the hexagonal crystal structure piezoelectric material bulk layer.

In certain embodiments, the method further includes forming at least one second electrode structure over at least one portion of the hexagonal crystal structure piezoelectric material bulk layer, such as may be useful to form at least one bulk acoustic wave resonator device. In certain embodiments, the method further includes roughening a backside of the substrate after said forming of the at least one second electrode structure. Such roughening may desirably reduce or eliminate acoustic reflections from the backside surface of the substrate.

In certain embodiments, the first growth step is configured to yield at least 50% (or at least 75%, or at least 90%, or at least 95%) of the crystalline seed layer including a c-axis having an orientation distribution predominantly in a range of from 0 degrees to 35 degrees relative to normal of a face of the substrate. In certain embodiments, the second growth step is configured to yield at least 90% (or at least 75%, or at least 95%) of the hexagonal crystal structure piezoelectric material bulk layer including a c-axis having an orientation distribution predominantly in a range of from 25 degrees to 50 degrees relative to normal of a face of the substrate.

In certain embodiments, the first growth step is performed at a deposition pressure in a range of from about 5 mT to about 50 mT, or in a range of from 5 mT to about 25 mT, or in a range of from about 10 mT to about 15 mT. In certain embodiments, the first growth step is performed at a first deposition pressure, the second growth step is performed at a second deposition pressure, and the first deposition pressure is greater than the second deposition pressure. In certain embodiments, the second deposition pressure is less than about 5 mT, less than about 3 mT, less than about 2 mT, or less than about 1 mT. In certain embodiments, at least one of the first growth step or the second growth step further includes moving (e.g., translating) the collimator during sputtering.

In certain embodiments, each resonator device complex of the at least one resonator device complex comprises an acoustic reflector structure arranged between the substrate and the at least one first electrode structure. In other embodiments, each resonator device complex of the at least one resonator device complex includes a substrate defining a recess, with a support layer arranged over the recess, wherein the at least one first electrode structure is arranged over the support layer.

In certain embodiments, the target surface is oriented 15 to 55 degrees apart from a face of the substrate and/or the substrate table supporting the substrate. In certain embodiments, the target surface includes aluminum or zinc and is configured to eject aluminum atoms or zinc atoms.

In certain embodiments, for each resonator device complex of the at least one resonator device complex, the substrate includes a diameter of at least about 50 mm (or at least 100 mm, or at least 150 mm). In certain embodiments, the at least one resonator device complex includes a plurality of resonator device complexes. In certain embodiments, the at least one resonator device complex is supported by a substrate table, and the method further includes translating the substrate table during the first growth step and during the second growth step.

In certain embodiments, the first growth step includes ejection of metal atoms from a first target surface of a first linear sputtering apparatus located at a first station to (i) transit through a first deposition aperture (optionally preceded by transit through a first collimator including a first group of collimator apertures), and (ii) react with at least one gas species and be received by the at least one resonator device complex to deposit the crystalline seed layer over the at least one resonator device complex; the method further includes moving the substrate table to move the at least one resonator device complex supported by the substrate table to a second station containing a second linear sputtering apparatus; and the second growth step includes ejection of metal atoms from a second target surface of the second linear sputtering apparatus to (i) transit through a second collimator including a second group of collimator apertures and through a second deposition aperture, and (ii) react with at least one gas species and be received by the at least one resonator device complex to deposit the hexagonal crystal structure piezoelectric material bulk layer over the crystalline seed layer of the at least one resonator device complex. In certain embodiments, the first station and the second station are arranged in a single enclosure with at least one vacuum pumping element configured to generate at least one subatmospheric pressure condition within the enclosure, such that the second growth step may be performed in a sequential manner in a subatmospheric environment following the first growth step without any need for removing the at least one resonator device complex into an atmospheric pressure environment before the second growth step (e.g., which would otherwise require significant time and energy to establish subatmospheric conditions in a second enclosure). In certain embodiments, the first station is located in a first chamber having an associated first vacuum pumping element, and the second station is located in a second chamber having an associated second vacuum pumping element.

In certain embodiments, the method further includes electrically biasing to a potential other than ground one or more of the following items: the substrate table, the first collimator, or the second collimator, during at least one of the first growth step or the second growth step. In certain embodiments, the method further includes translating the first collimator during operation of the first linear sputtering apparatus, and translating the second collimator during operation of the second linear sputtering apparatus. Movement of the first collimator and the second collimator during sputtering desirably prevents formation of "shadow" pattern (corresponding to the shape and position of guide members of the respective collimators) that would otherwise be formed on a surface receiving crystalline seed material during the first growth step and a surface receiving piezoelectric material during the second growth step. In certain embodiments, the substrate table and at least one collimator are translated during operation of the linear sputtering apparatus during at least one of the first growth step or the second growth step, wherein a direction of translation of the collimator is substantially perpendicular to a direction of translation of the substrate table.

In certain embodiments, the method further includes dicing the at least one resonator device complex, over which the hexagonal crystal structure piezoelectric material bulk layer and the crystalline seed layer are deposited, into a plurality of chips. In certain embodiments, each chip of the plurality of chips includes a solidly mounted bulk acoustic wave resonator chip or a film bulk acoustic wave resonator chip.

In another aspect, a bulk acoustic wave resonator device is produced by a method disclosed herein.

In another aspect, an acoustic resonator structure includes a substrate; at least one first electrode structure supported by the substrate; a crystalline seed layer arranged over the substrate and the at least one first electrode structure; a hexagonal crystal structure piezoelectric material bulk layer arranged over the crystalline seed layer; and at least one second electrode structure arranged over at least a portion of the hexagonal crystal structure piezoelectric material bulk layer; wherein at least 50% (or at least 75%, or at least 90%, or at least 95%) of the hexagonal crystal structure piezoelectric material bulk layer includes a c-axis having an orientation distribution predominantly in a range of from 25 degrees to 50 degrees (or in a subrange of from 30 degrees to 40 degrees) relative to normal of a face of the substrate.

In certain embodiments, the crystalline seed layer is compositionally matched to the hexagonal crystal structure piezoelectric material bulk layer. In certain embodiments, a thickness of the crystalline seed layer is no greater than about 20%, no greater than about 15%, or no greater than about 10% of a combined thickness of the hexagonal crystal structure piezoelectric material bulk layer and the crystalline seed layer. In certain embodiments, the crystalline seed layer includes a thickness in a range of from about 500 Angstroms to about 2,000 Angstroms, and (for a hexagonal crystal structure seed material such as AlN) may include a dominant (103) texture. In certain embodiments, at least 50% (or at least 75%, or at least 90%, or at least 95%) of the crystalline seed layer includes a c-axis having an orientation distribution predominantly in a range of from 0 degrees to 35 degrees relative to normal of a face of the substrate. In certain embodiments, the hexagonal crystal structure piezoelectric material bulk layer includes a thickness in a range of from about 4,000 Angstroms to about 26,000 Angstroms. Such bulk layer preferably includes substantially uniform thickness, nanostructure, and crystallinity properties. Such bulk layer also preferably exhibits controlled stress and densely packed columnar grains or recrystallized grain structure.

In certain embodiments, the substrate includes a semiconductor material. In certain embodiments, an acoustic reflector structure is arranged between the substrate and the at least one first electrode structure. In certain embodiments, an acoustic reflector includes alternating layers of materials of different acoustic impedances (e.g., SiOC, $Si_3N_4$, $SiO_2$, AlN, and Mo), optionally embodied in a Bragg mirror. In certain embodiments, the substrate is arranged between a backside surface and the acoustic reflector structure, and the backside surface comprises a roughened surface configured to reduce or eliminate backside acoustic reflection.

In certain embodiments, the substrate defines a recess, a support layer is arranged over the recess, and the support layer is arranged between the substrate and at least a portion of the at least one first electrode structure.

In certain embodiments, at least 90% of the hexagonal crystal structure piezoelectric material bulk layer includes a c-axis having an orientation distribution predominantly in a range of from 12 degrees to 52 degrees, or from 25 degrees to 50 degrees, relative to normal of a face of the substrate. In certain embodiments, at least 50% (or at least 75%, or at least 90%, or at least 95%) of the hexagonal crystal structure piezoelectric material bulk layer includes a c-axis having an orientation distribution predominantly in a range of from 30 degrees to 40 degrees relative to normal of a face of the substrate. In certain embodiments, less than about 3 percent of the c-axis orientation distribution of the hexagonal crystal structure piezoelectric material bulk layer is in a range of from 0 degrees to 15 degrees relative to normal of a face of the substrate. In certain embodiments, a hexagonal crystal structure piezoelectric material bulk layer includes a thickness in a range of from 4,000 Angstroms to 26,000 Angstroms.

In certain embodiments, the substrate includes a diameter of at least about 50 mm (or at least 100 mm, or at least 150 mm), and the hexagonal crystal structure piezoelectric material bulk layer covers at least about 50% (or at least about 75%, or at least about 90%) of a face of the substrate. In certain embodiments, the substrate includes a diameter of at least about 100 mm (or at least about 150 mm), and the hexagonal crystal structure piezoelectric material bulk layer covers at least about 50% (or at least about 75%, or at least about 90%, or at least about 95%) of a face of the substrate.

In certain embodiments, the hexagonal crystal structure piezoelectric material bulk layer includes aluminum nitride. In certain embodiments, the hexagonal crystal structure piezoelectric material bulk layer includes zinc oxide. In certain embodiments, other hexagonal crystal structure piezoelectric material may be used.

In certain embodiments, the at least one first electrode structure includes a plurality of first electrode structures; the at least one second electrode structure includes a plurality of second electrode structures; a first portion of the acoustic resonator structure includes a first bulk acoustic wave resonator device including a first active region arranged between one first electrode structure of the plurality of first electrode structures and one second electrode structure of the plurality of second electrode structures; and a second portion of the acoustic resonator structure includes a second bulk acoustic wave resonator device including a second active region arranged between another first electrode structure of the plurality of first electrode structures and another second electrode structure of the plurality of second electrode structures. In certain embodiments, the first and second bulk acoustic wave resonator devices are separable from one another, such as by dicing.

In another aspect, a bulk acoustic wave resonator chip is derived from the acoustic resonator structure. In another aspect, a sensor or microfluidic device incorporates the bulk acoustic wave resonator chip. In certain embodiments, a microfluidic device includes a channel arranged to permit a liquid to be introduced and arranged over the active region of at least one bulk acoustic wave resonator chip.

In another aspect, a deposition system includes a first linear sputtering apparatus including a first target surface configured to eject metal atoms; a second linear sputtering apparatus including a second target surface configured to eject metal atoms; a substrate table including a support surface that is configured to receive at least one wafer and that is coupled to a translation element, wherein the translation element is configured to translate the substrate table and the at least one wafer between a first position proximate to the first linear sputtering apparatus and a second position proximate to the second linear sputtering apparatus; and a second collimator including a second plurality of guide members defining a second plurality of collimator apertures arranged between the second linear sputtering apparatus and the substrate table when the support surface is proximate to the second linear sputtering apparatus; wherein at least one of the first target surface or the second target surface is arranged non-parallel to the support surface. In certain embodiments, the deposition system further includes a first collimator including a first plurality of guide members defining a first plurality of collimator apertures arranged between the first linear sputtering apparatus and the substrate table when the support surface is proximate to the first linear sputtering apparatus.

In certain embodiments, the deposition system further includes a load lock chamber, wherein the translation element is configured to translate the substrate table and the at least one wafer from the load lock chamber to at least one of the first position or the second position. In certain embodiments, the deposition system further includes an enclosure containing the first linear sputtering apparatus, the second linear sputtering apparatus, the second collimator, and the substrate table; and at least one vacuum pumping element configured to generate at least one subatmospheric pressure condition within the enclosure.

In certain embodiments, the deposition system further includes a first vacuum pumping element configured to generate a first subatmospheric pressure condition in a first chamber containing the first linear sputtering apparatus, and including a second vacuum pumping element configured to generate a second subatmospheric pressure condition in a second chamber containing the second linear sputtering apparatus. In certain embodiments, the first chamber further includes a first deposition aperture (optionally in combination with a first collimator), and the second chamber further includes the second collimator and a second deposition aperture, wherein the substrate table is capable of being moved between the first chamber and the second chamber.

In certain embodiments, at least one of the first plurality of guide members or the second plurality of guide members is arranged non-perpendicular to the support surface. In certain embodiments, the second plurality of guide members includes a second plurality of longitudinal members and a second plurality of transverse members that form a second grid. If provided, the first plurality of guide members in certain embodiments includes a first plurality of longitudinal members and a second plurality of transverse members that form a first grid.

In certain embodiments, the substrate table is electrically biased to a potential other than ground. In certain embodiments, at least one of the first collimator or the second collimator is electrically biased to a potential other than ground.

In certain embodiments, the first linear sputtering apparatus includes a first linear magnetron that includes a first sputtering cathode operatively coupled to the first target surface to promote ejection of metal atoms from the first target surface, and wherein the second linear sputtering apparatus includes a second linear magnetron that includes a second sputtering cathode operatively coupled to the second target surface to promote ejection of metal atoms from the second target surface. In certain embodiments, the first collimator (if provided) is configured to translate during operation of the first linear sputtering apparatus, and the second collimator is configured to translate during operation of the second linear sputtering apparatus.

In certain embodiments, the deposition system further includes an enclosure containing the first chamber and the second chamber. In such an embodiment, the second growth step using the second collimator may be performed in a sequential manner in a subatmospheric environment following the first growth step using the first collimator without any need for removing a substrate or resonator device complex into an atmospheric pressure environment before the second growth step (e.g., which would otherwise require significant time and energy to establish subatmospheric conditions in the second chamber).

In certain embodiments, the second target surface is oriented 15 to 55 degrees apart from the support surface. In certain embodiments, the support surface is configured to receive at least two wafers each having a diameter of at least 50 mm (or at least 100 mm, or at least 150 mm). In certain embodiments, each of the first target surface and the second target surface includes aluminum and is configured to eject aluminum atoms, such as may be useful to produce aluminum nitride. In certain embodiments, each of the first target surface and the second target surface includes zinc and is configured to eject zinc atoms, such as may be useful to produce zinc oxide.

In certain embodiments, the deposition system is configured to receive a supply of sputtering gas, wherein the sputtering gas includes a gas species adapted to react with the metal atoms. In certain embodiments, the gas species includes nitrogen or oxygen, optionally in combination with one or more other gas constituents, such as (but not limited to) argon or other noble gases.

In certain embodiments, the deposition system includes at least one wafer received by the support surface, wherein an acoustic reflector structure is arranged over the at least one wafer, and at least one electrode structure is arranged over at least a portion of the acoustic reflector structure.

In certain embodiments, the deposition system includes at least one wafer received by the support surface, wherein the at least one wafer comprises a substrate defining a recess, a support layer is arranged over the recess, and an electrode structure is arranged over the support layer.

In certain embodiments, the deposition system further includes a first deposition aperture arranged between the first collimator and the substrate table; a first uniformity shield configured to permit adjustment of dimensions of the first deposition aperture; a second deposition aperture arranged between the second collimator and the substrate table; and a second uniformity shield configured to permit adjustment of dimensions of the second deposition aperture.

In certain embodiments, the first linear sputtering apparatus, optionally in conjunction with the first collimator, is configured for growth of a crystalline seed layer over the at least one wafer, the crystalline seed layer including a c-axis having an orientation distribution predominantly in a range of from 0 degrees to 35 degrees relative to normal of a face of the at least one wafer; and the second linear sputtering apparatus and the second collimator are configured for growth of a hexagonal crystal structure piezoelectric material bulk layer over the crystalline seed layer, the hexagonal crystal structure piezoelectric material bulk layer including a c-axis having an orientation distribution predominantly in a range of from 30 degrees to 50 degrees relative to normal of a face of the at least one wafer.

In certain embodiments, the support surface is configured to receive the at least one wafer, said at least one wafer having a diameter of at least 50 mm (or at least 100 mm, or at least 150 mm); the first linear sputtering apparatus, optionally in conjunction with the first collimator, is configured for growth of the crystalline seed layer covering at least about 50% (or at least about 75%, or at least about 90%, or at least about 95%) of a face of the at least one wafer; and the second linear sputtering apparatus and the second collimator are configured for growth of the hexagonal crystal structure piezoelectric material bulk layer covering at least about 50% (or at least about 75%, or at least about 90%, or at least about 95%) of a face of the at least one wafer.

In another aspect, a method for fabricating at least one resonator structure includes moving at least one wafer structure supported by a substrate table to a first station containing a first linear sputtering apparatus that includes a first target surface configured to eject metal atoms; generating a first subatmospheric pressure condition at the first station; performing a first growth step including ejection of metal atoms from the first target surface to (i) transit through a first deposition aperture (optionally preceded by transit through a first collimator including multiple first collimator apertures), and (ii) react with a gas species and be received by the at least one wafer structure, to deposit a crystalline seed layer over the at least one wafer structure; moving the at least one wafer structure supported by the substrate table to a second station containing a second linear sputtering apparatus that includes a second target surface configured to eject metal atoms; generating a second subatmospheric pressure condition at the second station; and performing a second growth step including ejection of metal atoms from the second target surface to (i) transit through a second collimator including multiple second collimator apertures and through a second deposition aperture, and (ii) react with a gas species and be received by the at least one wafer structure, to deposit a hexagonal crystal structure piezoelectric material bulk layer over the crystalline seed layer that is arranged over the at least one wafer structure; wherein the hexagonal crystal structure piezoelectric material bulk layer includes a c-axis orientation distribution that differs from a c-axis orientation distribution of the crystalline seed layer.

In certain embodiments, the second growth step is configured to yield at least 50% (or at least about 75%, or at least about 90%, or at least about 95%) of the hexagonal crystal structure piezoelectric material bulk layer including a c-axis having an orientation distribution predominantly in a range of from 25 degrees to 50 degrees (or in a subrange of from 30 degrees to 40 degrees) relative to normal of a face of the at least one wafer structure.

In certain embodiments, the first growth step is configured to yield at least 50% (or at least about 75%, or at least about 90%, or at least about 95%) of the crystalline seed layer having an orientation distribution predominantly in a range of from 0 degrees to 35 degrees relative to normal of a face of the at least one wafer structure.

In certain embodiments, the method further includes loading the substrate table supporting the at least one wafer structure into a load lock chamber, and generating an initial subatmospheric condition in the load lock chamber, prior to the moving of the at least one wafer structure supported by the substrate table to the first station.

In certain embodiments, the first station and the second station are arranged within a single enclosure in which the first subatmospheric pressure condition and the second subatmospheric pressure condition are generated. In certain embodiments, a pressure of the first subatmospheric pressure condition is greater than a pressure of the second subatmospheric pressure condition. In certain embodiments, the first station is arranged within a first chamber, and the second station is arranged within a second chamber.

In certain embodiments, the first growth step is performed at a deposition pressure in a range of from about 5 mT to about 50 mT. In certain embodiments, the first growth step includes translating the first collimator during deposition of the crystalline seed layer over the at least one wafer structure, and the second growth step includes translating the second collimator during deposition of the hexagonal crystal structure piezoelectric material bulk layer over the crystalline seed layer. In certain embodiments, the first growth step includes translating the substrate table supporting the at least one wafer structure during deposition of the crystalline seed layer over the at least one wafer structure, and the second growth step includes translating the substrate table supporting the at least one wafer structure during deposition of the hexagonal crystal structure piezoelectric material bulk layer over the crystalline seed layer.

In certain embodiments, the second target surface is oriented 15 to 55 degrees apart from a face of the at least one wafer structure.

In certain embodiments, each wafer structure of the at least one wafer structure includes a substrate and at least one first electrode structure arranged over at least a portion of the substrate.

In certain embodiments, each wafer structure of the at least one wafer structure includes a substrate, at least one acoustic reflector structure arranged over the substrate, and at least one first electrode structure arranged over at least a portion of the at least one acoustic reflector structure. In certain embodiments, each wafer structure of the at least one wafer structure includes a substrate defining a recess, a support layer arranged over the recess, and at least one first electrode structure arranged over the support layer.

In certain embodiments, each wafer structure of the at least one wafer structure includes a diameter of at least about 50 mm (or at least about 100 mm, or at least about 150 mm), and the hexagonal crystal structure piezoelectric material bulk layer covers at least about 50% (or at least about 75%, or at least about 90%, or at least about 95%) of a face of the at least one wafer structure.

In certain embodiments, the at least one wafer structure includes a plurality of wafer structures.

In certain embodiments, the crystalline seed layer is compositionally matched to the hexagonal crystal structure piezoelectric material bulk layer. In certain embodiments, the hexagonal crystal structure piezoelectric material bulk layer includes aluminum nitride or zinc oxide. In certain embodiments, other hexagonal crystal structure piezoelectric materials may be used.

In certain embodiments, the method further includes forming at least one second electrode structure over at least one portion of the hexagonal crystal structure piezoelectric material bulk layer. In certain embodiments, the method further includes electrically biasing to a potential other than ground one or more of the following items: the substrate table, the first collimator, or the second collimator. In certain embodiments, the method further includes roughening a backside of the substrate after said forming of the at least one second electrode structure.

In certain embodiments, the method further includes dicing the at least one wafer structure, over which the hexagonal crystal structure piezoelectric material bulk layer and the crystalline seed layer are deposited, into a plurality of chips. In certain embodiments, each chip of the plurality of chips includes a solidly mounted bulk acoustic wave resonator chip or a film bulk acoustic wave resonator chip.

Those skilled in the art will appreciate the scope of the present disclosure and realize additional aspects thereof after reading the following detailed description of the preferred embodiments in association with the accompanying drawing figures.

2A, showing a nearly linear variation of tilt angle with increasing distance away from a center of the AlN film structure.

Figure 1:
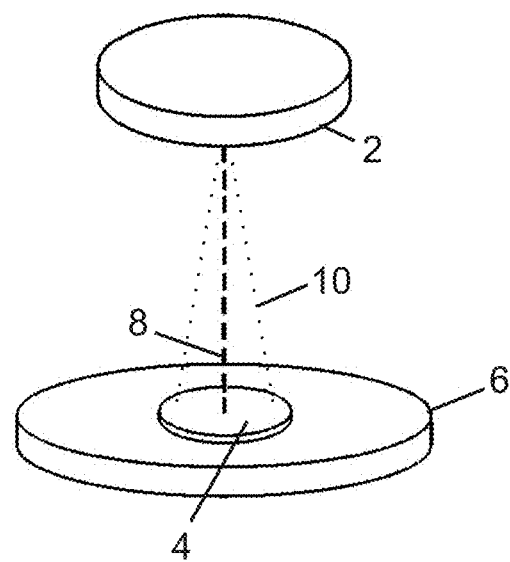
FIG. 1 is a simplified schematic of an axial sputtering deposition apparatus arranged to eject metal atoms from a target surface toward a substrate supported by a substrate holder substantially parallel to the target surface, with central axes of the target surface and the substrate being aligned with one another.
Figure 3:
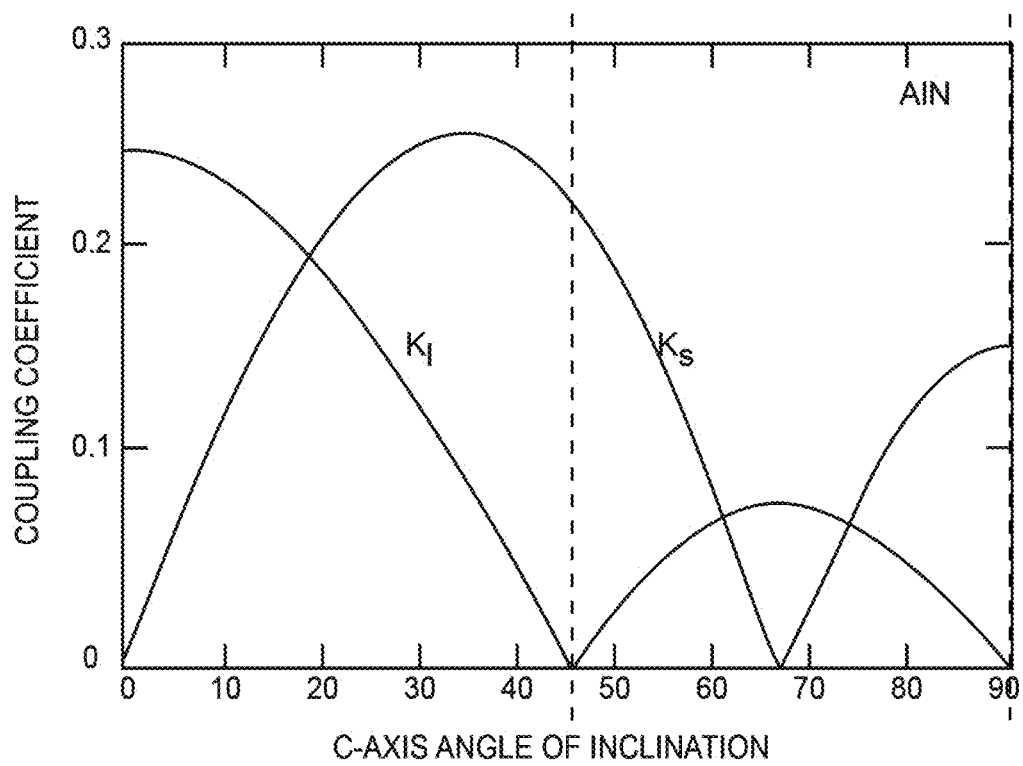
Figure 2A:
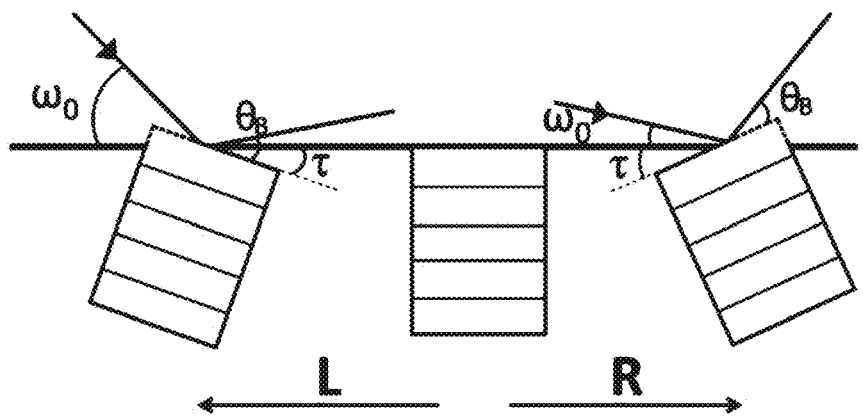
FIG. 2A is a schematic representation of a rocking curve measurement geometry of an AlN film structure obtained by radio frequency magnetron sputtering in a reactive gas environment in a planar sputtering system without tilting the substrate, showing zero tilt angle at the center, and a radially symmetrical variation of tilt angle of crystallites in the AlN film structure.
Figure 2B:
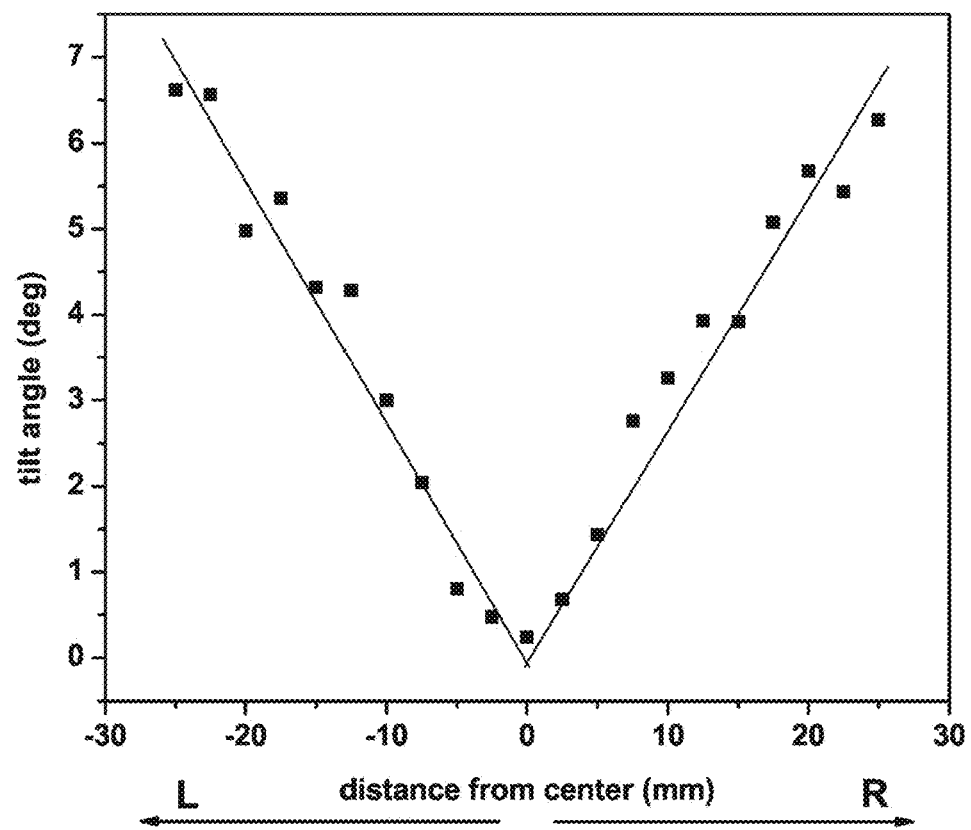
FIG. 2B is a plot of tilt angle versus distance from center for the AlN film structure described in connection with FIG.

FIG. 3 is a plot of shear coupling coefficient ($K_s$) and longitudinal coupling coefficient ($K_l$) as a function of c-axis angle of inclination for AlN.

Figure 4A:
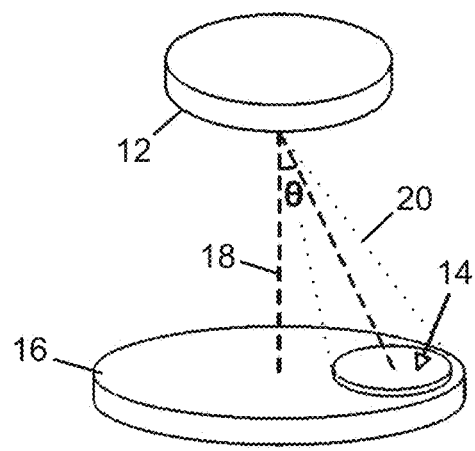

FIG. 4A is a simplified schematic of an off-axis sputtering deposition apparatus arranged to eject metal atoms from a target surface toward a substrate supported by a substrate holder substantially parallel to the target surface, with central axes of the substrate and the target surface being parallel but offset relative to one another.

Figure 4B:
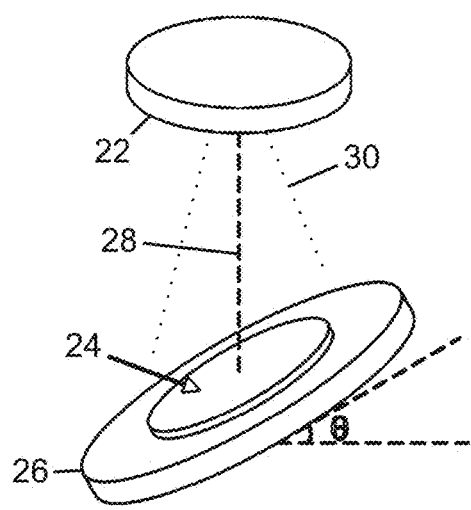

FIG. 4B is a simplified schematic of a sputtering deposition apparatus arranged to eject metal atoms from a target surface toward a substrate supported by a substrate holder that is non-parallel to the target surface, with a central axis of the target surface extending through a center point of the substrate.

Figure 4C:
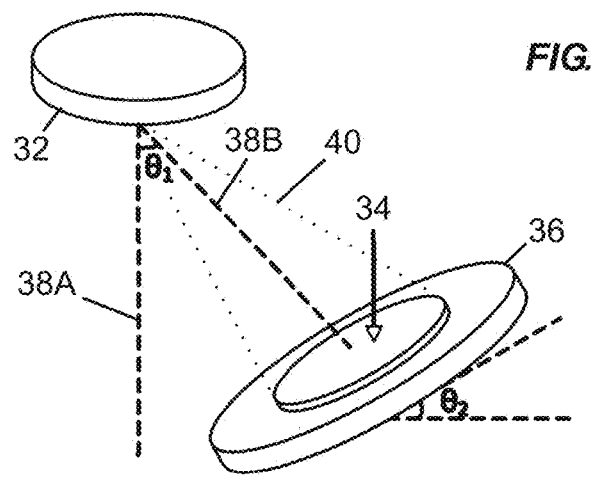

FIG. 4C is a simplified schematic of a sputtering deposition apparatus arranged to eject metal atoms from a target surface toward a substrate supported by a substrate holder that is non-parallel to the target surface, with a central axis of the substrate extending through a center point of the target surface, and with a central axis of the target surface being separated from the central axis of the substrate by a first angle, and with the substrate holder being tilted by a second angle relative to a plane parallel with the target surface.

Figure 5A:
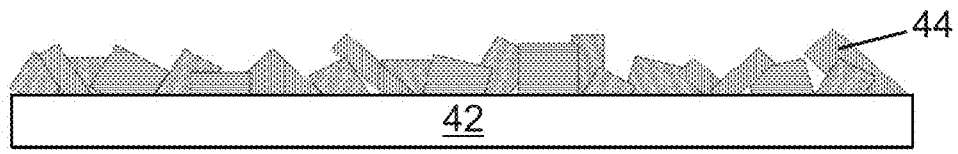

FIG. 5A is a cross-sectional schematic view of a seed layer exhibiting multiple textures (e.g., (103) and (002)) deposited via a first sputtering step over a substrate.

Figure 5B:
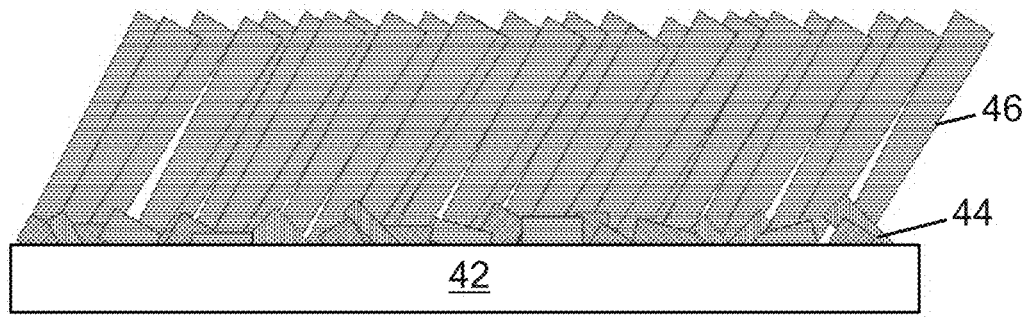

FIG. 5B is a cross-sectional schematic view of the seed layer and substrate of FIG. 5A following deposition via a second sputtering step of a tilted axis AlN film over the seed layer.

Figure 6:
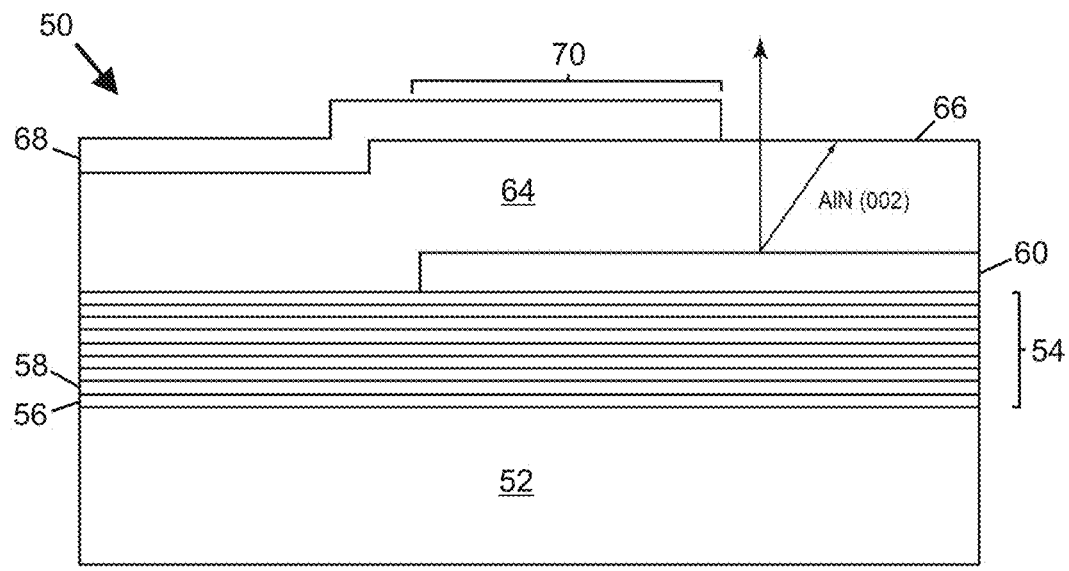

FIG. 6 is a schematic cross-sectional view of a portion of a bulk acoustic wave solidly mounted resonator device including an inclined c-axis hexagonal crystal structure piezoelectric material bulk layer as disclosed herein, with the resonator device including an active region with a portion of the piezoelectric material arranged between overlapping portions of a top side electrode and a bottom side electrode.

Figure 7:
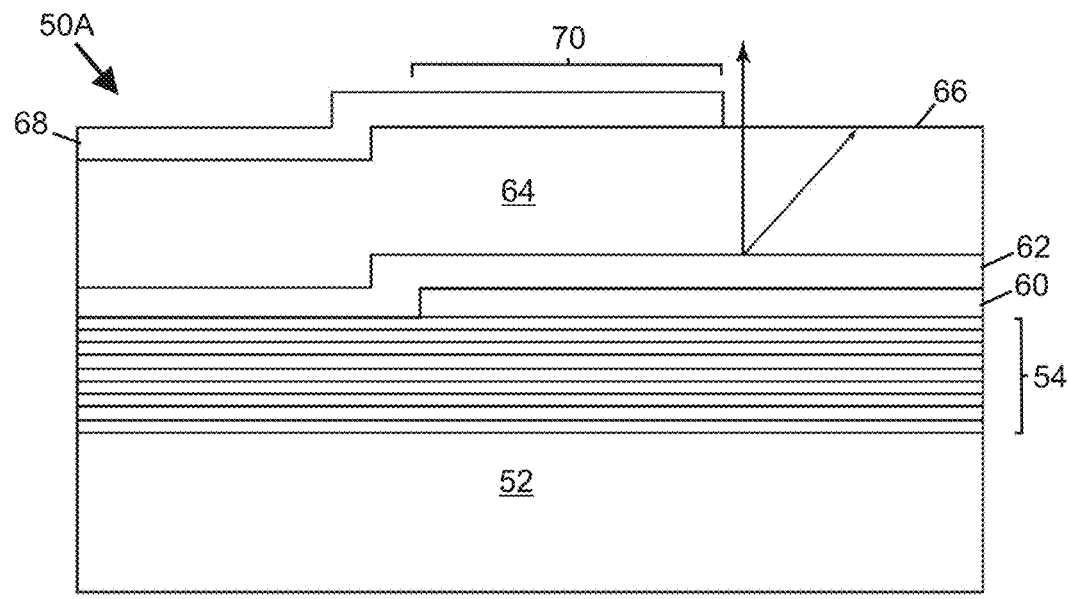

FIG. 7 is a schematic cross-sectional view of a portion of a bulk acoustic wave solidly mounted resonator device according to one embodiment including an inclined c-axis hexagonal crystal structure piezoelectric material bulk layer arranged over a crystalline seed layer as disclosed herein, with the resonator device including an active region with a portion of the piezoelectric material arranged between overlapping portions of a top side electrode and a bottom side electrode.

Figure 8:
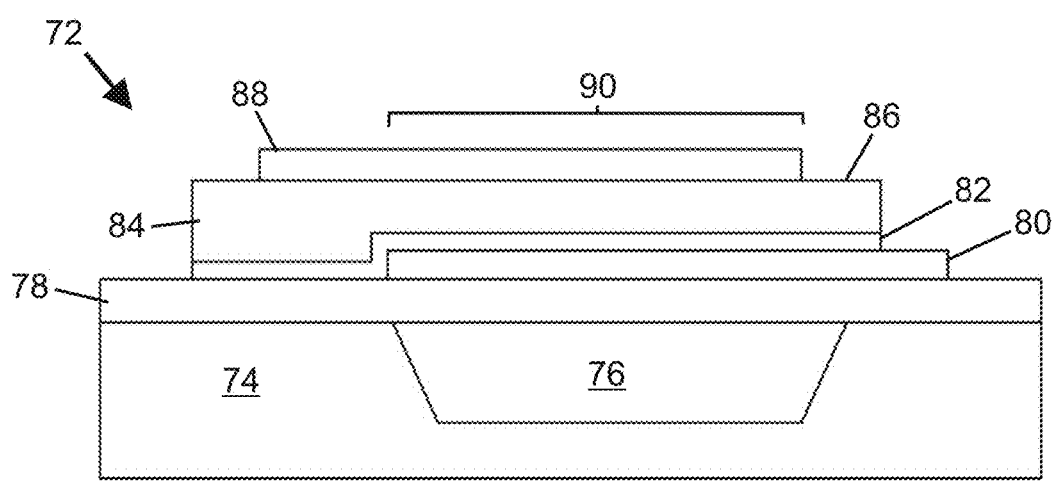

FIG. 8 is a schematic cross-sectional view of a film bulk acoustic wave resonator (FBAR) device according to one embodiment including an inclined c-axis hexagonal crystal structure piezoelectric material bulk layer arranged over a crystalline seed layer as disclosed herein, with the FBAR device including a substrate defining a cavity covered by a support layer, and including an active region registered with the cavity with a portion of the piezoelectric material arranged between overlapping portions of a top side electrode and a bottom side electrode.

Figure 9:
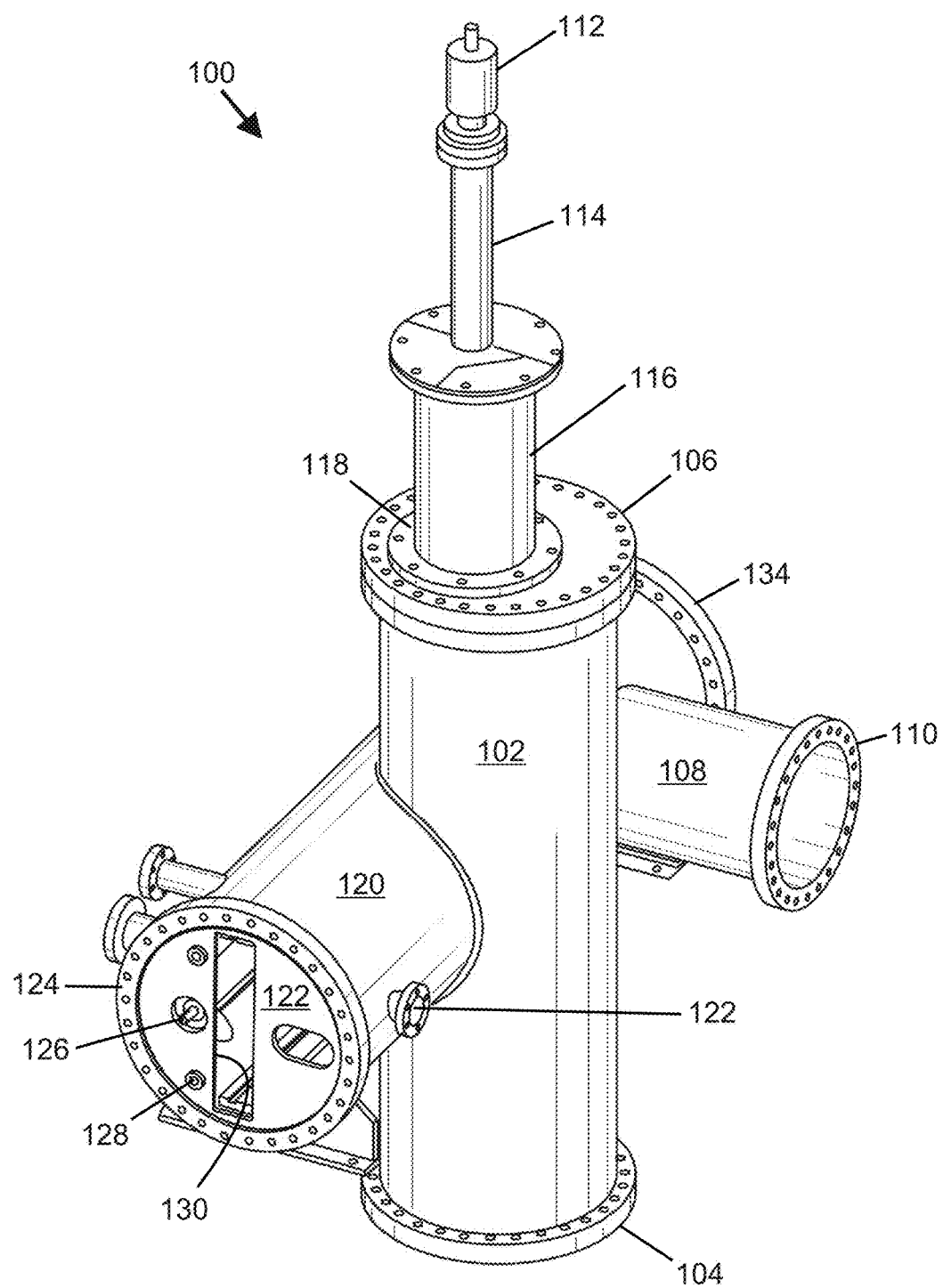

FIG. 9 is an upper exterior perspective view of a reactor of a deposition system for growing a hexagonal crystal structure piezoelectric material with an inclined c-axis, the system including a linear sputtering apparatus, a movable substrate table for supporting multiple substrates, and a collimator, according to one embodiment of the present disclosure.

Figure 10:
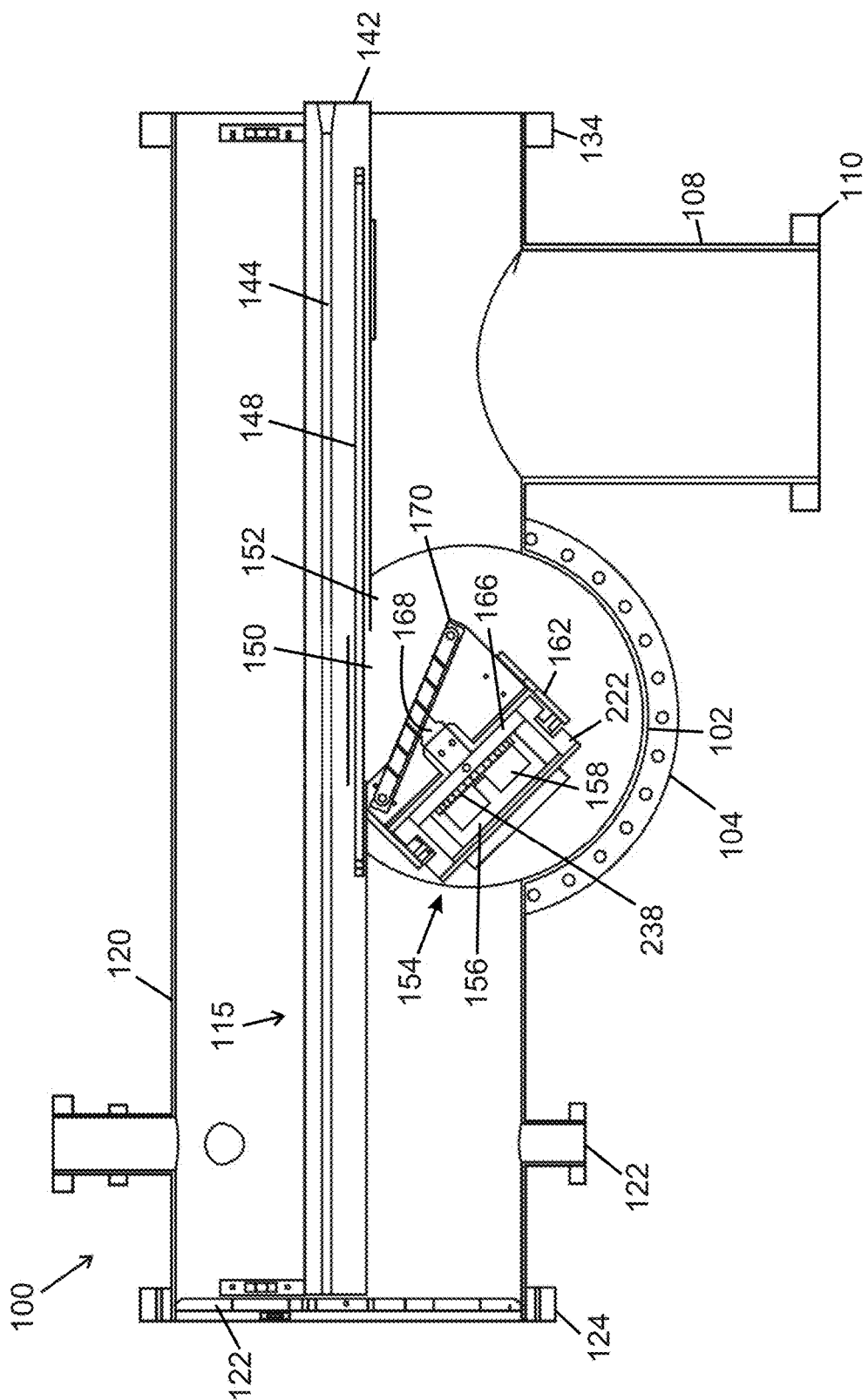

FIG. 10 is a downwardly-facing cross-sectional view of the reactor of FIG. 9.

Figure 11:
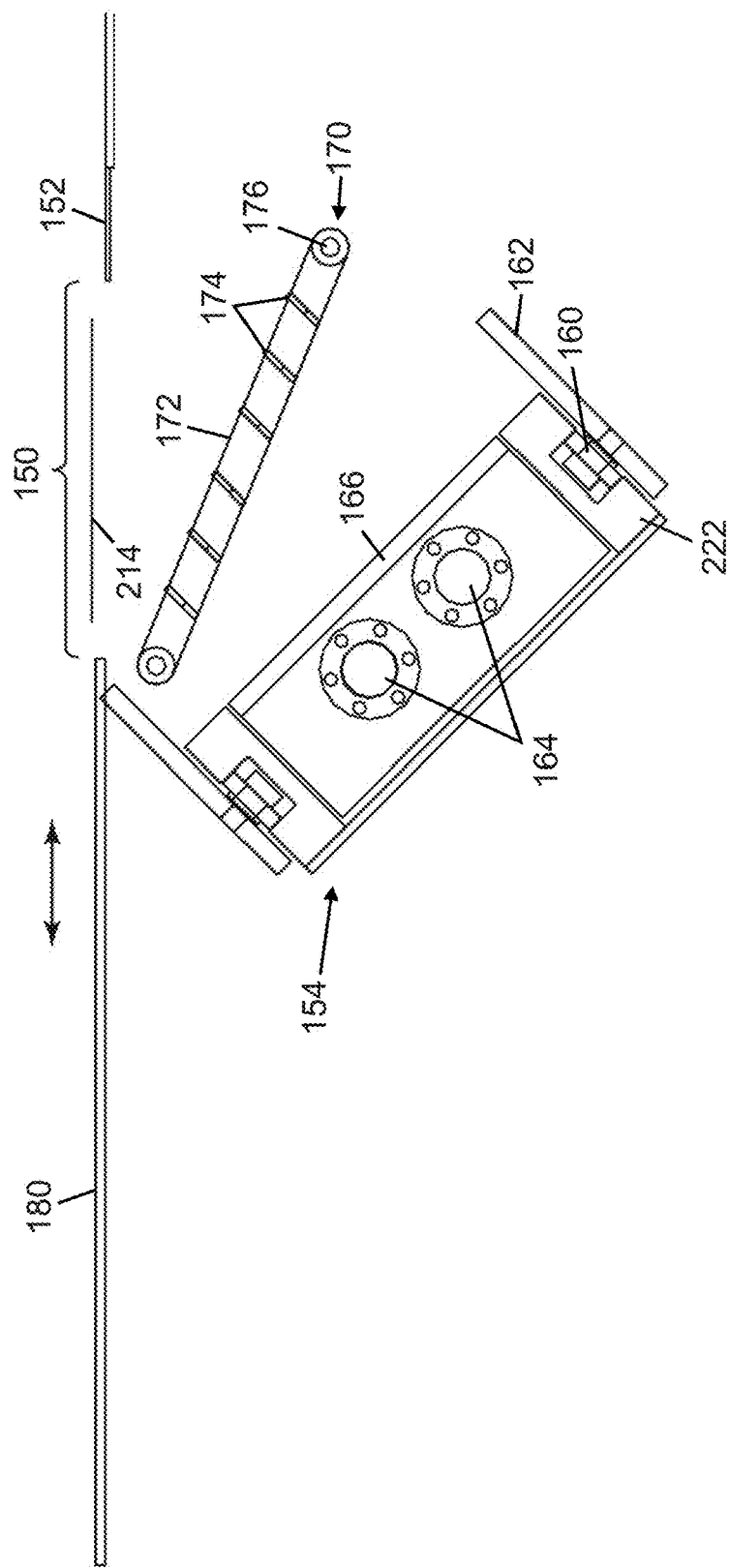

FIG. 11 is a downwardly-facing cross-sectional view of a portion of the reactor of FIGS. 9 and 10, showing a cathode and target surface of the linear sputtering apparatus, the collimator, and a deposition aperture including a uniformity shield.

Figure 12:
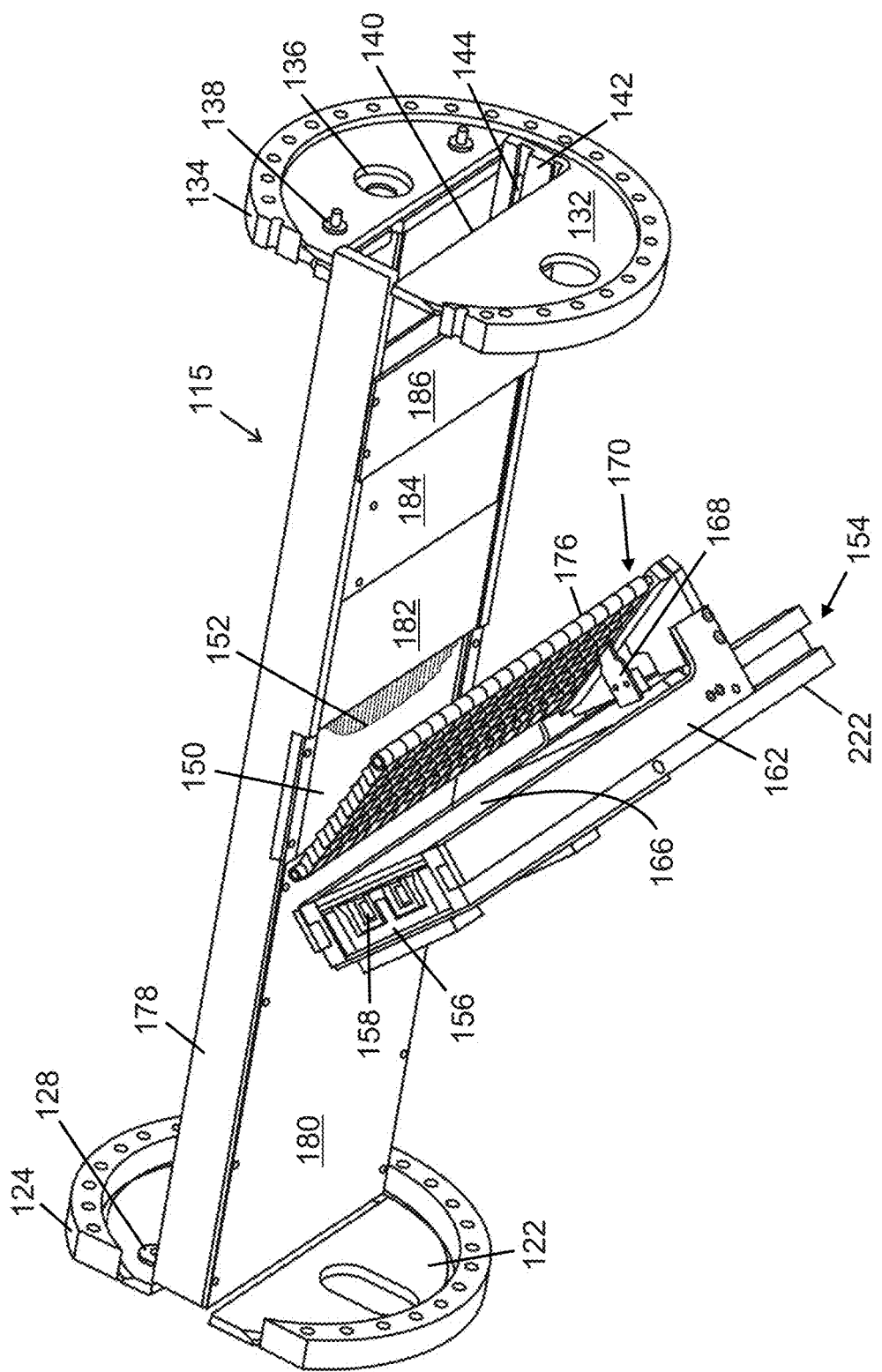

FIG. 12 is an upper perspective view of a portion of the reactor of FIGS. 9 and 10, showing the target surface of the linear sputtering apparatus, the collimator, and the deposition aperture, and the flange-terminated translation section including rails for supporting a movable substrate table.

Figure 13:
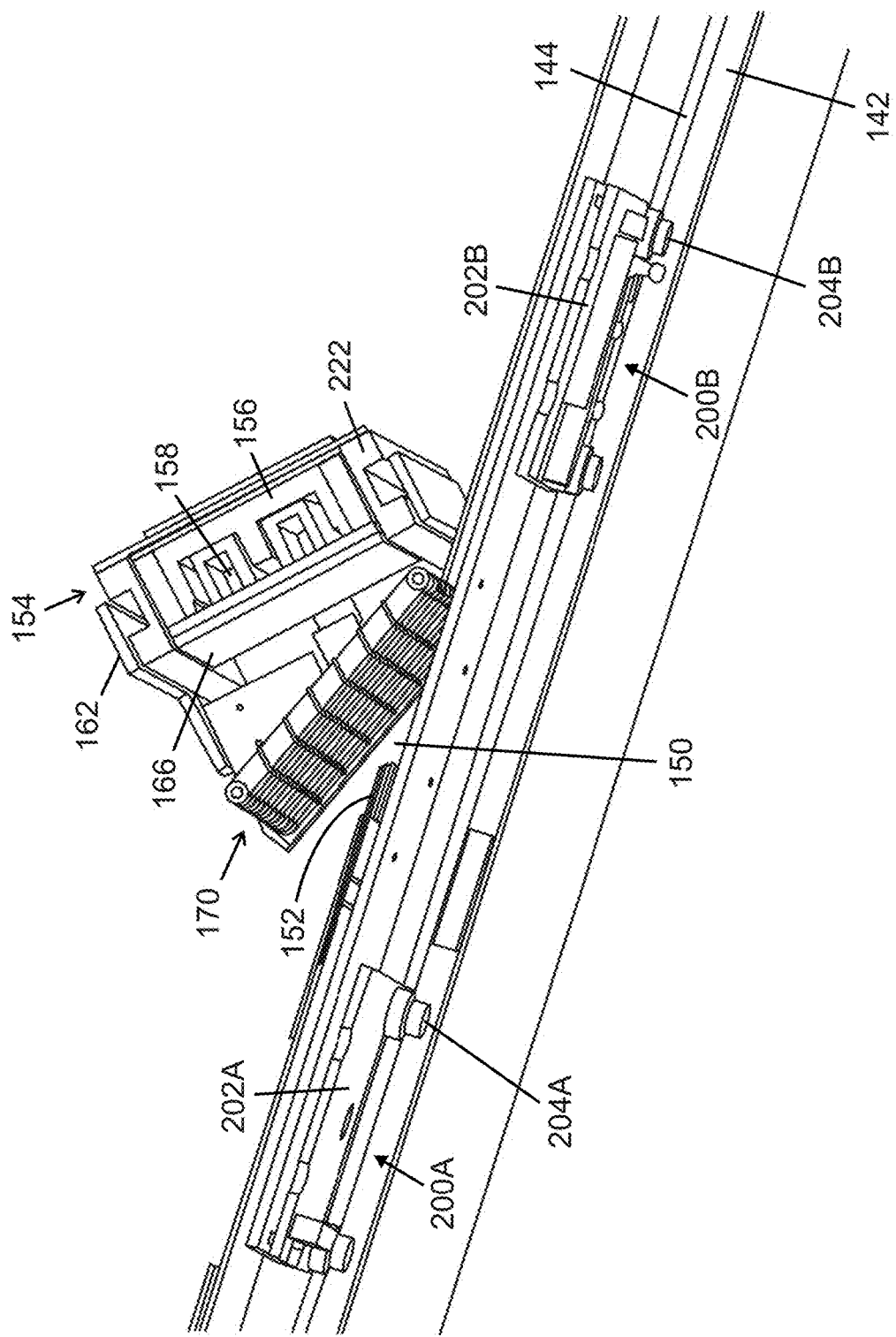

FIG. 13 is an upper perspective view of a portion of the reactor of FIGS. 9 and 10, showing the target surface of the linear sputtering apparatus, the collimator, and the deposition aperture, and a portion of the flange-terminated translation section for supporting a movable substrate table.

FIG. 14A is a side elevation view of a portion of the reactor of FIGS. 9 and 10, showing a rear portion of the flange-terminated translation section, and showing the movable substrate table (in dashed lines) supporting two substrates (also in dashed lines), with the movable substrate table in a first position.

FIG. 14B is a side elevation view of the reactor portion shown in FIG. 14A, with the movable substrate table and substrates (in hidden lines) in a second position.

FIG. 15A is a side elevation view of the substrate table shown in FIGS. 13, 14A, and 14B, with the substrate table supporting two round substrates.

FIG. 15B is a side elevation view of the substrate table shown in FIGS. 14A, 14B, and 15A, with the substrate table supporting four round substrates.

Figure 16:
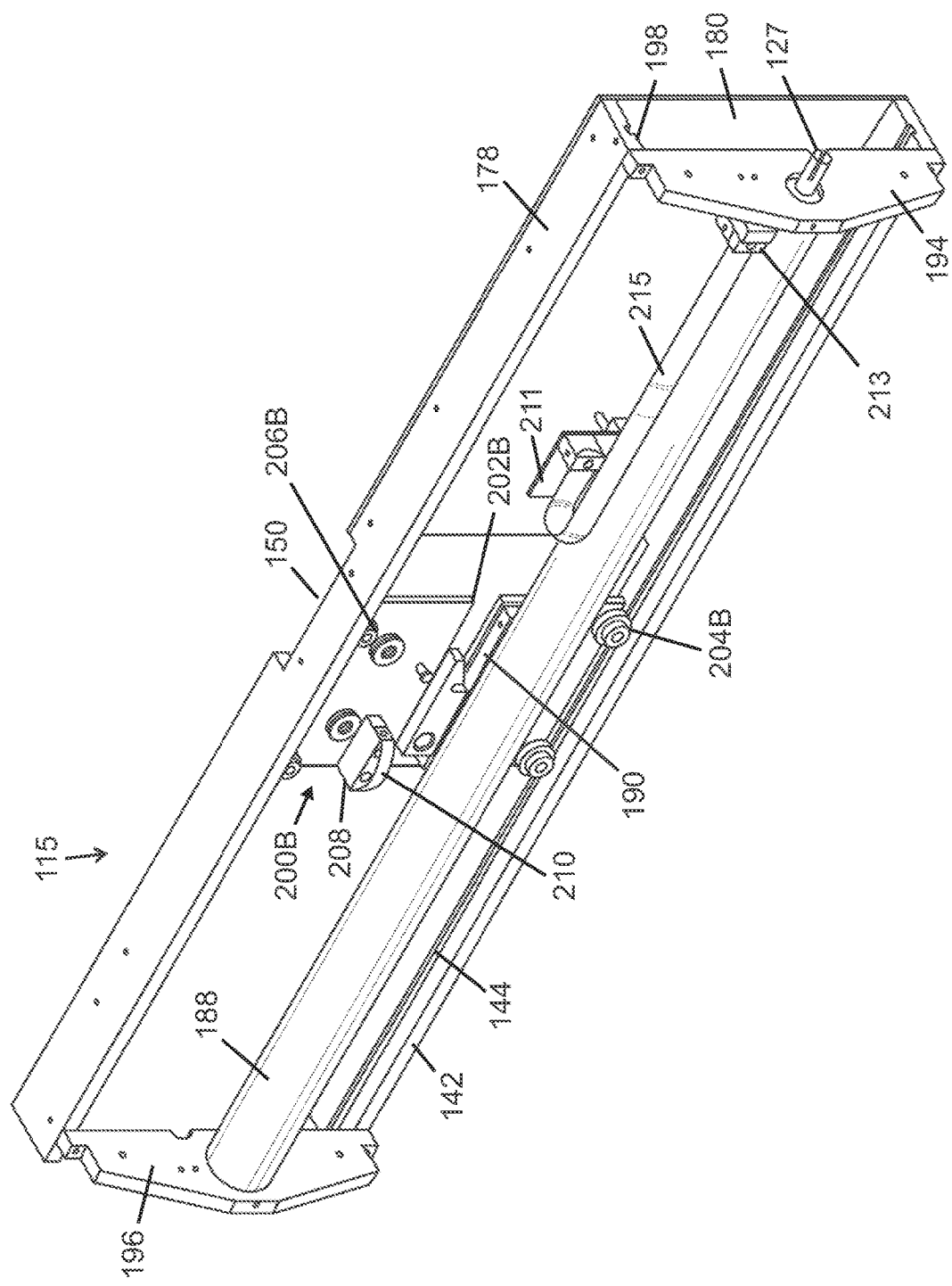

FIG. 16 is a rear perspective view of a translation section for use within the reactor of FIGS. 9 and 10, including translation rails, a movable truck, and a drive screw assembly, as well as substrate table biasing hardware in a disengaged configuration.

Figure 17:
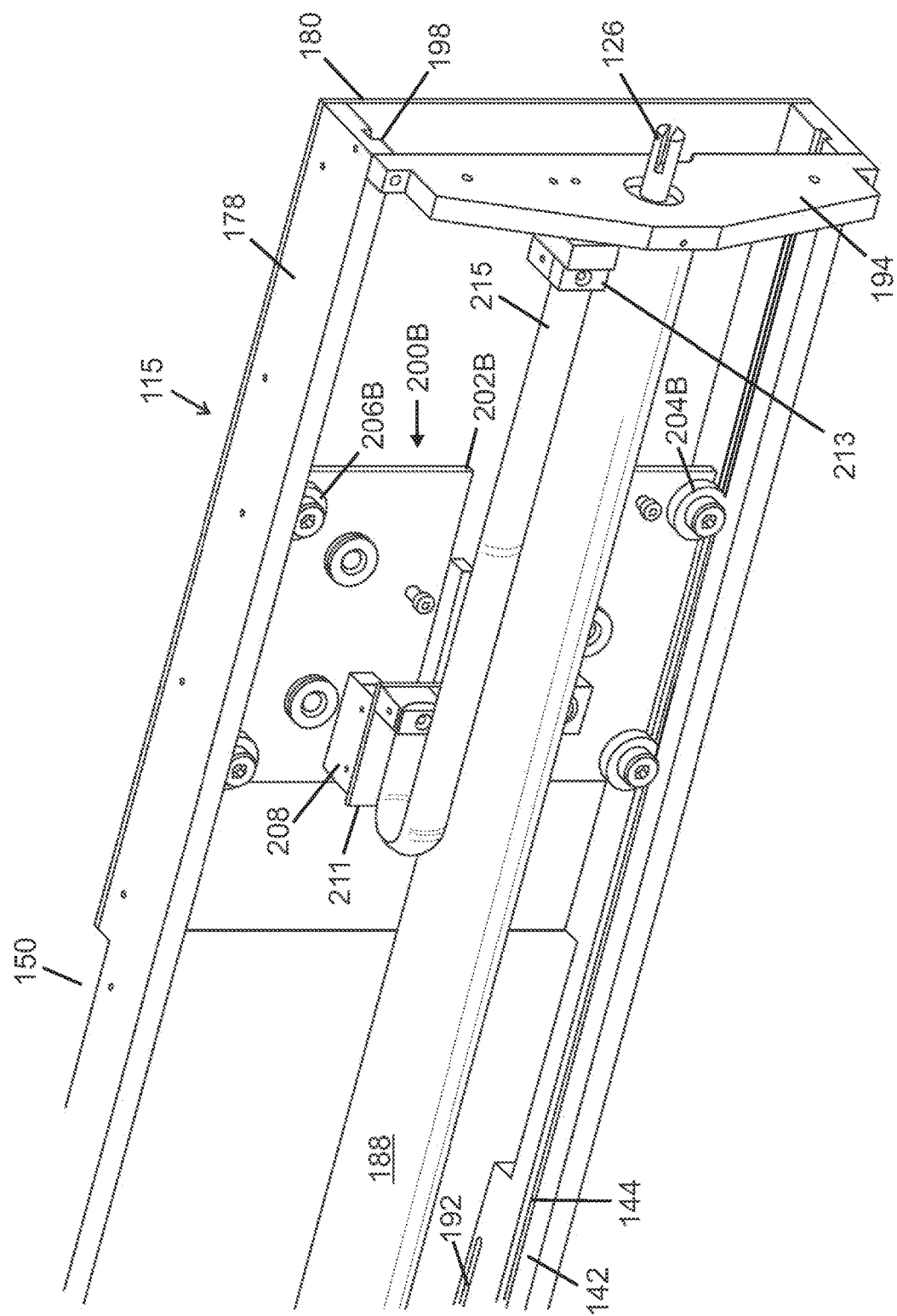

FIG. 17 is a magnified rear perspective view of the translation section of FIG. 16 with the substrate table biasing hardware in an engaged configuration.

Figure 18:
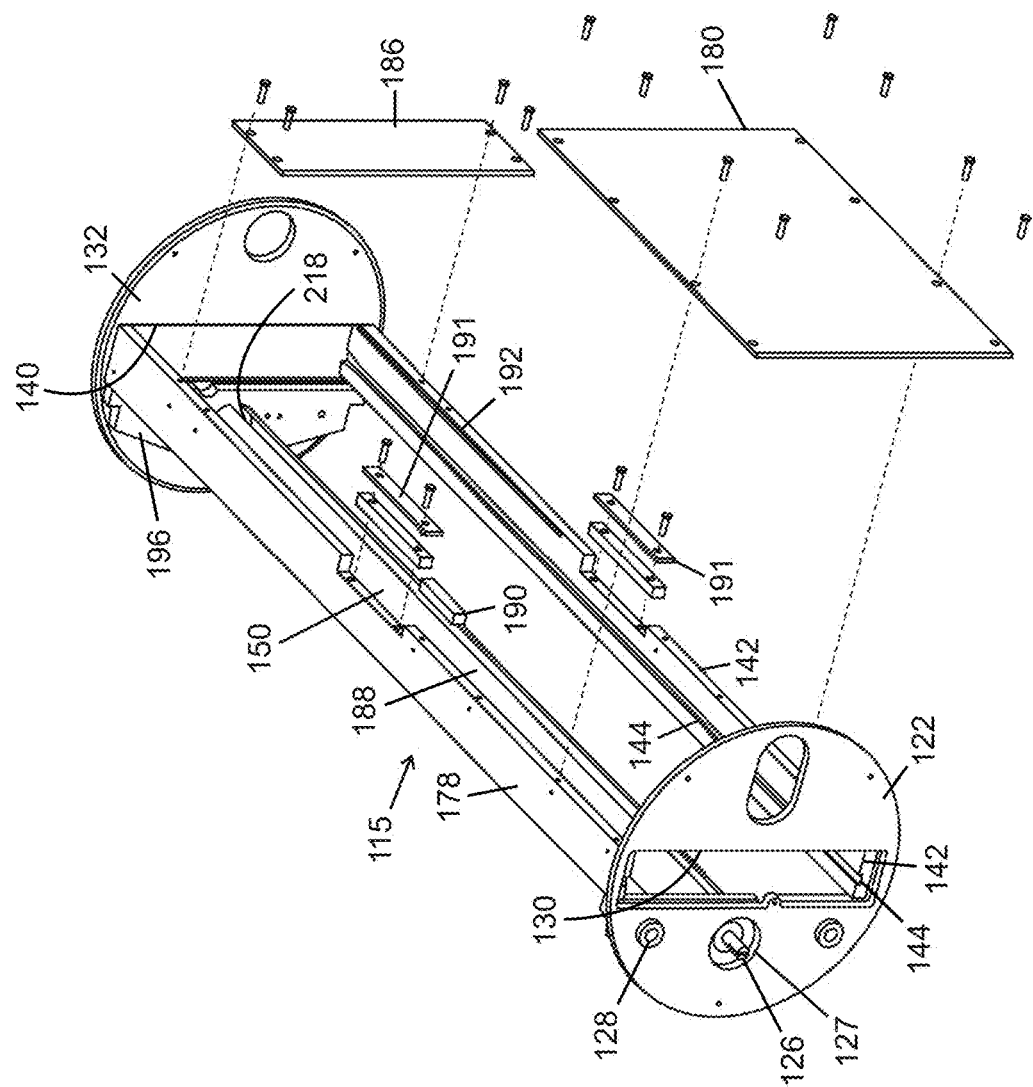

FIG. 18 is a perspective assembly view of a portion of the translation section of FIGS. 16 and 17, showing translation rails arranged between chamber adapters, and showing sputter shields prior to attachment to the rails.

Figure 19:
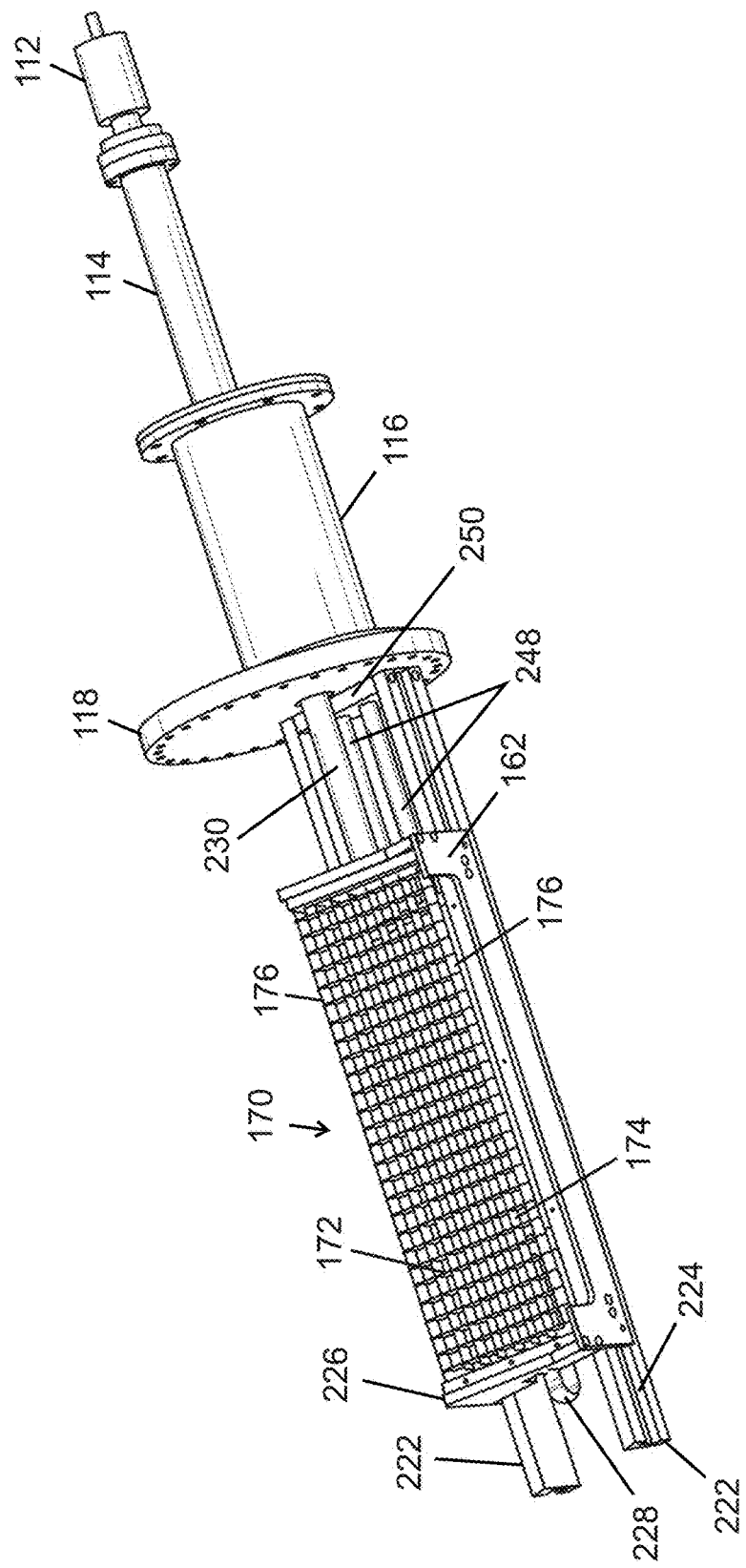

FIG. 19 is a perspective view of a portion of the reactor of FIGS. 9 and 10, including a collimator, collimator motion guide rails, and a screw-type drive mechanism for causing the translation of the collimator.

Figure 20:
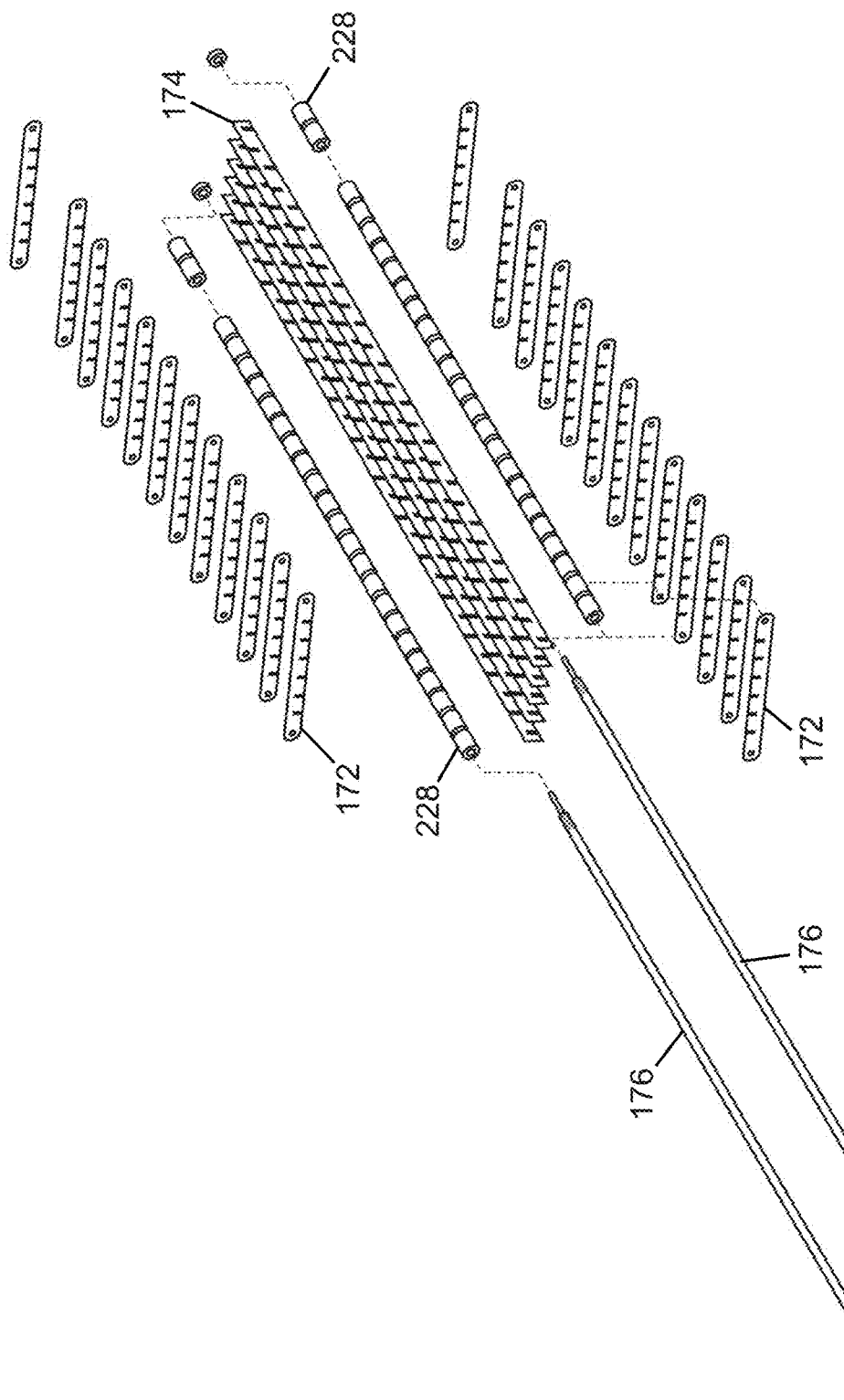

FIG. 20 is a perspective assembly view of at least a portion of the collimator shown in FIG. 19.

Figure 21:
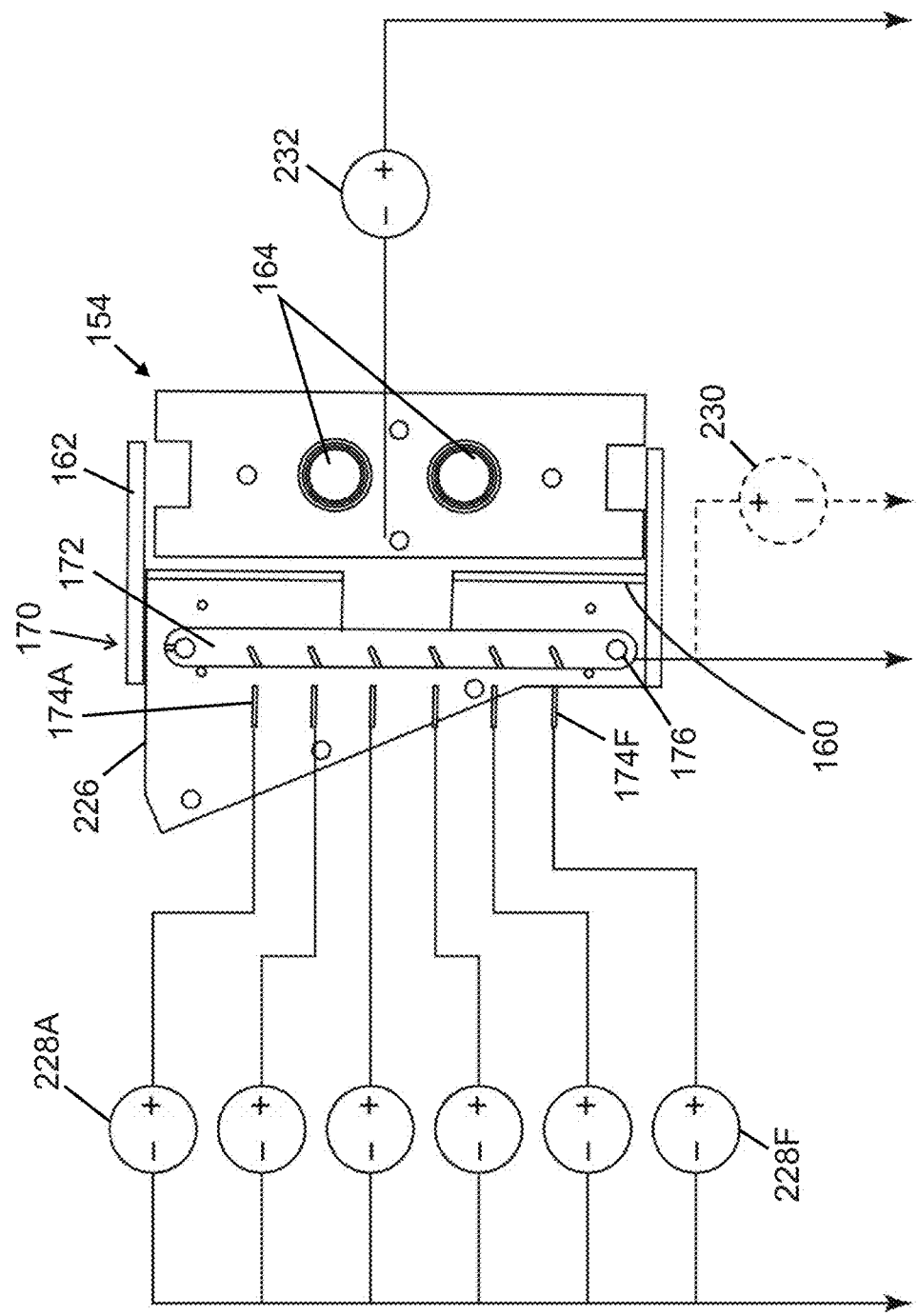

FIG. 21 is a simplified schematic showing electrical connections to collimator and target surface portions of a reactor according to FIGS. 9 and 10 according to one embodiment, including independent electrical control of different collimator guides.

Figure 22:
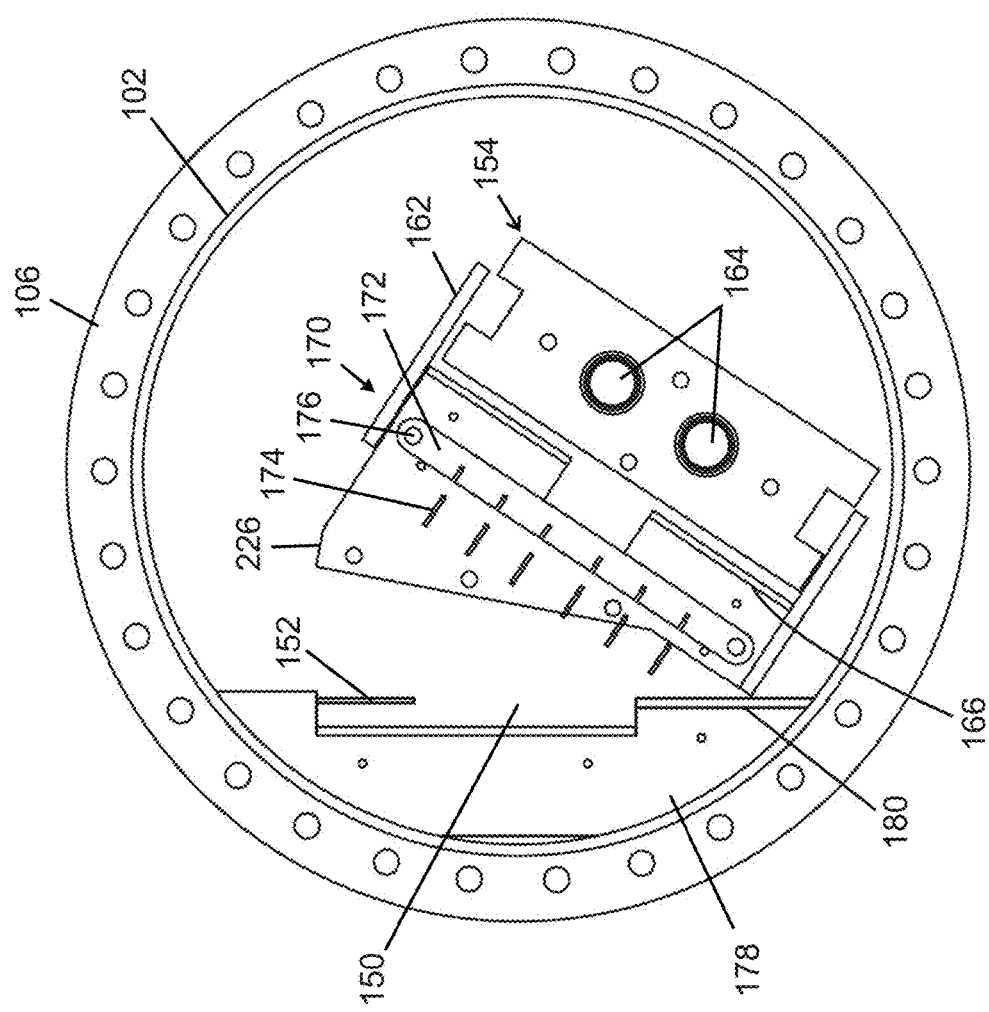

FIG. 22 is a top plan view of a portion of the reactor of FIGS. 9 and 10 visible through an upper cathode flange, showing a deposition aperture, uniformity shield, cathode, target surface, and collimator, with the collimator and the target surface in a first configuration.

Figure 23:
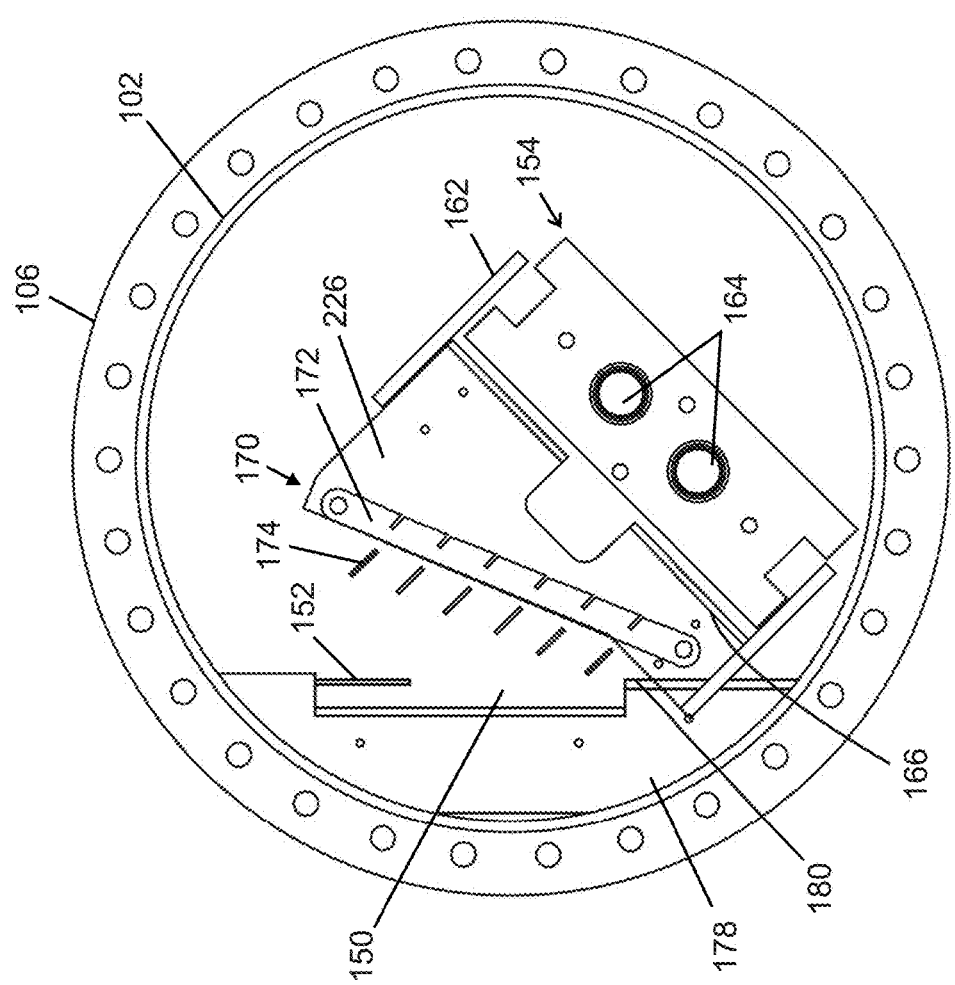

FIG. 23 is a top plan view of the reactor portion of FIG. 22, with the collimator and cathode assembly in a second configuration.

Figure 24:
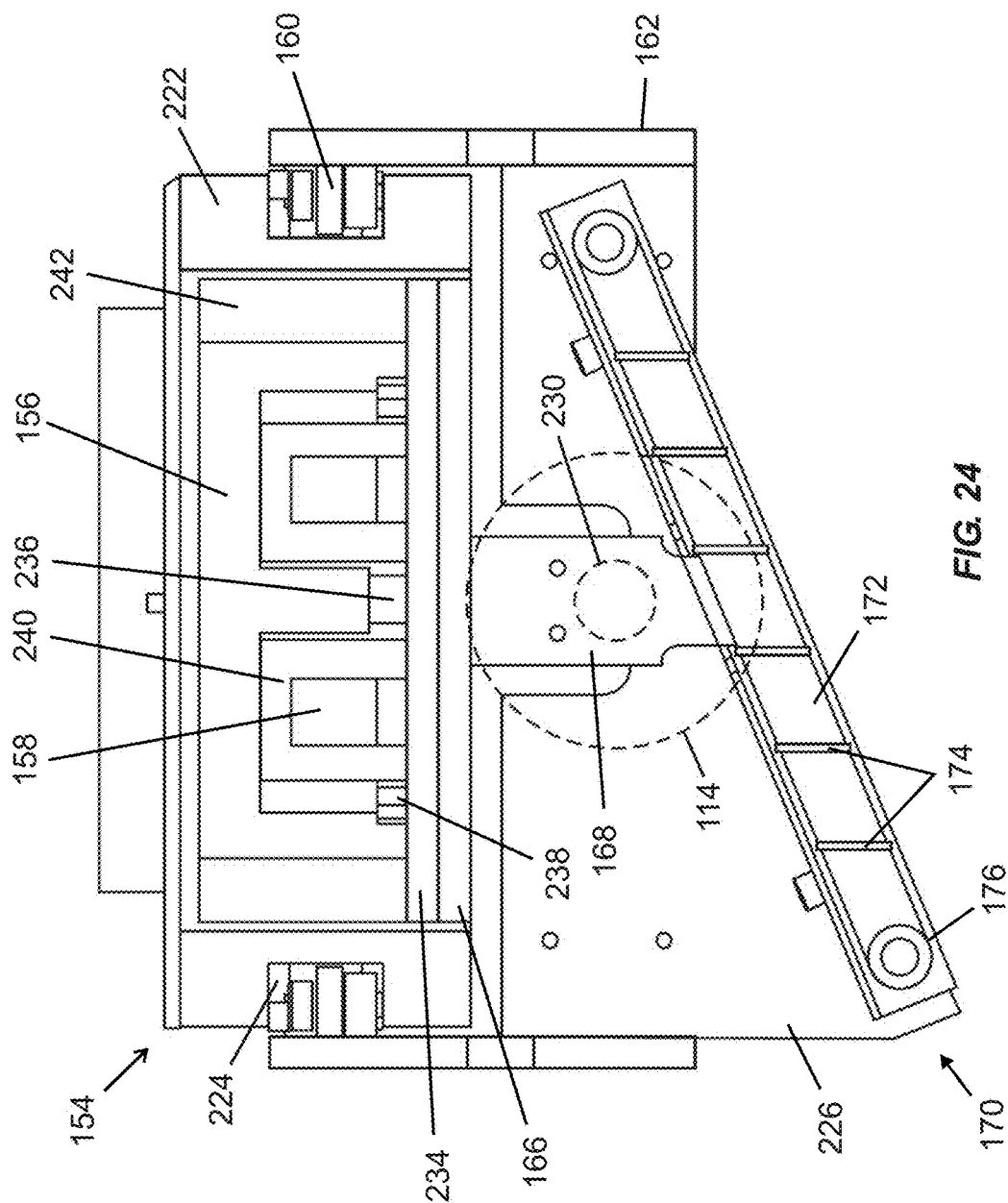

FIG. 24 is a cross-sectional view of a portion of the reactor of FIGS. 9 and 10, showing the cathode assembly, target surface, and collimator.

Figure 25:
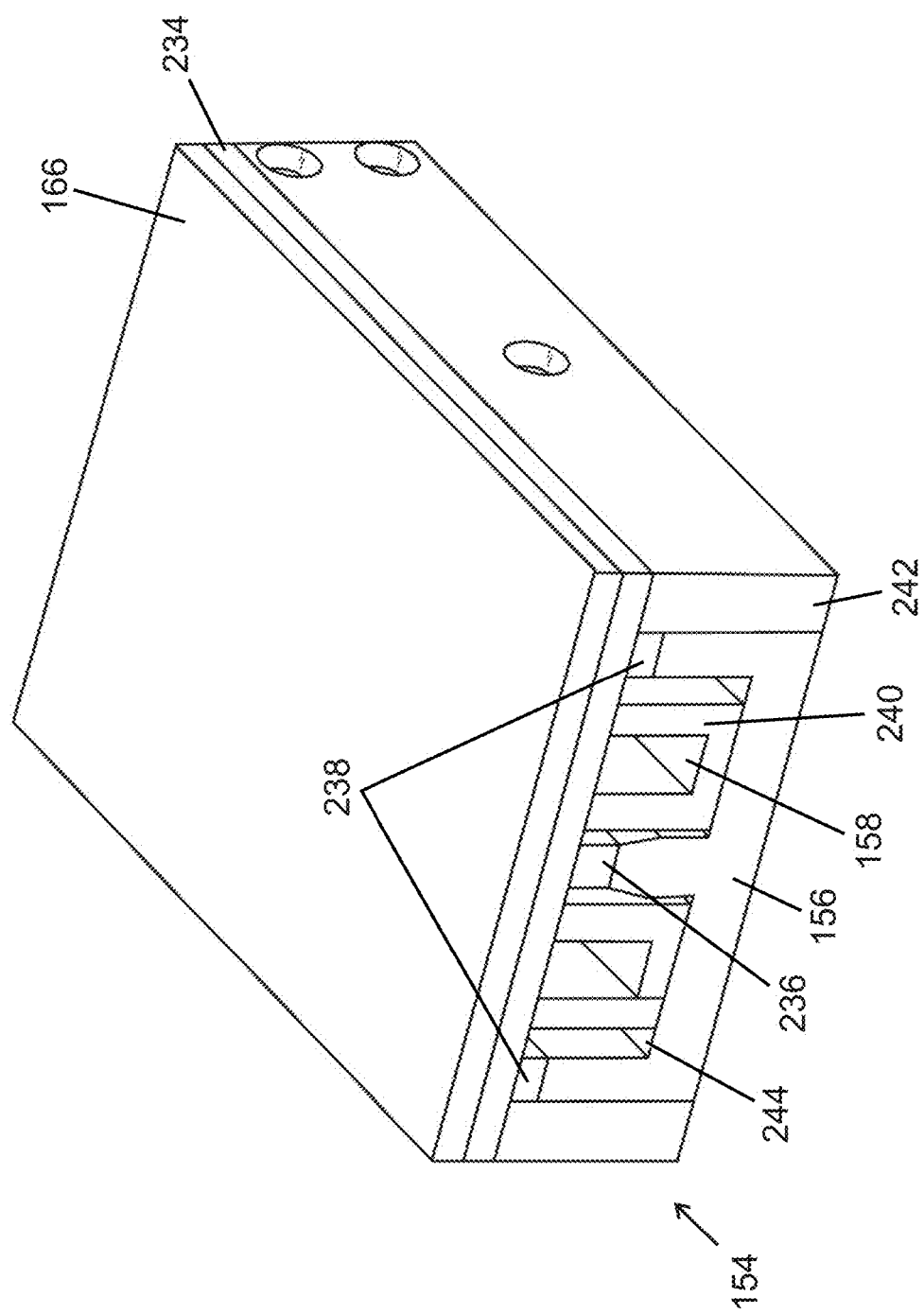

FIG. 25 is a perspective cross-sectional view of a portion of the cathode assembly shown in FIG. 24 and useable in the reactor of FIGS. 9 and 10.

Figure 26:
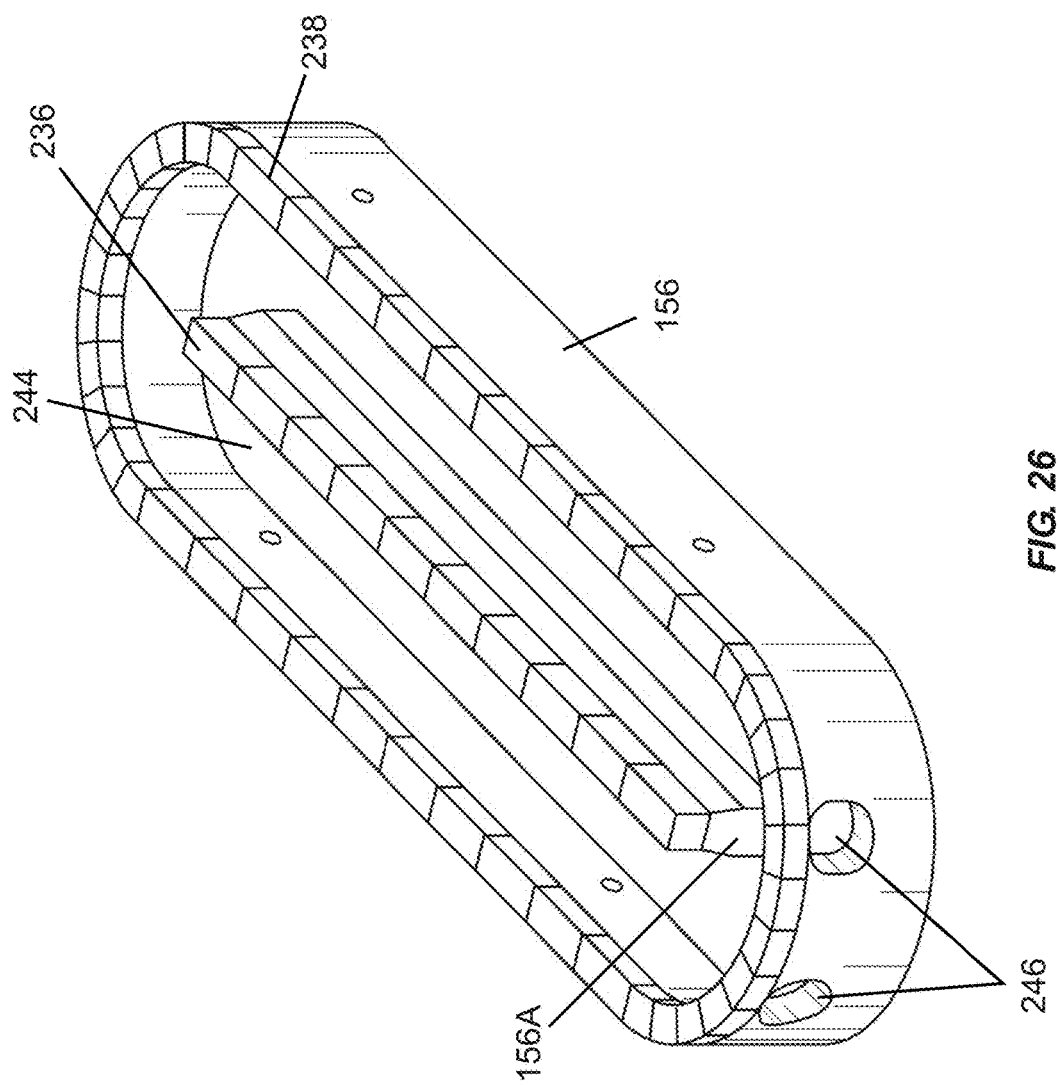

FIG. 26 is a perspective view of a cathode magnet structure of the cathode assembly portion in FIG. 25.

Figure 27:
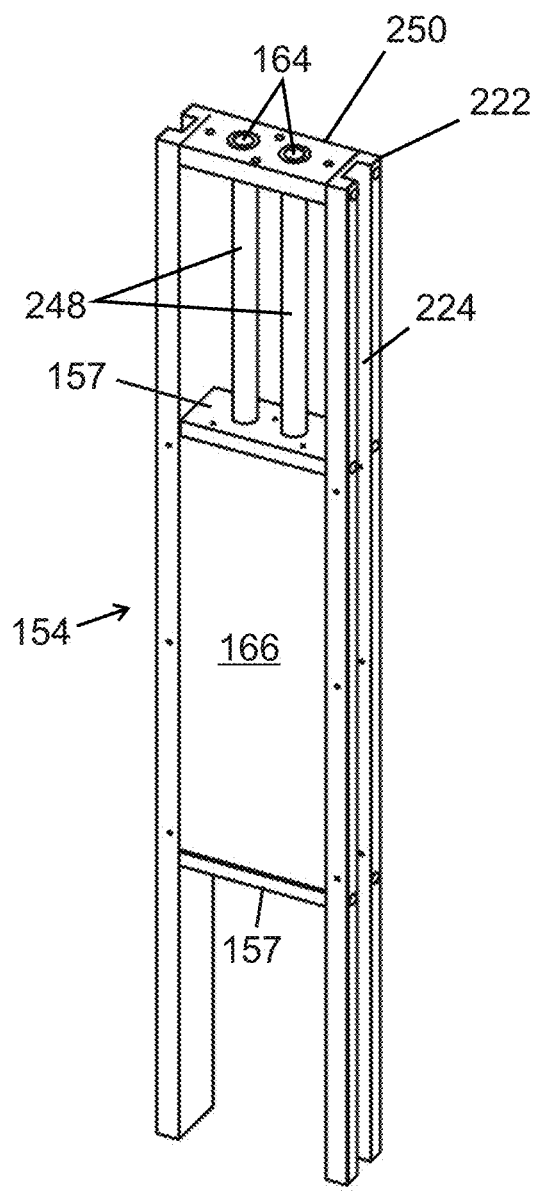

FIG. 27 is a perspective view of a cathode assembly including the portion of FIG. 25 and the cathode magnet structure of FIG. 26.

Figure 28:
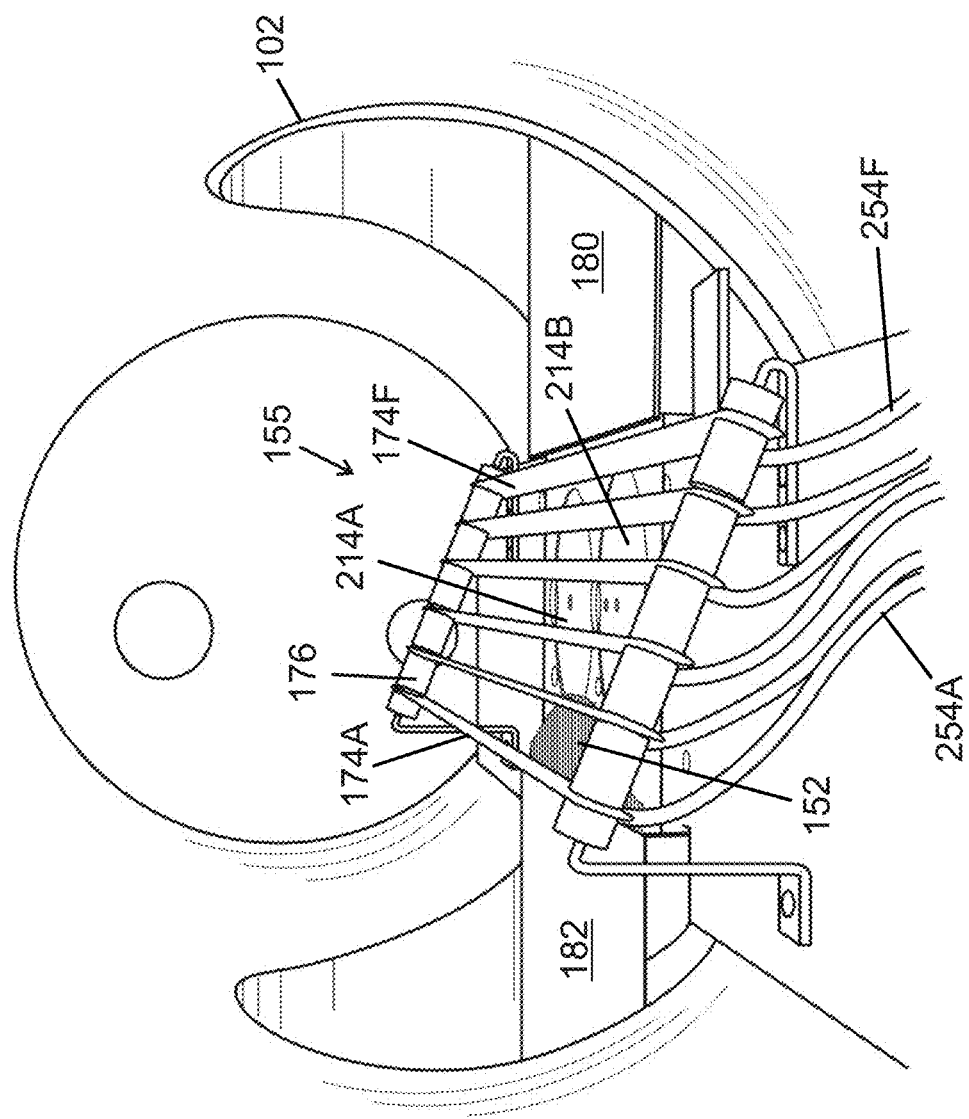

FIG. 28 is a perspective view of an alternative collimator assembly arranged within a deposition reactor, with vertical guide members extending in a single direction and with wiring permitting individual electrical biasing of each vertical guide member.

Figure 29A:
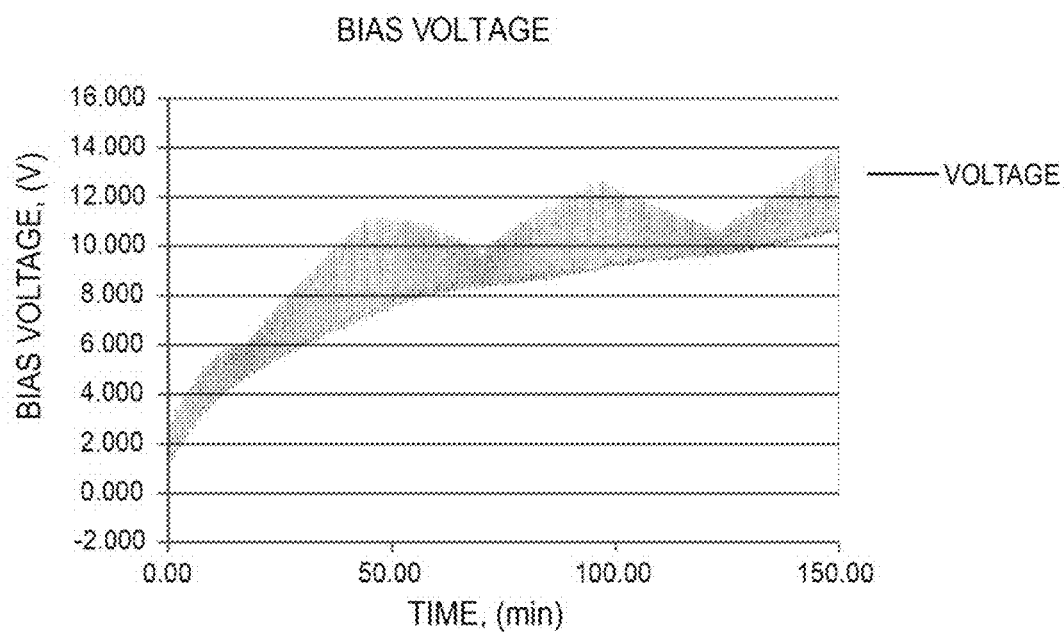

FIG. 29A is a plot of bias voltage versus time for an electrically biased collimator, including oscillations due to translation of the collimator.

Figure 29B:
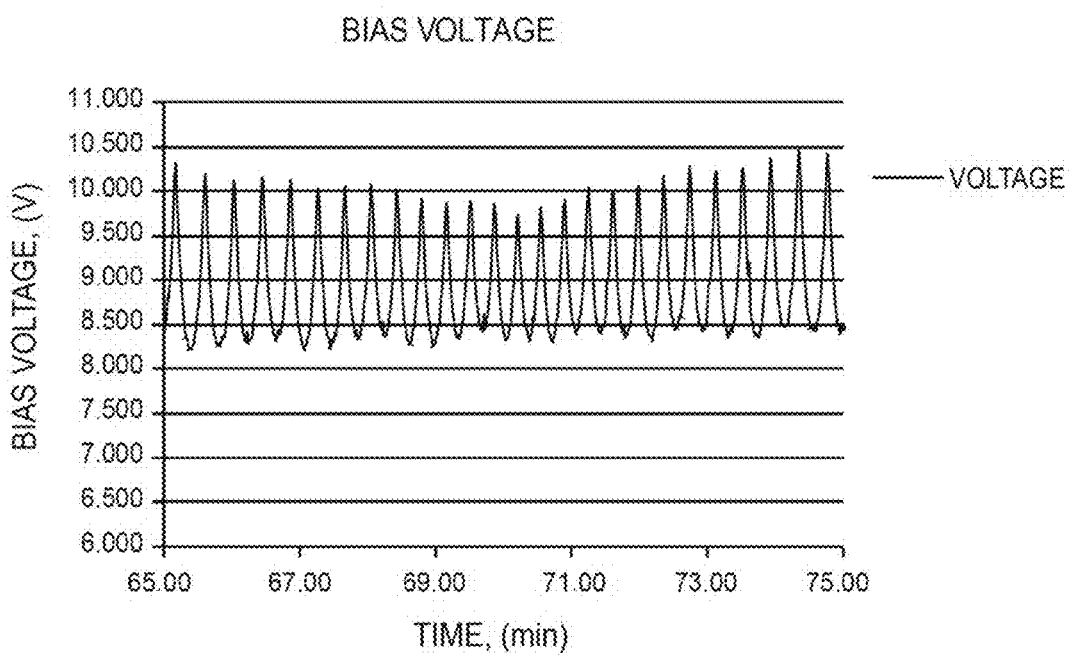

FIG. 29B is a plot of bias voltage versus time embodying a magnified portion of the plot of FIG. 29A for time values of 65 minutes to 75 minutes.

Figure 30A:
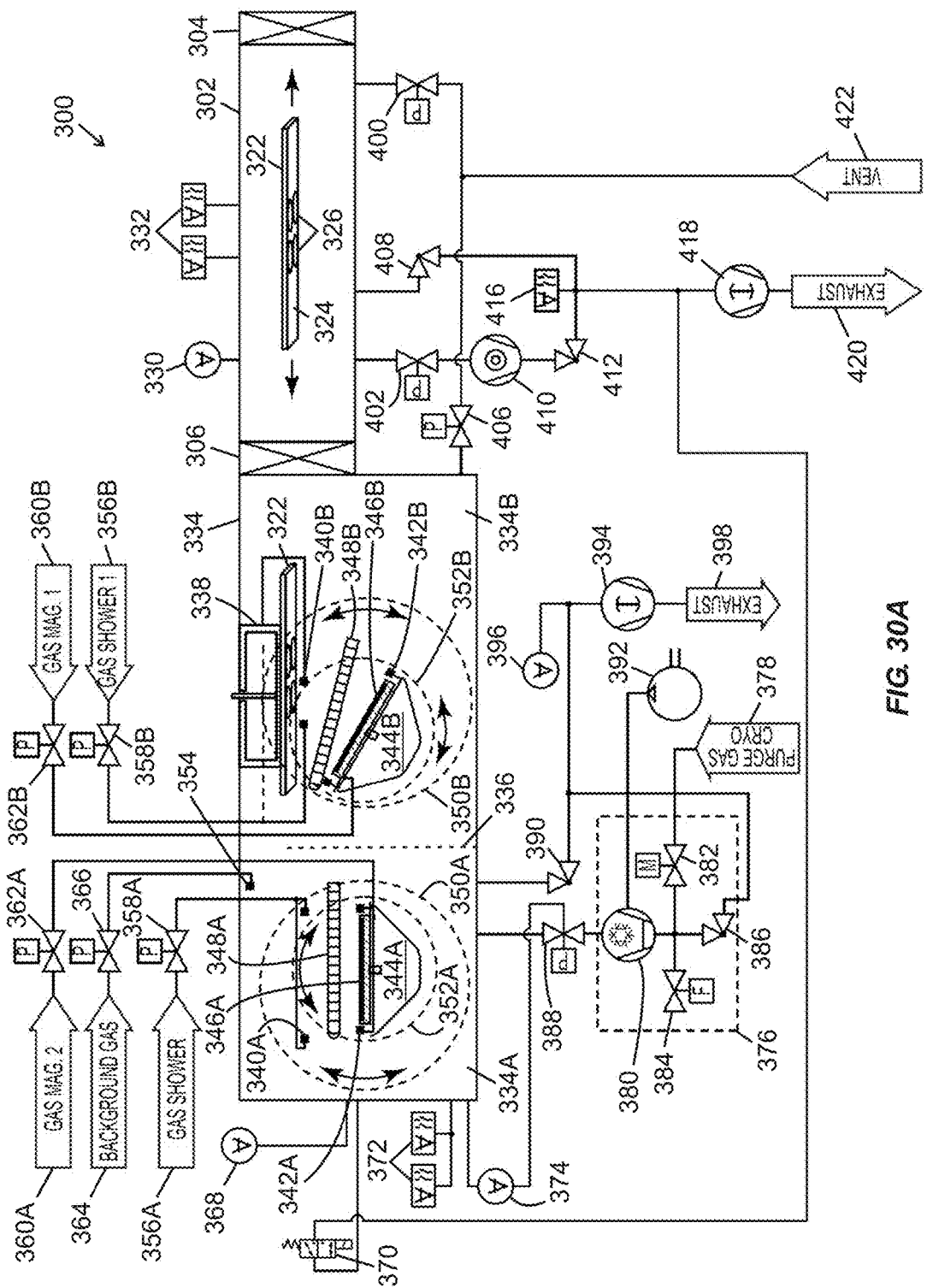

FIG. 30A is a schematic diagram showing components and piping connections of a deposition system including multiple linear sputtering apparatuses, a translatable substrate table, and multiple collimators arranged between the substrate table and the respective linear sputtering apparatuses.

Figure 30B:
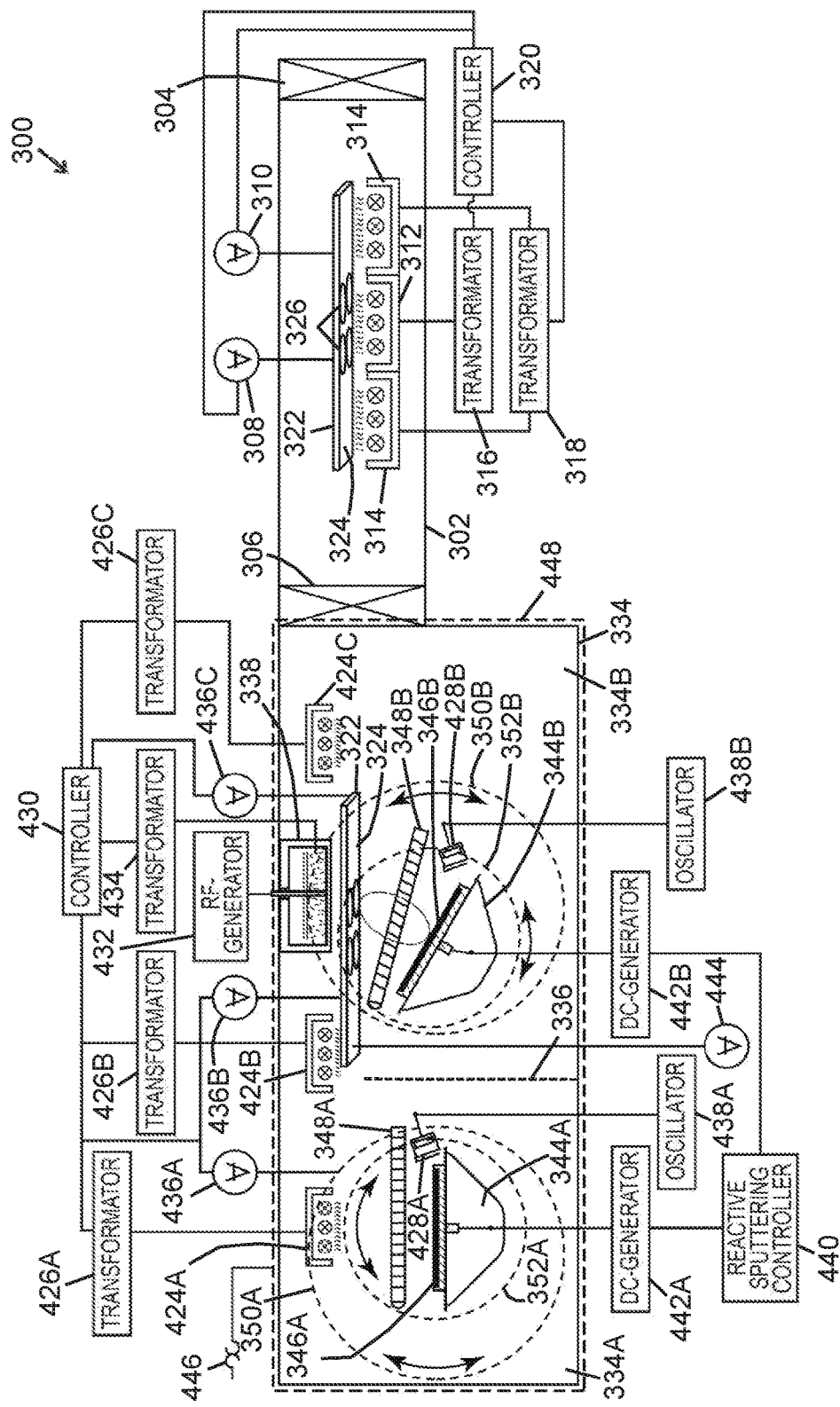

FIG. 30B is a schematic diagram showing components, including thermal and control components, of the deposition system of FIG. 30A.

Figure 31:
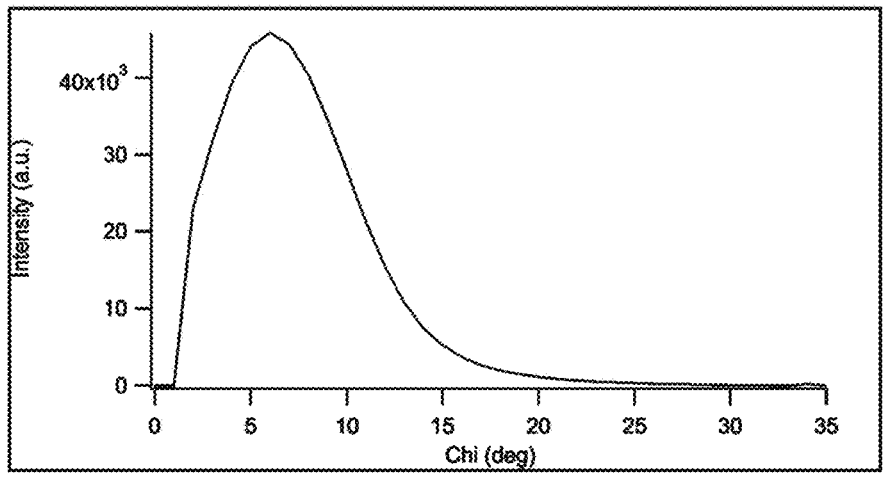

FIG. 31 is a plot of intensity versus c-axis angle for X-ray diffraction analysis of a tilted c-axis AlN bulk layer formed over a substrate without an intervening seed layer.

Figure 32:
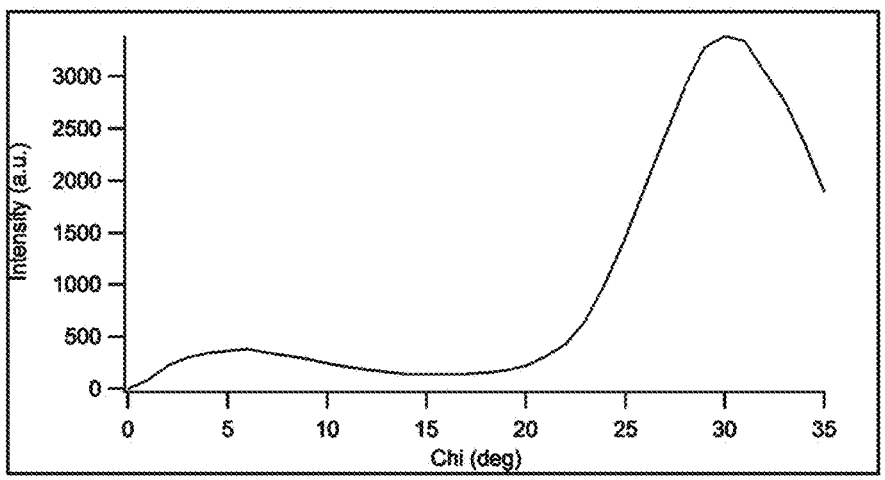

FIG. 32 is a plot of intensity versus c-axis angle for X-ray diffraction analysis of a tilted c-axis AlN bulk layer formed over an AlN seed layer supported by a substrate, with the seed layer formed at a comparatively low pressure of 5 mT.

Figure 33:
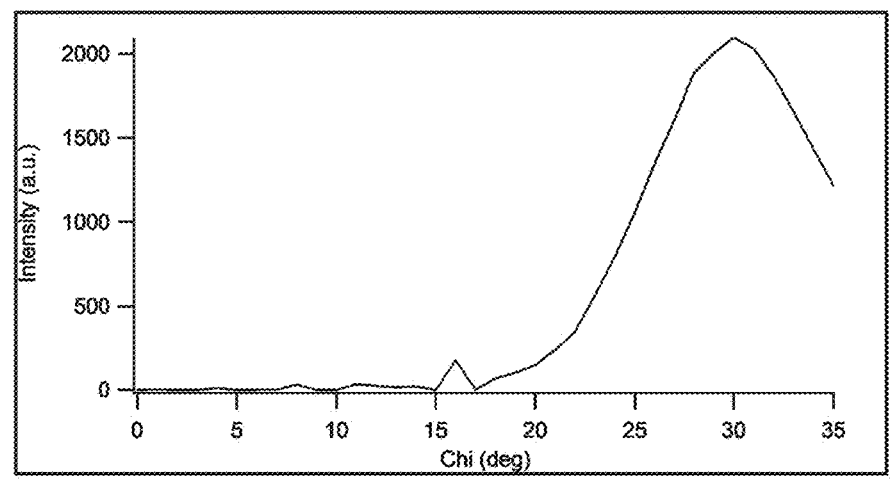

FIG. 33 is a plot of intensity versus c-axis angle for X-ray diffraction analysis of a tilted c-axis AlN bulk layer formed over an AlN seed layer supported by a substrate, with the seed layer formed at a comparatively higher pressure of 15 mT.

Figure 34:
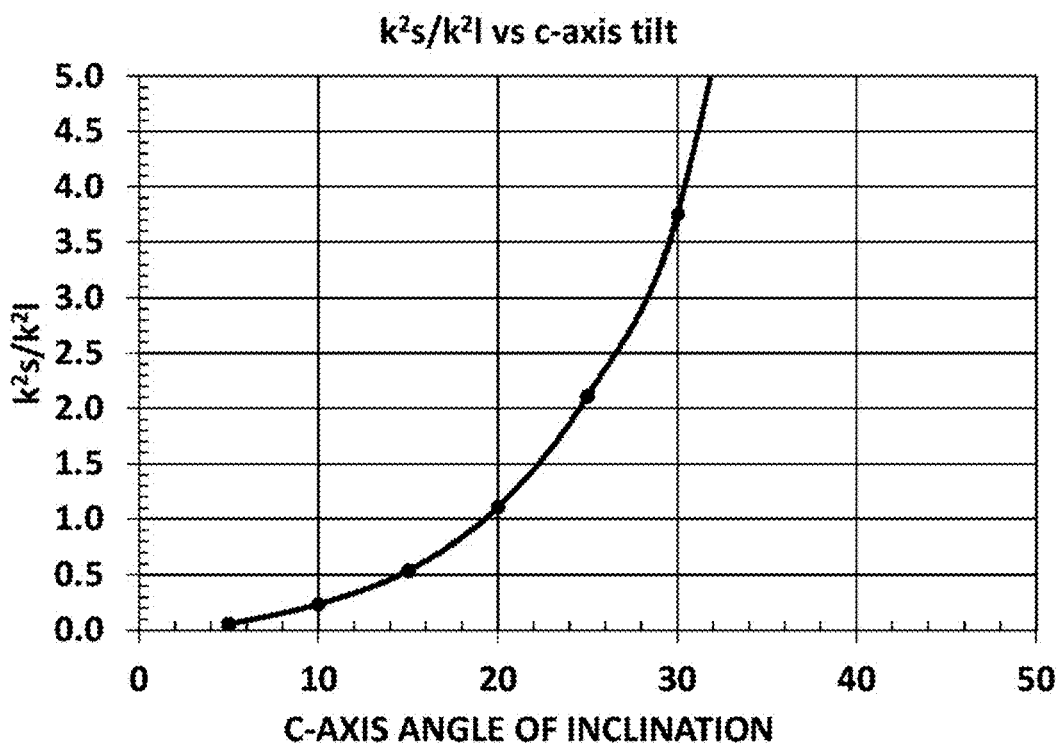

FIG. 34 is a plot of squared shear coupling coefficient over squared longitudinal coupling coefficient (shear/long ratio) versus c-axis angle of inclination for AlN.

Figure 35:
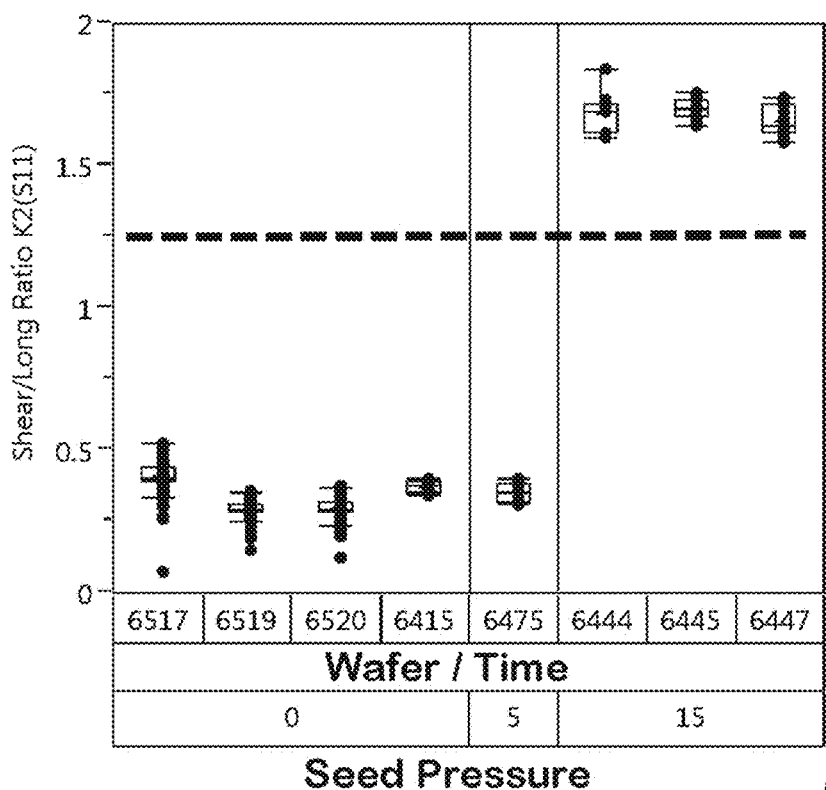

FIG. 35 is a plot of squared shear coupling coefficient over squared longitudinal coupling coefficient (shear/long ratio) for a first set of eight AlN film samples grown according to three growth conditions (i.e., no seed layer, seed layer grown at 5 mT, and seed layer grown at 15 mT).

Figure 36:
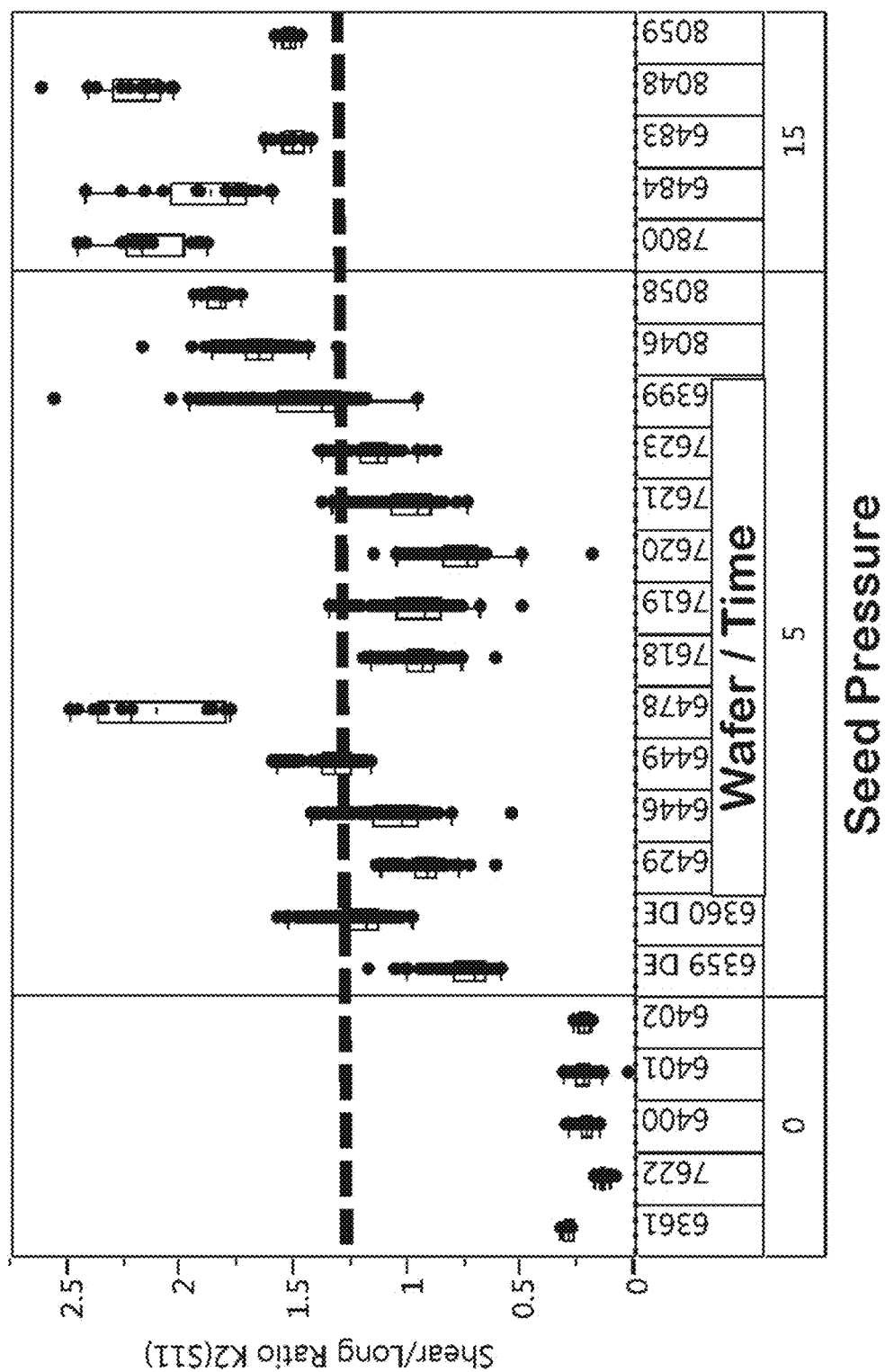

FIG. 36 is a plot of squared shear coupling coefficient over squared longitudinal coupling coefficient (shear/long ratio) for a second set of twenty-four AlN film samples grown according to three growth conditions (i.e., no seed layer (five samples), seed layer grown at 5 mT (fourteen samples), and seed layer grown at 15 mT (five samples)).

Figure 37A:
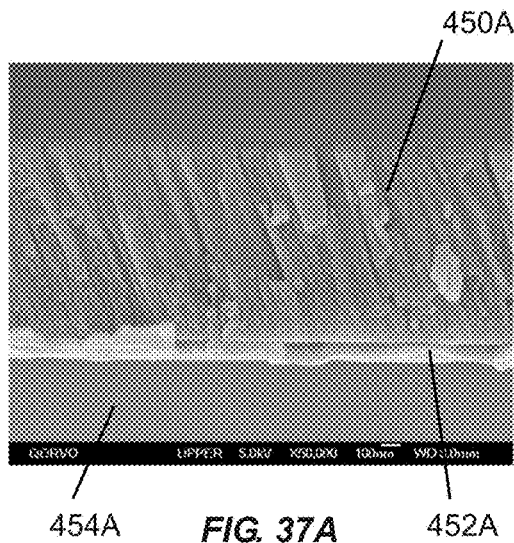

FIG. 37A is a cross-sectional scanning electrode microscopy (SEM) photograph (50,000× magnification) of an AlN bulk layer deposited over an AlN seed layer grown at 5 mT.

Figure 37B:
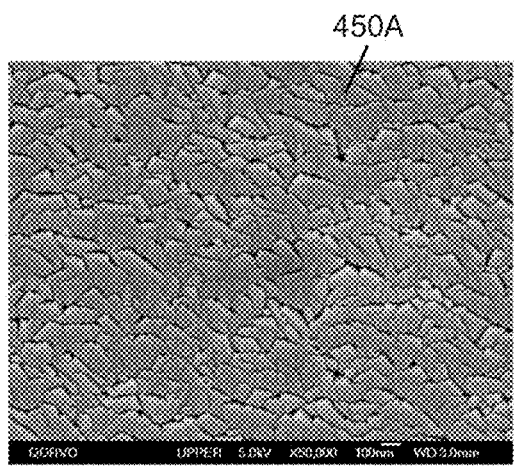

FIG. 37B is a SEM photograph (50,000× magnification) of a top surface of the AlN bulk layer of FIG. 37A.

Figure 38A:
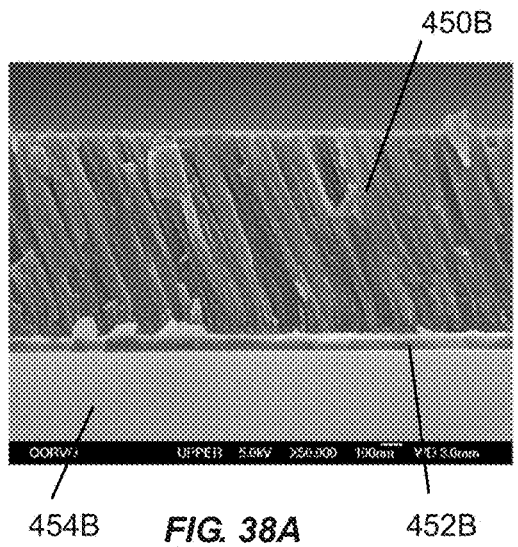

FIG. 38A is a cross-sectional view SEM photograph (50,000× magnification) of an AlN bulk layer deposited over an AlN seed layer grown at 15 mT.

Figure 38B:
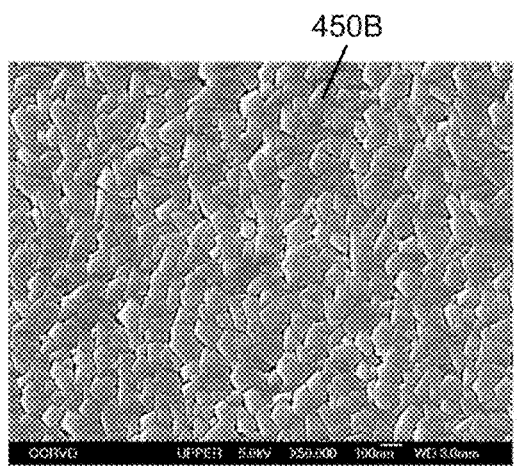

FIG. 38B is a SEM photograph (50,000× magnification) of a top surface of the AlN bulk layer of FIG. 38A.

Figure 39:
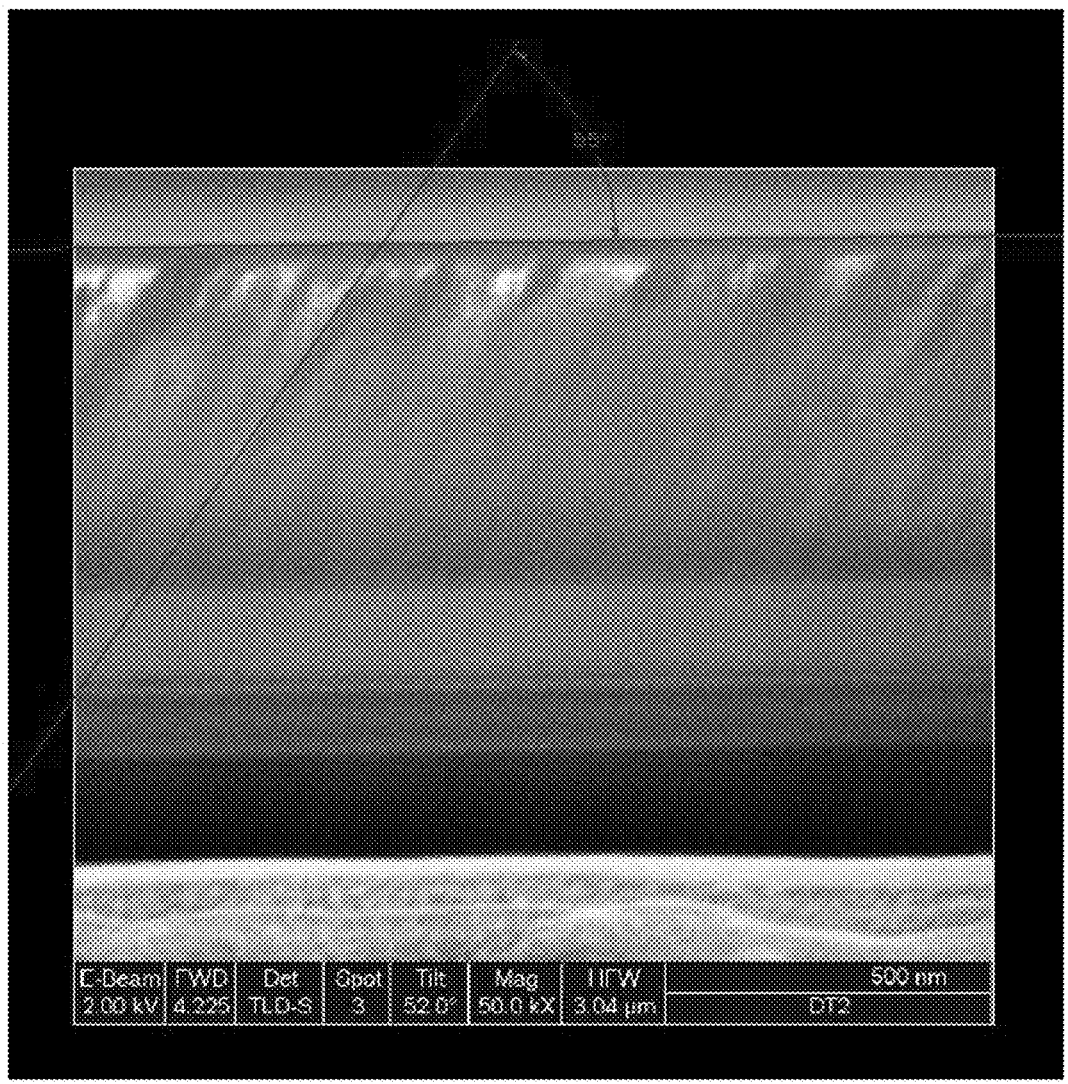

FIG. 39 is a cross-sectional view SEM photograph (50,000× magnification) of an AlN bulk layer having a c-axis tilted 35 degrees relative to normal of an underlying substrate.

Figures 40A, 40B, 41A, 41B:
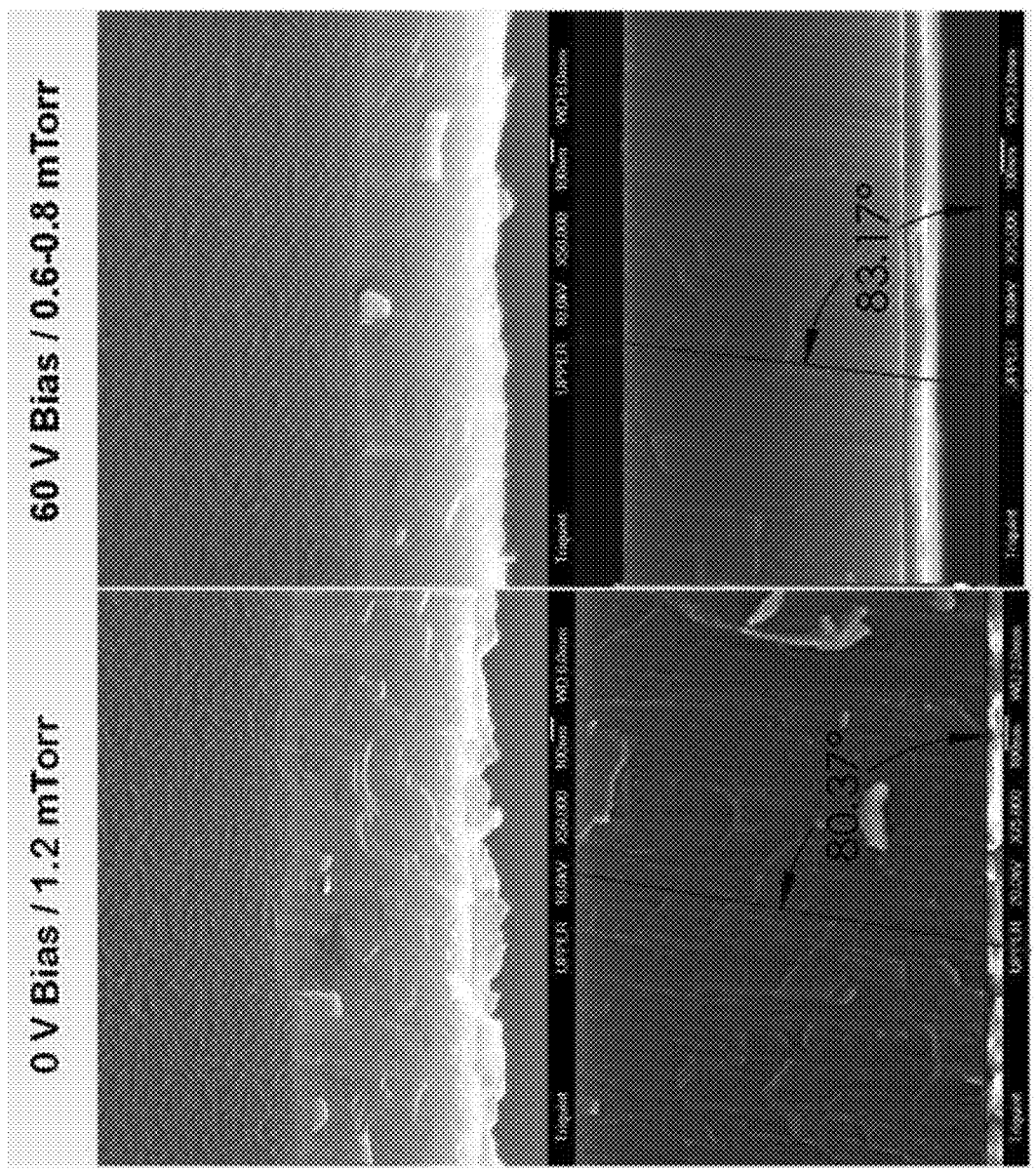

FIG. 40A is a cross-sectional SEM photograph (50,000× magnification) of a portion of an AlN bulk layer grown without the use of an AlN seed layer and without the use of collimator biasing.

FIG. 40B is a cross-sectional SEM photograph (75,000× magnification) of a portion of the same film of FIG. 40A with an AlN bulk layer grown without the use of an AlN seed layer and without the use of collimator biasing, wherein the AlN bulk layer exhibits a c-axis tilt angle of 9.63 degrees relative to normal of a substrate.

FIG. 41A is a cross-sectional SEM photograph (50,000× magnification) of a portion of an AlN bulk layer grown without the use of an AlN seed layer but with the use of collimator biasing.

FIG. 41B is a cross-sectional SEM photograph (75,000× magnification) of a portion of the same film of FIG. 41A with an AlN bulk layer grown without the use of an AlN seed layer but with use of collimator biasing, wherein the AlN bulk layer exhibits a c-axis tilt angle of 6.83 degrees relative to normal of a substrate.

DETAILED DESCRIPTION

Embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof. As used herein, the terms "proximate" and "adjacent" as applied to a specified layer or element refer to a state of being close or near to another layer or element, and encompass the possible presence of one or more intervening layers or elements without necessarily requiring the specified layer or element to be directly on or directly in contact with the other layer or element unless specified to the contrary herein.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates in various aspects to bulk acoustic wave resonator structures, methods for fabricating such resonator structures, and deposition systems suitable for producing inclined c-axis hexagonal crystal structure piezoelectric material that may be incorporated in such resonator structures. As compared to conventional resonator structures, fabrication methods, and deposition systems, various embodiments disclosed herein include or enable inclined c-axis piezoelectric films to be fabricated over large areas (e.g., large area substrates) with increased uniformity of c-axis tilt angle, preferably accompanied with c-axis tilt angles of sufficient magnitude to provide a shear coupling coefficient exceeding a longitudinal coupling coefficient.

Various factors are used separately or in combination in one or more embodiments to enable efficient growth of inclined c-axis hexagonal crystal structure piezoelectric material of uniform character over large areas. One factor includes use of a deposition system incorporating a multi-aperture collimator arranged between a target surface of a linear sputtering apparatus and a substrate table that supports one or more wafers or substrates for receiving sputter-deposited material (with the target surface being non-parallel to the substrate table, and the intermediately arranged collimator preferably being non-parallel to both), wherein the collimator and the substrate table are preferably both capable of movement (e.g., translation) during sputtering, and at least one of the substrate table or the collimator is preferably biased to an electrical potential other than ground. Another factor includes growth of a crystalline seed layer during a first step according to a first set of process conditions, followed by growth of a hexagonal crystal structure piezoelectric material bulk layer (of a defined c-axis distribution range) over the crystalline seed layer during a second step according to a second set of process conditions (e.g., at a higher pressure than used during the first growth step and/or using a target surface and collimator that are angled differently relative to a substrate or wafer in different growth steps). Such growth steps may be performed using a single sputtering apparatus in certain embodiments. In other embodiments, such growth steps may be performed with a deposition system utilizing multiple linear sputtering apparatuses, a substrate table that is translatable between different positions proximate to different linear sputtering apparatuses, and multiple collimators arranged between the substrate table and the respective linear sputtering apparatuses. For example, a crystalline seed layer may be grown by reactive sputtering at a first station using a first collimator according to a first growth step, and a hexagonal crystal structure piezoelectric material bulk layer comprising a different c-axis orientation distribution than the crystalline seed layer may be grown by reactive sputtering at a second station using a second collimator according to a second growth step, wherein both stations are located in a single enclosure in which subatmospheric conditions may be generated using at least one vacuum pumping element, and a wafer or substrate supporting the respective layers may be moved between the stations without need for removal from subatmospheric conditions. In certain embodiments, the first collimator may be omitted for growth of the crystalline seed layer. In certain embodiments, the first station is arranged within a first chamber and the second station is arranged within a second chamber, wherein at least one first vacuum pumping element is associated with the first chamber and at least one second vacuum pumping element is associated with the second chamber. In certain embodiments, different process conditions and/or different angular positions between target surfaces, collimators, and a wafer or support surface may be used in the first and second growth steps. For example, a first growth step may be configured to yield at least 50% (or at least 75%, or at least 90%, or at least 95%) of the crystalline seed layer including a c-axis having an orientation distribution predominantly in a range of from 0 degrees to 35 degrees relative to normal of a face of the substrate or wafer, and a second growth step may be configured to yield at least 50% (or at least 75%, or at least 90%, or at least 95%) of the hexagonal crystal structure piezoelectric material bulk layer including a c-axis having an orientation distribution predominantly in a range of from 25 degrees to 50 degrees (or in a subrange of from 30 degrees to 40 degrees) relative to normal of a face of the substrate or wafer. In certain embodiments, sputtering pressure during deposition of a hexagonal crystal structure piezoelectric material bulk layer such as AlN may be in a range of from 0.7 to 3 mTorr (mT) to obtain adequate AlN c-axis (002) orientation.

In one aspect of the present disclosure, a deposition system suitable for growing tilted c-axis hexagonal crystal structure piezoelectric material includes a linear sputtering apparatus, a multi-aperture collimator, and a translatable substrate table having a support surface arranged non-parallel to a target surface of the sputtering apparatus, with the substrate table and/or the collimator being electrically biased to a potential other than ground. The linear sputtering apparatus, which may include a linear magnetron or a linear ion beam sputtering apparatus, includes a target surface configured to eject metal (e.g., aluminum or zinc) atoms, with the target surface being non-parallel to (e.g., oriented 15 to 55 degrees apart from) the support surface. Preferably, the collimator is also arranged non-parallel to the support surface. In certain embodiments, a target surface is arranged at a first nonzero angle relative to a support surface, and a collimator is arranged at a second nonzero angle relative to the support surface, wherein the first nonzero angle is greater than the second nonzero angle. Metal atoms ejected from the target surface react with a gas species contained in a gas-containing environment to form piezoelectric material. For example, aluminum atoms ejected from an aluminum or aluminum-containing target surface may react with nitrogen gas species to form aluminum nitride, or zinc atoms ejected from a zinc or zinc-containing target surface may react with oxygen gas species to form zinc oxide.

In certain embodiments, a support surface of a substrate table is configured to receive at least one wafer (e.g., one, two, three, four, or more wafers, preferably having a diameter in a range of at least about 50 mm, about 100 mm, or about 150 mm) and is coupled to a movable element (e.g., a translation element) configured to move the substrate table during operation of the linear sputtering apparatus, wherein such movement may promote uniform material deposition over large areas (e.g., by preventing localized material deposition regions of different thicknesses). An exemplary collimator includes multiple guide members arranged non-parallel to the support surface, such as a plurality of longitudinal members and a plurality of transverse members that form a grid defining multiple collimator apertures. Electrical biasing of the substrate table and/or the collimator to a potential other than ground enhances control of material deposition during operating of the sputtering apparatus. Collimator biasing has also been found to influence microstructure development of tilted c-axis piezoelectric bulk material in a bulk acoustic wave resonator device. In certain embodiments, the substrate table and the collimator are independently biased to electrical potentials other than ground. In certain embodiments, different guide members of a collimator may be electrically biased differently relative to one another. For example, in certain embodiments, a plurality of guide members includes a plurality of longitudinal members biased to a first electrical potential other than ground and comprises a plurality of transverse members biased to a second electrical potential other than ground, with the second electrical potential differing from the first electrical potential. In certain embodiments, the collimator is configured to translate during operation of the linear sputtering apparatus, such as to prevent formation of a "shadow" pattern that would otherwise be formed on a surface receiving deposited piezoelectric material following transit of metal atoms through the collimator. In certain embodiments, a deposition aperture (optionally augmented with a uniformity shield configured to adjust dimensions of the deposition aperture) is arranged between the collimator and the substrate table.

In certain embodiments, a deposition system disclosed herein is configured for growth of a hexagonal crystal structure piezoelectric material bulk layer over a crystalline seed layer (optionally being compositionally matched with the bulk layer) that overlies a wafer received by the support surface, wherein at least 50% (or at least 75%, or at least 90%, or at least 95%) of the hexagonal crystal structure piezoelectric material bulk layer comprises a c-axis having an orientation distribution predominantly in a range of from 25 degrees to 50 degrees (or in a subrange of from 30 degrees to 40 degrees) relative to normal of a face of a substrate or wafer received by the support surface. Such c-axis orientation distribution is preferably substantially uniform over the area of a large area substrate (e.g., having a diameter in a range of at least about 50 mm, about 100 mm, or about 150 mm), thereby enabling multiple chips having the same or similar acoustic wave propagation characteristics to be derived from a single substrate. In certain embodiments, at least 50% (or at least 75%, or at least 90%, or at least 95%) of the crystalline seed layer includes a c-axis having an orientation distribution predominantly in a range of from 0 degrees to 35 degrees relative to normal of a face of a substrate or wafer received by the support surface.

In certain embodiments, the deposition system includes at least one wafer received by the support surface, wherein the at least one wafer comprises a substrate, an acoustic reflector structure arranged over the substrate, and an electrode structure arranged over at least a portion of the acoustic reflector structure—such as may be useful to produce at least one solidly mounted bulk acoustic wave resonator device. In certain embodiments, the deposition system includes at least one wafer received by the support surface, wherein the at least one wafer comprises a substrate defining a recess, a support layer is arranged over the recess, and an electrode structure is arranged over the support layer—such as may be useful to produce at least one film bulk acoustic wave resonator device.

In one aspect, the disclosure relates to a method for fabricating at least one acoustic resonator structure, wherein a first growth step includes deposition of a crystalline seed layer over at least one resonator device complex, and a second growth step includes deposition of a hexagonal crystal structure piezoelectric material bulk layer over the crystalline seed layer (optionally, wherein the hexagonal crystal structure piezoelectric material bulk layer is compositionally matched to the crystalline seed layer). Each resonator device complex includes a substrate and at least one first electrode structure arranged over at least a portion of the substrate. The second growth step includes deposition of a hexagonal crystal structure piezoelectric material bulk layer over the crystalline seed layer that is arranged over the at least one resonator device complex, and is configured to yield at least 50% (or at least 75%, or at least 90%, or at least 95%) of the hexagonal crystal structure piezoelectric material bulk layer including a c-axis having an orientation distribution predominantly in a range of from 25 degrees to 50 degrees (or in a subrange of from 30 degrees to 40 degrees) relative to normal of a face of the substrate. At least one of the first growth step or the second growth step includes ejection of metal atoms from a target surface of a linear sputtering apparatus to (i) transit through a collimator including multiple collimator apertures and through a deposition aperture, and (ii) react with a gas species and be received by the at least one resonator device complex, wherein the target surface is arranged non-parallel to (e.g., in a range of 15 to 55 degrees apart from) a face of the substrate. In certain embodiments, the first growth step is configured to yield at least 50% (or at least 75%, or at least 90%, or at least 95%) of the crystalline seed layer comprising a c-axis having an orientation distribution predominantly in a range of from 0 degrees to 35 degrees relative to normal of a face of the substrate. In certain embodiments, a first growth step is performed at a higher deposition pressure (e.g., in a range of from about 5 mT to about 50 mT) than the second growth step. In certain embodiments, a substrate table and/or collimator is configured to translate during operation of the linear sputtering apparatus, to promote uniform material deposition. In certain embodiments, at least one second electrode structure is formed over at least one portion of the hexagonal crystal structure piezoelectric material bulk layer, such as may be useful to form at least one bulk acoustic wave resonator device. An active region of bulk acoustic wave resonator device is provided in an area in which the hexagonal crystal structure piezoelectric material bulk layer is arranged between a first electrode structure and a second electrode structure. Such growth steps may be performed using a single sputtering apparatus in certain embodiments. In other embodiments, such growth steps may be performed with a deposition system utilizing multiple linear sputtering apparatuses, a substrate table that is translatable between different positions proximate to different linear sputtering apparatuses, and multiple collimators arranged between the substrate table and the respective linear sputtering apparatuses. In certain embodiments, at least one resonator device complex, over which the hexagonal crystal structure piezoelectric material bulk layer and the crystalline seed layer are deposited, is diced into a plurality of chips, such as solidly mounted bulk acoustic wave resonator chips or film bulk acoustic wave resonator chips.

Although various embodiments disclosed herein are directed to use of linear sputtering apparatuses, in alternative embodiments, one or more rotating sputtering apparatuses such as rotating magnetrons may be substituted.

In one aspect of the present disclosure, an acoustic resonator structure include a substrate supporting at least one first electrode, a crystalline seed layer arranged over the at least one first electrode, a hexagonal crystal structure piezoelectric material bulk layer (optionally compositionally matched with the crystalline seed layer) arranged over the crystalline seed layer, and at least one second electrode structure arranged over at least a portion of the hexagonal crystal structure piezoelectric material bulk layer, wherein at least 50% (or at least 75%, or at least 90%, or at least 95%) of the hexagonal crystal structure piezoelectric material bulk layer comprises a c-axis having an orientation distribution predominantly in a range of from 25 degrees to 50 degrees (or in a subrange of from 30 to 40 degrees) relative to normal of a face of the substrate. In certain embodiments, a thickness of the crystalline seed layer is no greater than about 20%, no greater than about 15%, or no greater than about 10% of a combined thickness of the hexagonal crystal structure piezoelectric material bulk layer and the crystalline seed layer. In certain embodiments, the crystalline seed layer may comprise a thickness in a range of from about 500 to about 2,000 Angstroms and/or the hexagonal crystal structure piezoelectric material bulk layer may comprise a thickness in a range of from about 4,000 to about 26,000 Angstroms. In certain embodiments, at least 50% (or at least 75%, or at least 90%, or at least 95%) of the crystalline seed layer comprises a c-axis having an orientation distribution predominantly in a range of from 0 degrees to 35 degrees relative to normal of a face of the substrate. In certain embodiments, an acoustic reflector structure is arranged between the substrate and the at least one first electrode structure to provide a solidly mounted bulk acoustic resonator device. Optionally, a backside of the substrate may include a roughened surface configured to reduce or eliminate backside acoustic reflection. In other embodiments, the substrate defines a recess, a support layer is arranged over the recess, and the support layer is arranged between the substrate and at least a portion of the at least one first electrode structure, to provide a film bulk acoustic wave resonator structure. In certain embodiments, less than about 3 percent of the c-axis orientation distribution of the hexagonal crystal structure piezoelectric material bulk layer is in a range of from 0 degrees to 15 degrees relative to normal of a face of the substrate. In certain embodiments, the substrate comprises a diameter of at least about 50 mm (or at least about 100 mm, or at least about 150 mm) and the hexagonal crystal structure piezoelectric material bulk layer covers at least about 50% (or at least about 75%, or at least about 90%, or at least about 95%) of a face of the substrate. In certain embodiments, multiple bulk acoustic wave resonator devices each including an active region between a first electrode structure and a second electrode structure are provided on a single substrate. Multiple bulk acoustic resonator chips may be derived from such a substrate (e.g., by dicing), and may be incorporated in one or more sensors and/or fluidic devices.

In one aspect of the present disclosure, a deposition system includes first and second linear sputtering apparatuses (e.g., linear magnetron or linear ion beam sputtering apparatuses) and a translation element configured to translate a substrate table that is configured to receive at least one wafer between a first position proximate to the first linear sputtering apparatus and a second position proximate to the second linear sputtering apparatus. Such a system may be used, for example, to perform a second growth step in a sequential manner in a subatmospheric environment following performance of a first growth step without a need to remove a wafer or substrate into an atmospheric pressure environment before the second growth step (e.g., which would otherwise require significant time and energy to establish subatmospheric conditions in the second chamber). The first linear sputtering apparatus includes a first target surface, and the second linear sputtering apparatus including a second target surface, wherein each target surface is configured to eject metal atoms. A first collimator (if provided) includes a first plurality of guide members that define a first plurality of collimator apertures arranged between the first linear sputtering apparatus and the substrate table when the support surface is proximate to the first linear sputtering apparatus, and a second collimator includes a second plurality of guide members that defines a second plurality of collimator apertures arranged between the second linear sputtering apparatus and the substrate table when the support surface is proximate to the second linear sputtering apparatus. In certain embodiments, the first collimator may be omitted. In certain embodiments, the first and/or the second collimator includes a plurality of longitudinal members and a plurality of transverse members that form a grid. At least one (or both) of the first target surface or the second target surface is arranged non-parallel to a support surface of the substrate table. In certain embodiments, a load lock chamber is provided, wherein a translation element is configured to translate the substrate table and the at least one wafer from the load lock chamber to a first position (e.g., at a first station) proximate to the first linear sputtering apparatus, and is further configured to translate the substrate table and the at least one wafer to a second position (e.g., at a second station) proximate to the second linear sputtering apparatus. In certain embodiments, an enclosure contains the first station (e.g., including the first linear sputtering apparatus, a first (optional) collimator, and a first deposition aperture) and contains the second station (e.g., including the first linear sputtering apparatus, a first (optional) collimator, and a first deposition aperture), wherein at least one vacuum pumping element is configured to generate at least one subatmospheric pressure condition within the enclosure In certain embodiments, the first station may be contained in a first chamber, and the second station may be contained in a second chamber. For example, in certain embodiments, first and second vacuum pumping elements are configured to generate first and second subatmospheric pressure conditions, respectively, in a first chamber containing the first linear sputtering apparatus and in a second chamber containing the second linear sputtering apparatus, wherein both chambers may be located in an enclosure. In certain embodiments, first and second deposition apertures, each including an associated uniformity shield configured to permit adjustment of dimensions of the deposition aperture, are positioned between respective collimators and the substrate table.

In certain embodiments, the first linear sputtering apparatus, optionally in combination with a first collimator, is configured for growth of a crystalline seed layer over the at least one wafer, the crystalline seed layer comprising a c-axis having an orientation distribution predominantly in a range of from 0 degrees to 35 degrees relative to normal of a face of the at least one wafer. It is to be recognized that a crystalline seed layer having a c-axis orientation distribution of 0 degrees may be attained without a first collimator, and that even (non-zero) shallow angle c-axis orientation distributions may be attained without a first collimator (e.g., if a first target surface is sufficiently angled relative to a surface of the at least one wafer); however, more uniform and/or more steeply angled (non-zero) c-axis orientation distributions may be promoted with use of a first collimator as disclosed herein. Additionally, the second linear sputtering apparatus and the second collimator are configured for growth of a hexagonal crystal structure piezoelectric material bulk layer over the crystalline seed layer, the hexagonal crystal structure piezoelectric material bulk layer comprising a c-axis having an orientation distribution predominantly in a range of from 30 degrees to 50 degrees (or in a subrange of from 30 degrees to 40 degrees) relative to normal of a face of the at least one wafer. In certain embodiments, the support surface is configured to receive at least one wafer having a diameter of at least about 50 mm (or at least about 100 mm, or at least about 150 mm), wherein the first linear sputtering apparatus, optionally in combination with a first collimator, is configured for growth of the crystalline seed layer covering at least about 50% (or at least about 75%, or at least about 90%, or at least about 95%) of a face of the at least one wafer, and the second linear sputtering apparatus and the second collimator are configured for growth of the hexagonal crystal structure piezoelectric material bulk layer covering at least about 50% (or at least about 75%, or at least about 90%, or at least about 95%) of a face of the at least one wafer. Preferably, each linear sputtering apparatus is configured to receive a supply of sputtering gas including a gas species adapted to react with metal atoms ejected from a target surface, and in certain embodiments each target surface may comprise aluminum (e.g., to eject aluminum atoms that may react with nitrogen species to form AlN) or zinc (e.g., to eject zinc atoms that may react with oxygen species to form ZnO).

In another aspect of the present disclosure, a method for fabricating at least one resonator structure includes use of a first station containing a first linear sputtering apparatus including a first target surface, and use of a second station containing a second linear sputtering apparatus including a second target surface. At least one wafer structure supported by a substrate table is moved to the first station in which a first subatmospheric pressure condition is generated, a first growth step is performed to deposit a crystalline seed layer over the at least one wafer structure, the at least one wafer structure supported by the substrate table is moved to the second station in which a second subatmospheric pressure is generated, and a second growth step is performed to deposit a hexagonal crystal structure piezoelectric material bulk layer over the crystalline seed layer, wherein the hexagonal crystal structure piezoelectric material bulk layer includes a c-axis orientation distribution that differs from a c-axis orientation distribution of the crystalline seed layer. The first growth step includes ejection of metal atoms from the first target surface to (i) transit through a first deposition aperture (optionally preceded by transit through a first collimator including multiple first collimator apertures), and (ii) react with a gas species and be received by the at least one wafer structure, to deposit the crystalline seed layer. The second growth step includes ejection of metal atoms from the second target surface to (i) transit through a second collimator including multiple second collimator apertures and through a second deposition aperture, and (ii) react with a gas species and be received by the at least one wafer structure, to deposit the hexagonal crystal structure piezoelectric material bulk layer. In certain embodiments, the first growth step is configured to yield at least 50% (or at least about 75%, or at least about 90%, or at least about 95%) of the crystalline seed layer having an orientation distribution predominantly in a range of from 0 degrees to 35 degrees relative to normal of a face of the at least one wafer structure; and the second growth step is configured to yield at least 50% (or at least about 75%, or at least about 90%, or at least about 95%) of the hexagonal crystal structure piezoelectric material bulk layer including a c-axis having an orientation distribution predominantly in a range of from 25 degrees to 50 degrees (or in a subrange of from 30 degrees to 40 degrees) relative to normal of a face of the at least one wafer structure. In certain embodiments, the substrate table supporting the at least one wafer structure is loaded into a load lock chamber, and an initial subatmospheric condition is generated in the load lock chamber, prior to the moving of the at least one wafer structure supported by the substrate table to the first station. In certain embodiments, the first station and the second station are arranged within a single enclosure in which the first subatmospheric pressure condition and the second subatmospheric pressure condition are generated. In other embodiments, the first station is arranged within a first chamber having an associated first vacuum pumping element, and the second station is arranged within a second chamber having an associated second vacuum pumping element.

In certain embodiments, a pressure of the first subatmospheric pressure condition is greater than a pressure of the second subatmospheric pressure condition. In certain embodiments, the first growth step is performed at a deposition pressure in a range of from about 5 mT to about 50 mT. In certain embodiments, the first growth step optionally includes translating the first collimator during deposition of the crystalline seed layer over the at least one wafer structure, and the second growth step includes translating the second collimator during deposition of the hexagonal crystal structure piezoelectric material bulk layer over the crystalline seed layer. In certain embodiments, both a collimator and the substrate table are translated during material deposition to promote uniform deposition. A direction of translation of the collimator may be substantially perpendicular to a direction of translation of the substrate table; for example, a collimator may be moved in a vertical direction while the substrate table is moved in a horizontal direction. In certain embodiments, each wafer structure of the at least one wafer structure includes a diameter of at least about 50 mm (or at least about 100 mm, or at least about 150 mm), and one or more of the crystalline seed layer or the hexagonal crystal structure piezoelectric material bulk layer covers at least about 50% (or at least about 75%, or at least about 90%, or at least about 95%) of a face of the at least one wafer structure. In certain embodiments, the at least one wafer structure (over which the hexagonal crystal structure piezoelectric material bulk layer and the crystalline seed layer are deposited) is diced into a plurality of chips, wherein each chip may include a solidly mounted bulk acoustic wave resonator chip or a film bulk acoustic wave resonator chip.

In certain embodiments, linear sputtering apparatuses utilized herein may include linear magnetron-type sputtering apparatuses or linear ion beam sputtering apparatuses. Ion beam deposition allows variable control of primary (sputtering) and secondary (bombarding) ion beams, as well as the potential for substrate manipulation, which may be beneficial to promote growth of hexagonal crystal structure piezoelectric material at higher c-axis tilt angles.

In certain embodiments, a hexagonal crystal structure piezoelectric material bulk layer, which is deposited over a crystalline seed layer, comprises a c-axis having an orientation distribution predominantly in a range of from 12 degrees to 52 degrees, or in a range of from 27 degrees to 37 degrees, or in a range of from 75 degrees to 90 degrees, relative to normal of a face of a substrate or wafer supporting the crystalline seed layer and hexagonal crystal structure piezoelectric material bulk layer. In certain embodiments, the hexagonal crystal structure piezoelectric material bulk layer includes a thickness in a range of from about 4,000 Angstroms to about 26,000 Angstroms. Such hexagonal crystal structure piezoelectric material bulk layer preferably includes substantially uniform thickness, nanostructure, and crystallinity properties, with controlled stress and densely packed columnar grains or recrystallized grain structure. In certain embodiments, a crystalline seed layer includes a thickness in a range of from 500 Angstroms to 2,000 Angstroms, and (for a hexagonal crystal structure piezoelectric material such as AlN) may include a dominant (103) texture.

Various aspects and features of the disclosure will be described with reference to the drawings, in which illustrated elements are not to scale unless specifically indicated to the contrary.

FIG. 6 is a schematic cross-sectional view of a portion of a bulk acoustic wave solidly mounted resonator device 50 including a piezoelectric material bulk layer 64 embodying an inclined c-axis hexagonal crystal structure piezoelectric material (e.g., AlN or ZnO) as disclosed herein. If the piezoelectric material bulk layer 64 comprises AlN, then the (002) direction (or c-axis) is tilted away from a direction normal to a substrate 52, as illustrated by two arrows superimposed over the piezoelectric material bulk layer 64. The resonator device 50 includes the substrate 52 (e.g., typically silicon or another semiconductor material), an acoustic reflector 54 arranged over the substrate 52, the piezoelectric material bulk layer 64, and bottom and top side electrodes 60, 68. The bottom side electrode 60 is arranged between the acoustic reflector 54 and the piezoelectric material bulk layer 64, and the top side electrode 68 is arranged along a portion of an upper surface 66 of the piezoelectric material bulk layer 64. An area in which the piezoelectric material bulk layer 64 is arranged between overlapping portions of the top side electrode 68 and the bottom side electrode 60 is considered the active region 70 of the resonator device 50. The acoustic reflector 54 serves to reflect acoustic waves and therefore reduce or avoid their dissipation in the substrate 52. In certain embodiments, the acoustic reflector 54 includes alternating thin layers 56, 58 of materials of different acoustic impedances (e.g., SiOC, $Si_3N_4$, $SiO_2$, AlN, and Mo), optionally embodied in a Bragg mirror, deposited over the substrate 52. In certain embodiments, other types of acoustic reflectors may be used. Steps for forming the resonator device 50 may include depositing the acoustic reflector 54 over the substrate 52, followed by deposition of the bottom side electrode 60, followed by growth (e.g., via sputtering or other appropriate methods) of the piezoelectric material bulk layer 64, followed by deposition of the top side electrode 68.

FIG. 7 is schematic cross-sectional view of a portion of another bulk acoustic wave solidly mounted resonator device 50A including a piezoelectric material bulk layer 64 embodying an inclined c-axis hexagonal crystal piezoelectric material (e.g., AlN or ZnO) arranged over a crystalline seed layer 62. In certain embodiments, the inclined c-axis hexagonal crystal piezoelectric material of the piezoelectric material bulk layer 64 is compositionally matched to the crystalline seed layer 62. For example, the crystalline seed layer 62 may also embody AlN or ZnO. The resonator device 50A includes a substrate 52, an acoustic reflector 54 arranged over the substrate 52, a piezoelectric material bulk layer 64, and bottom and top side electrodes 60, 68, with the top side electrode 68 being arranged along a portion of an upper surface 66 of the piezoelectric material bulk layer 64. A portion of the piezoelectric material bulk layer 64 arranged between the top side electrode 68 and the bottom side electrode 60 embodies an active region 70 of the bulk acoustic wave solidly mounted resonator device 50A. Steps for forming the resonator device 50A may include depositing the acoustic reflector 54 over the substrate 52, followed by deposition of the bottom side electrode 60, followed by growth (e.g., via sputtering or other appropriate methods) of the crystalline seed layer 62, growth of the piezoelectric material bulk layer 64, and by deposition of the top side electrode 68.

FIG. 8 is a schematic cross-sectional view of a film bulk acoustic wave resonator (FBAR) device 72 according to one embodiment. The FBAR device 72 includes a substrate 74 (e.g., silicon or another semiconductor material) defining a cavity 76 that is covered by a support layer 78 (e.g., silicon dioxide). A bottom side electrode 80 is arranged over a portion of the support layer 78, with the bottom side electrode 80 and the support layer 78 being overlaid with a crystalline seed layer 82. A piezoelectric material bulk layer 84 embodying inclined c-axis hexagonal crystal structure piezoelectric material (e.g., AlN or ZnO) is arranged over the crystalline seed layer 82, and a top side electrode 88 is arranged over at least a portion of a top surface 86 of the piezoelectric material bulk layer 84. A portion of the piezoelectric material bulk layer 84 arranged between the top side electrode 88 and the bottom side electrode 80 embodies an active region 90 of the FBAR device 72. The active region 90 is arranged over and registered with the cavity 76 disposed below the support layer 78. The cavity 76 serves to confine acoustic waves induced in the active region 90 by preventing dissipation of acoustic energy into the substrate 74, since acoustic waves do not efficiently propagate across the cavity 76. In this respect, the cavity 76 provides an alternative to the acoustic reflector 54 illustrated in FIGS. 6 and 7. Although the cavity 76 shown in FIG. 8 is bounded from below by a thinned portion of the substrate 74, in alternative embodiments at least a portion of the cavity 76 extends through an entire thickness of the substrate 74. Steps for forming the FBAR device 72 may include defining the cavity 76 in the substrate 74, filling the cavity 76 with a sacrificial material (not shown) optionally followed by planarization of the sacrificial material, depositing the support layer 78 over the substrate 74 and the sacrificial material, removing the sacrificial material (e.g., by flowing an etchant through vertical openings defined in the substrate 74 or the support layer 78, or lateral edges of the substrate 74), depositing the bottom side electrode 80 over the support layer 78, growing (e.g., via sputtering or other appropriate methods) the crystalline seed layer 82 and the piezoelectric material bulk layer 84, and depositing the top side electrode 88.

FIG. 9 is an upper exterior perspective view of a reactor 100 of a deposition system for growing a hexagonal crystal structure piezoelectric material with an inclined c-axis, the system including a linear sputtering apparatus, a movable substrate table for supporting multiple substrates, and a collimator, according to one embodiment of the present disclosure. The reactor 100 includes a first tubular portion 102 extending in a generally vertical direction between a base 104 and an upper flange 106. Extending upward from the upper flange 106 is a collimator drive adapter flange 118 and a cylindrical high voltage shield 116, each including a central axis that is laterally offset from a central axis of the upper flange 106. A recirculating ball screw drive mechanism 114 and a collimator drive rotational seal 112 arranged to mate with a drive motor (not shown) further extend upward from the cylindrical high voltage shield 116. The purpose of the recirculating ball screw drive mechanism 114 and the collimator drive rotational seal 112 are to facilitate movement (e.g., translation) of a collimator assembly within the first tubular portion 102, as described in further detail herein.

A medial section of the first tubular portion 102 is partially bisected by a second tubular portion 120 extending in a generally horizontal direction between a substrate translation flange 124 and a load lock attachment flange 134, with the second tubular portion 120 including lower and upper substrate table translation rails. The substrate translation flange 124 generally surrounds a first chamber adapter 122, which has a generally disc-like shape, includes a first aperture 126 supporting a first end of a drive screw, and defines a rectangular aperture 130 generally aligned with a substrate table (not shown). Fasteners 128 are provided to attach drive screw supports (not shown) along an inner surface of the first chamber adapter 122. A third tubular portion 108 extends in a generally horizontal direction perpendicular to the second tubular portion 120 and includes a flange 110 arranged to couple to a vacuum pump (not shown) to generate a subatmospheric condition within the reactor 100. A sputtering gas inlet port 125 is further arranged in fluid communication with the second tubular portion 120 to admit a sputtering gas into the reactor 100.

FIG. 10 is a downwardly-facing cross-sectional view of the reactor 100 of FIG. 9, showing the first, second, and third tubular portions 102, 120, 108 as well as the substrate translation flange 124 and load lock attachment flange 134. A collimator assembly ("collimator") 170 and a linear sputtering apparatus 154 (e.g., a pulsed direct current linear magnetron cathode assembly) are provided within the first tubular portion 102 proximate to a deposition aperture 150 that is bounded along one edge by a uniformity shield 152. The linear sputtering apparatus 154 includes a target 166 including a surface configured to eject metal atoms, as well as a cathode body structure 156 with perimeter magnets 238 and liquid cooling channels 158, arranged between channel guides 222 extending in a vertical direction and arranged to receive collimator support bearing assemblies (not shown) coupled to collimator side brackets 162. In certain embodiments, the target 166 includes dimensions of about 5 inches by 16 inches. A collimator ground strap 168 is further arranged between the collimator assembly 170 and the linear sputtering apparatus 154. A translation section 115 enabling movement of a substrate table 148 is arranged within the second tubular portion 120. A lower surface of the second tubular portion 120 supports a lower substrate table translation rail 142 defining a recess 144 for guiding lateral translation of movable trucks (not shown) that support the substrate table 148, with movement of the substrate table 148 during operation of the linear sputtering apparatus 154 beneficially promoting uniform deposition of sputtered material on one or more substrates (not shown) supported by the substrate table 148. As shown in FIG. 10, the target 166 is arranged at a first angle non-parallel to the substrate table 148, and the collimator assembly 170 is arranged between the target 166 and the substrate table 148 at a second angle non-parallel to the substrate table 148, wherein the second angle is smaller than the first angle. During operation of the reactor 100, subatmospheric conditions are established with a vacuum pump (not shown) coupled to the third tubular portion 108, and a sputtering gas is supplied to the reactor 100 through the sputtering gas inlet port 125 while metal atoms are ejected from a surface of the target 166 to transit through the collimator assembly 170 toward one or more substrates supported by the substrate table 148. Reaction between the metal atoms (e.g., aluminum or zinc) and the sputtering gas (e.g., containing nitrogen or oxygen) yields molecules of piezoelectric material (e.g., AlN or ZnO) that are deposited on or over one or more substrates (not shown).

FIG. 11 is a downwardly-facing cross-sectional view of a portion of the reactor of FIGS. 9 and 10, showing a substrate 214 arranged proximate to the deposition aperture 150 (bounded in part by a shield panel 180 and the uniformity shield 152), with the collimator assembly 170 intermediately arranged between the substrate 214 and the linear sputtering apparatus 154. In certain embodiments, the deposition aperture 150 includes a width ranging from about 3 inches to about 9 inches, with the uniformity shield 152 extending into the deposition aperture 150 including a maximum width of about 2 inches. The collimator assembly 170 includes multiple horizontal guide members 172 and vertical guide members 174 that in combination form a grid defining multiple apertures that permit passage of metal atoms ejected by a surface of the target 166. The collimator assembly 170 is further bounded laterally by tubular supports 176. An ejection surface of the target 166 is arranged along a front surface of the linear sputtering apparatus 154, which includes liquid ports 164 configured to circulate liquid, and channel guides 222 arranged to receive bearings 160 and to support collimator side brackets 162 that permit the collimator assembly 170 to move (e.g., translate) in a vertical direction.

FIG. 12 is an upper perspective view of the translation section of the reactor of FIGS. 9 and 10, showing the collimator assembly 170 arranged between the linear sputtering apparatus 154 and the deposition aperture 150. The cathode body structure 156 includes a hollow interior containing liquid cooling channels 158, with an ejection surface of the target 166 arranged along a front of the cathode body structure 156 between the channel guides 222 that enable collimator side brackets 162 supporting the collimator assembly 170 to translate in a vertical direction. A collimator ground strap 168 extends between the linear sputtering apparatus 154 and the collimator assembly 170 along lower portions thereof intermediately arranged between tubular supports 176 bounding lateral edges of the collimator assembly 170. The deposition aperture 150 is bounded from above by an upper substrate table translation rail 178, and laterally by shield panels 180, 182 as well as a uniformity shield 152 (optionally including multiple finger portions of different lengths) that extends laterally from one shield panel 182, which may be repositioned by sliding laterally within a secondary slot (not shown) defined in a lower substrate table translation rail 142 (which also defines a recess 144 for guiding lateral translation of movable trucks (not shown) supporting the substrate table. Additional shield panels 184, 186 are arranged between the shield panel 182 supporting the uniformity shield 152 and a second chamber adapter 132. The second chamber adapter 132 has a generally disc-like shape surrounded by the load lock attachment flange 134, includes a first aperture 136 supporting a second end of a drive screw suitable for translating a substrate table (not shown), and defines a rectangular aperture 140 generally aligned with the substrate table. The second chamber adapter 132 further includes fasteners 138 for attachment of drive screw supports (not shown) along an inner surface of the second chamber adapter 132. The first chamber adapter 122, which is bounded by the substrate translation flange 124 and includes fasteners 128, is arranged at a first end of the lower and upper substrate table translation rails 142, 178 opposing the second end where the second chamber adapter 132 is located.

FIG. 13 is an upper perspective view of a portion of the reactor of FIGS. 9 and 10, showing the collimator assembly 170 intermediately arranged between the target 166 of the linear sputtering apparatus 154 and the deposition aperture 150 bounded in part by the uniformity shield 152, and showing the substrate table 148 supported by movable trucks 200A, 200B. Each movable truck 200A, 200B includes a body structure 202A, 202B and lower wheels 204A, 204B that are received by a recess 144 defined in the lower substrate table translation rail 142. Each movable truck 200A, 200B further includes upper wheels (not shown) that are received by a similar recess defined in the upper substrate table translation rail (not shown). The cathode body structure 156 includes a hollow interior containing liquid cooling channels 158, with the target 166 arranged along a front of the cathode body structure 156 between the channel guides 222 that enable collimator side brackets 162 supporting the collimator assembly 170 to translate in a vertical direction. In certain embodiments, a minimum distance between the target 166 and the deposition aperture 150 is about 2 inches.

FIG. 14A is a side elevation view of a portion of the reactor of FIGS. 9 and 10, showing a portion of a translation section arranged within the second tubular portion 120 (shown in FIG. 10), with the movable substrate table 148 supporting two substrates 214A, 214B (in dashed lines) in a first position. The deposition aperture 150 is bounded in part by the shield panel 180 and the uniformity shield 152. A rotary driver (such as a motor) 220 is arranged to rotate a drive screw (not shown) coupled to a follower (not shown) to translate the substrate table 148 in a horizontal direction. FIG. 14B is a side elevation view of the reactor portion shown in FIG. 14A, with the substrate table 148 in a different position following translation motivated by the rotary driver 220. FIG. 14B shows a tubular guard 188 that contains a drive screw (not shown) coupled to the rotary driver 220, with the tubular guard 188 defining a lateral slot 218 permitting movement of a follower (not shown) coupled to the drive screw.

FIG. 15A is a side elevation view of the substrate table 148 shown in FIGS. 13-14B, with the substrate table 148 including a support surface 212 supporting two round substrates 214A, 214B, and including fasteners 216 for mounting the substrates 214A, 214B to the support surface 212. FIG. 15B is a side elevation view of the substrate table 148 of FIGS. 14A-15A, with the support surface 212 supporting four round substrates 214A-214D and including corresponding fasteners 216. Although two or four round substrates are shown in FIGS. 15A and 15B, it is to be appreciated that any suitable number of substrates of any desired shapes may be supported by a single substrate table. In certain embodiments, each substrate includes a diameter of at least about 50 mm, at least about 100 mm, or at least about 150 mm.

FIG. 16 is a rear perspective view of the translation section 115 for use within the reactor of FIGS. 9 and 10, including lower and upper substrate table translation rails 142, 178 as well as a tubular guard 188 extending between drive screw supports 194, 196. A shield panel 180 extends vertically between the lower and upper substrate table translation rails 142, 178 and laterally between the deposition aperture 150 and an end of the translation section 115. The tubular guard 188 contains a drive screw terminating at a first end 127 extending through the drive screw support 194 for mating with a rotary driver (not shown), with a follower 190 coupled to the drive screw also being configured to translate a movable truck 200B adapted to support a substrate table (not shown). The movable truck 200B includes lower wheels 204B received by a recess 144 defined in the lower substrate table translation rail 142 and upper wheels 206B received by a recess 198 defined in the upper substrate table translation rail 178. As illustrated, the movable truck 200B is positioned proximate to the deposition aperture 150, and separated from a fixed contact plate 211. The movable truck 200B includes a tab portion 208 extending rearward from the body structure 202B and terminating at a leaf spring contact 210 (which may comprise beryllium copper), with the leaf spring contact 210 being configured to contact the fixed contact plate 211 when the movable truck 200B is translated toward the drive screw support 194 (as shown in FIG. 17). The fixed contact plate 211 is in electrical contact with a substrate table ground strap 215 coupled to a terminal 213 arranged in communication with an electrical bias supply element (not shown) configured to apply a biasing voltage to the substrate table (not shown) when coupled to the movable truck 200B.

FIG. 17 is a magnified rear perspective view of the translation section 115 of FIG. 16, following translation of the movable truck 200B toward one end of the translation section 115 to permit the leaf spring contact 210 (shown in FIG. 16) to contact the fixed contact plate 211 and permit a biasing voltage to be applied through the movable truck 200B to a substrate table (not shown) coupleable to the movable truck 200B. Electrical biasing of the substrate table to a nonzero voltage desirably enhances control of material deposition during sputtering. Translation of the movable truck 200B is motivated by the drive screw (contained within tubular guard 188) terminating at the first end 127, and facilitated by rolling of the lower and upper wheels 204B, 206B in recesses 144, 198 defined in the respective lower and upper substrate table translation rails 142, 178. The lower substrate table translation rail 142 defines a secondary slot 192 for receiving a shield panel (not shown) to enable repositioning of a uniformity shield (not shown) proximate to one edge of the deposition aperture 150.

FIG. 18 is a perspective assembly view of a portion of the translation section 115 of FIGS. 16 and 17, showing lower and upper substrate table translation rails 142, 178 and drive screw supports 194, 196 arranged between first and second chamber adapters 122, 132. The tubular guard 188 also extends between the drive screw supports 194, 196 and defines a lateral slot 218 permitting translation of a follower 190 that is coupled to a drive screw (not shown) within the tubular guard 188 and is coupleable to a movable truck (not shown). The drive screw terminates at a first end 127 that extends through a first aperture 126 defined in the first chamber adapter 122 for coupling to a rotary driver (not shown). Fasteners 128 are provided to attach the drive screw supports 194, 196 to inner surfaces of the first and second chamber adapters 122, 132. FIG. 18 shows the translation section 115 prior to attachment of two fixed sputter shield panels 180, 186 to the lower and upper substrate table translation rails 142, 178. Not shown are movable sputter shields that may be received by a secondary slot 192 defined in the lower substrate table translation rail 142. Inserts 191 are further coupled to the lower and upper substrate table translation rails 142, 178 proximate to the deposition aperture 150.

FIG. 19 is a perspective view of a portion of the reactor of FIGS. 9 and 10, including the collimator assembly 170 and linear sputtering apparatus 154 (which is obscured by the collimator assembly 170) that are insertable into the first tubular portion 102 shown in FIG. 9. FIG. 19 further illustrates the recirculating ball screw drive mechanism 114 and the collimator drive rotational seal 112 arranged to mate with a drive motor (not shown) that extend upward from the high voltage shield 116 arranged above the collimator drive adapter flange 118. The recirculating ball screw drive mechanism 114 is arranged to rotate a drive screw 230 that extends through the collimator drive adapter flange 118 to engage a follower (not shown) coupled to the collimator assembly 170 to promote vertical translation of the collimator assembly 170. Hollow guides 248 also extend through the collimator drive adapter flange 118 to convey liquid to and from liquid cooling channels in the cathode assembly (not shown). An electrically conductive mounting bar 250 proximate to a lower surface of the collimator drive adapter flange 118 is arranged between upper ends of channel guides 222 that define channels 224, that extend in a vertical direction, and that are arranged to receive collimator support bearing assemblies (not shown) which are coupled to collimator side brackets 162. In combination with collimator end brackets 226, the collimator side brackets 162 maintain the collimator assembly 170 in a desired orientation. The collimator assembly 170 includes multiple horizontal guide members 172 and multiple vertical guide members 174 that in combination form a grid defining multiple apertures for guiding passage of metal atoms ejected from an ejection surface of the target (not shown). Spacing between horizontal guide members 172 is maintained by tubular supports 176 that extend in a vertical direction inboard of the collimator side brackets 162. A collimator ground strap 168, which may be formed by a flexible spring steel band (e.g., made from steel tape measure material) connects the horizontal and vertical guide members 172, 174 of the collimator assembly 170 to ground, with the horizontal and vertical guide members 172, 174 being electrically isolated from the collimator side brackets 162 and collimator end brackets 226.

Grounding of the horizontal and vertical guide members 172, 174 prevents any sputtering current from flowing through bearings supporting the collimator assembly 170 within channels 224 defined in the channel guides 222, and from flowing through the drive screw 230 arranged to move the collimator assembly 170.

In certain embodiments, the collimator assembly 170 of FIG. 19 has a maximum travel distance of about 5.5 inches, and is configured to travel at a rate of about 0.2 inches per second in steps of 0.125 inch. In certain embodiments, the collimator assembly 170 is moved to a travel length of about 3.5 inches, then the travel length is increased in steps of about 0.125 inch until a travel length of 5.5 inches is attained, then the travel length is decreased in steps of 0.125 inch until a travel length of 3.5 inches is attained, and the process is repeated. Preferably, the entire ejection surface of the target is covered by horizontal and vertical guide members 172, 174 of the collimator assembly 170 at all positions of the collimator assembly 170 during travel.

FIG. 20 is a perspective assembly view of at least a portion of the collimator assembly 170 of FIG. 19, including horizontal guide members 172 and vertical guide members 174 arranged to cooperate with one another to form a grid. In certain embodiments, the horizontal guide members 172 and the vertical guide members 174 define slots to permit the respective horizontal and vertical guide members 172, 174 to load lock with one another. Spacing between horizontal guide members 172 is maintained by tubular supports 176. In certain embodiments, the horizontal guide members 172 and the vertical guide members 174 may comprise grade 2 titanium sheet metal with a thickness of about 0.063 inches, and the tubular supports 176 may also comprise grade 2 titanium. Rods 228 with threaded ends may be inserted through the tubular supports 176 to maintain positioning of the horizontal and vertical guide members 172, 174 and the tubular supports 176. In certain embodiments, spacing between horizontal guide members 172 may be about 0.75 inch, spacing between vertical guide members 174 may be about 0.688 inch to about 0.731 inch, each horizontal guide member 172 may have a front-to-rear depth of about 0.5 inch, and each vertical guide member 174 may have a front-to-rear depth of about 0.574 inch.

FIG. 21 is a simplified schematic showing electrical connections to portions of a collimator assembly 170 and to a target 166 of a reactor according to FIGS. 9 and 10 according to one embodiment, including independent electrical control of different collimator guide members 172, 174A-174F. As shown, the collimator assembly 170 is arranged in a configuration that is generally parallel to the target 166 associated with the linear sputtering apparatus 154. The collimator assembly 170 includes horizontal guide members 172 optionally coupled to a first power source 231, with the horizontal guide members 172 being physically separated from vertical guides 174A-174F (to prevent electrical interaction therewith), and the vertical guides 174A-174F being separately coupled to independent power sources 229A-229F. Use of independent power sources coupled to different collimator guides 172, 174A-174F enables enhanced control of sputter deposition when metal atoms ejected by the target 166 through the collimator assembly 170. The linear sputtering apparatus 154 arranged proximate to the target 166 is coupled to a cathode power source 232. The horizontal guide members 172 are separated from one another by tubular supports 176. The linear sputtering apparatus 154 and target 166 as well as the collimator assembly 170 are arranged between collimator side brackets 162 and generally above a collimator end bracket 226. The collimator assembly 170 is supported by the collimator side brackets 162 and is arranged to translate vertically relative to the linear sputtering apparatus 154. Liquid ports 164 arranged along a top surface of the linear sputtering apparatus 154 are configured to circulate liquid through the linear sputtering apparatus 154 to transfer heat away therefrom during sputtering operation.

FIG. 22 is a top plan view of a portion of the reactor of FIGS. 9 and 10 visible through the upper flange 106 and first tubular portion 102, showing a collimator assembly 170 arranged between a linear sputtering apparatus 154 and a deposition aperture 150 that is bounded laterally by a uniformity shield 152 and a shield panel 180. The deposition aperture 150 is also arranged below the upper substrate table translation rail 178. As shown, the collimator assembly 170 is arranged in a configuration that is generally parallel to the target 166 associated with the linear sputtering apparatus 154. The horizontal guide members 172 of the collimator assembly 170 are physically separated from vertical guides 174, with the horizontal and vertical guide members 172, 174 being arranged generally above a collimator end bracket 226 and generally arranged between collimator side brackets 162. An ejection surface of the target 166 is arranged to eject metal atoms through apertures defined by horizontal and vertical guide members 172, 174 of the collimator assembly 170 toward the deposition aperture 150 and a substrate (not shown). Liquid ports 164 are provided along a top surface of the linear sputtering apparatus 154 for cooling thereof.

FIG. 23 is a top plan view of the reactor portion of FIG. 22, with the collimator assembly 170 and the linear sputtering apparatus 154 in a second configuration, wherein the collimator assembly 170 is arranged at a first angle non-parallel to the deposition aperture 150 (and a substrate (not shown) behind the deposition aperture 150), and the linear sputtering apparatus 154 (and associated target 166) is arranged at a second angle non-parallel to the deposition aperture 150, wherein the second angle is greater than the first angle. The horizontal guide members 172 of the collimator assembly 170 are physically separated from vertical guide members 174, with the guide members 172, 174 being generally above a collimator end bracket 226 and generally arranged between collimator side brackets 162. An ejection surface of the target 166 is arranged to eject metal atoms through apertures defined by guide members 172, 174 of the collimator assembly 170 toward the deposition aperture 150 and a substrate (not shown). As shown, a leftmost collimator side bracket 162 interferes with a shield panel 180, demonstrating that modification of size or shape of the shield panel 180 or the collimator side bracket 162 (and collimator end bracket 226) may be necessary to achieve the positioning shown in FIG. 23. Other elements shown in FIG. 23 are generally the same as shown in FIG. 22.

FIG. 24 is a cross-sectional view of a portion of the reactor of FIGS. 9 and 10, showing the target 166 arranged between the linear sputtering apparatus 154 and the collimator assembly 170, with the collimator assembly 170 arranged non-parallel to an ejection surface of the target 166. Superimposed in dashed lines over the collimator assembly 170 and the collimator ground strap 168 are the drive screw 230 and the recirculating ball screw drive mechanism 114, which are configured to promote vertical translation of the collimator assembly 170. The collimator assembly 170 includes multiple horizontal guide members 172 and multiple vertical guide members 174 that in combination form a grid defining multiple apertures for guiding passage of metal atoms ejected from an ejection surface of the target 166. Spacing between horizontal guide members 172 is maintained by tubular supports 176 that extend in a vertical direction, generally inboard of the collimator side brackets 162 and above a collimator end bracket 226. Vertical movement between the collimator end bracket 226 and channels 224 defined by the channel guides 222 is provided by bearings 160. The linear sputtering apparatus 154 includes a cathode body structure 156 supporting center pole magnets 236 and perimeter magnets 238, with the cathode body structure 156 further including a hollow interior containing liquid cooling channels 158 bounded by thermally conductive (e.g., copper) inserts 240. In certain embodiments, the magnets 236, 238 may comprise NdFeB block magnets with nickel (e.g., Ni—Cu—Ni) plating. In certain embodiments, the perimeter magnets 238 in combination form a rounded rectangular (e.g., racetrack) shape, and the center pole magnets 236 form a linear shape. A thermally conductive (e.g., copper) backing plate 234 is provided between the thermally conductive inserts 240 and the target 166. Conductive elements 242 are further arranged around lateral boundaries of the cathode body structure 156 that is coincident with the perimeter of the target 166 and the thermally conductive backing plate 234.

FIG. 25 is a perspective cross-sectional view of a portion of the linear sputtering apparatus 154 shown in FIG. 24 and useable in the reactor of FIGS. 9 and 10. A cathode body structure 156 supports center pole magnets 236 (preferably arranged in a line) and perimeter magnets 238 (preferably arranged in a rounded horizontal configuration). The cathode body structure 156 further defines a cavity 244 containing liquid cooling channels 158 bounded by thermally conductive inserts 240 and bounded by the thermally conductive backing plate 234, which abuts the target 166. The target 166 preferably consists of a pure metal (e.g., 99.999% pure aluminum or zinc). Lateral edges of the cathode body structure 156 and the perimeter magnets 238 are bounded by conductive elements 242.

FIG. 26 is a perspective view of the cathode body structure 156 and magnets 236, 238 of the linear sputtering apparatus 154 shown in FIG. 25 and useable in the reactor of FIGS. 9 and 10. A peripheral portion of the cathode body structure 156 forms a rounded rectangular shape supporting the perimeter magnets 238, and an inner portion of the cathode body structure 156 forms an elevated linear wall 156A supporting the center pole magnets 236. The cathode body structure 156 forms a cavity 244. Along one end, the cathode body structure 156 defines apertures 246 to enable liquid to flow to and from liquid cooling channels 158 (shown in FIG. 25).

FIG. 27 is a perspective view of the linear sputtering apparatus 154 mounted between end caps 157 and the channel guides 222 for use with the reactor of FIGS. 9 and 10. Each end cap 157 may be formed of insulating conductive material, and preferably includes a curved surface (not shown) to abut a curved end of the cathode body structure 156 shown in FIG. 26. An electrically conductive mounting bar 250 is arranged between upper ends of channel guides 222 (which include channels 224), and defines liquid ports 164 coupled to hollow guides 248 that guide liquid conveying tubes connected to the thermally conductive backing plate 234. As shown, an ejection surface of the target 166 is exposed to permit ejection of metal atoms during sputtering operation.

FIG. 28 is a perspective view of an alternative collimator assembly 155 arranged within the first tubular portion 102 of a deposition reactor, with vertical guide members 174A-174F separated by tubular supports 176 and extending in a single direction. Electrical conductors 254A-254F are arranged in communication with individual vertical guide members 174A-174F for separate application of voltage to different vertical guide members 174A-174F for electrical biasing thereof, to enhance control of material deposition when a sputtering cathode assembly and target surface (not shown) are arranged proximate to the collimator assembly 155. As shown, the vertical guide members 174A-174F are arranged proximate to a deposition aperture bounded by shield panels 180, 182 and a uniformity shield 152, with the vertical guide members 174A-174F being angled (or inclined) relative to two substrates 214A, 214B to guide the passage of metal atoms (e.g., aluminum or zinc) that react with a gas species (e.g., nitrogen or oxygen) within the reactor to deposit crystalline seed material and/or hexagonal crystal structure piezoelectric material over the substrates 214A, 214B. Preferably, deposited piezoelectric material includes a c-axis having an orientation distribution predominantly in a range of from 25 degrees to 50 degrees (or in a subrange of from 30 degrees to 40 degrees) relative to normal of a face of the substrates 214A, 214B. In certain embodiments, each substrate 214A, 214B is circular in shape and includes a diameter of about 100 mm.

In certain embodiments, a collimator assembly is configured to move (e.g., translate) during operation of a linear sputtering apparatus, such as to prevent formation of a "shadow" pattern that would otherwise be formed on a surface (e.g., substrate or wafer) receiving deposited piezoelectric material following transit of metal atoms through the collimator assembly. Such a collimator assembly is preferably electrically biased to a non-zero voltage during sputtering operation. FIGS. 29A and 29B provide plots of bias voltage versus time for operation of an electrically biased collimator that forms a two-dimensional grid, such as shown in FIG. 19. FIG. 29A shows a bias voltage that varies from about 2 V to about 14 V, FIG. 29B shows that the bias voltage has a primary oscillation frequency of about 3 Hz, and FIG. 29A shows that the bias voltage further exhibits secondary oscillations that are due to translation of the collimator assembly.

In certain embodiments, a deposition system includes multiple linear sputtering apparatuses, a substrate table that is translatable between different positions (e.g., at different stations and/or to different chambers) proximate to different linear sputtering apparatuses, and one or more collimators arranged between the substrate table and one or more of the respective linear sputtering apparatuses, with a support surface of the substrate table being non-parallel to at least one target surface of the different linear sputtering apparatuses. A representative deposition system 300 including multiple linear sputtering apparatuses is shown in FIGS. 30A and 30B. FIG. 30A illustrates components and piping connections of the deposition system 300, and FIG. 30B includes representation of thermal and control components of the deposition system 300.

Referring to FIG. 30A, the deposition system 300 includes a load lock chamber 302 including an exterior door 304 and a transition door 306, with the load lock chamber 302 being intermediately arranged between a deposition enclosure 334 and an exterior environment to enable transfer of a substrate table 322 and substrates 326 without exposing the deposition enclosure 334 to atmospheric conditions. Contents of the load lock chamber 302 and/or the deposition enclosure 334 may be vented through valves 400, 406 to a vent 422. A vacuum gauge 330 and pressure switches 332 are in sensory communication with the load lock chamber 302. After the substrate table 322 with substrates 326 supported by a support surface 324 is loaded through the exterior door 304 into the load lock chamber 302, a roughing pump 418 and/or a turbomolecular vacuum pump 410 in combination with valves 402, 408, 412 (and a pressure switch 416) may be used to extract gaseous contents of the load lock chamber 302 through an exhaust 420 in order to establish a subatmospheric pressure condition in the load lock chamber 302. Thereafter, the substrate table 322 and substrates 326 may be loaded through the transition door 306 into the deposition enclosure 334, which includes a first station 334A and a second station 334B, optionally divided by a wall or partition 336 whereby the first station 334A may be provided in a first chamber and the second station 334B may be provided in a second chamber. Although FIG. 30A illustrates both stations 334A, 334B as being provided in a single deposition enclosure 334, it is to be recognized that in certain embodiments, separate first and second chambers (not shown) containing the first and second stations 334A, 334B, respectively, may be provided. In such an instance, such chambers are preferably selectively isolated relative to one another, with a first vacuum pumping element being associated with the first chamber and a second vacuum pumping element being associated with the second chamber. Continuing to refer to FIG. 30A, a background gas shower nozzle 354 positioned within the deposition enclosure 334 is configured to receive background gas (e.g., an inert gas such as Argon) from a background gas source 364 and a valve 366. In certain embodiments, the substrate table 322 bearing substrates 326 is initially positioned at the first station 334A for deposition of a crystalline seed layer over the substrates 326, and thereafter the substrate table 322 and substrates 326 are moved (e.g., translated) to the second station 334B for deposition of a hexagonal crystal structure piezoelectric material bulk layer over the crystalline seed layer. A differential pump 370 is also provided between the deposition enclosure 334 and the roughing pump 418 proximate to the exhaust 420.

The first station 334A includes a first sputtering cathode assembly 344A arranged to discharge metal atoms from an ejection surface of a first target 346A to transit through a first collimator assembly 348A toward the substrates 326. A magnetron gas source 360A and an associated valve 362A are arranged to supply gas (preferably including a gas that is reactive with the metal atoms, such as nitrogen or oxygen) to gas nozzles 342A arranged downstream of the first collimator assembly 348A. An additional (shower) gas source 356A and an associated valve 358A are arranged to supply additional gas to gas nozzles 340A arranged proximate to the first target 346A. The first sputtering cathode assembly 344A and the first collimator assembly 348A are preferably supported by (e.g., suspended from) a first large flange 350A and a first small flange 352A that is not coaxially aligned with the first large flange 350A, whereby the first large flange 350A may be repositioned to adjust distance between the first target 346A and the substrates 326, and the first small flange 352A may be repositioned to adjust a tilt angle of the first sputtering cathode assembly 344A (and the first collimator assembly 348A) relative to the substrates 326. As shown in FIG. 30A, the first sputtering cathode assembly 344A and the first collimator assembly 348A may be positioned at a relatively shallow angle relative to the substrates 326, in order to promote growth of a crystalline seed layer including a c-axis having an orientation distribution predominantly in a range of from 0 degrees to 35 degrees relative to normal of a face of the substrates 326.

The second station 334B includes a second sputtering cathode assembly 344B arranged to discharge metal atoms from an ejection surface of a second target 346B to transit through a second collimator assembly 348B toward the substrates 326. A movable truck 338 including electrical biasing hardware is arranged proximate to the substrate table 322 to translate the substrate table 322 and bias the substrate table 322 to an electrical potential other than ground to enhance control of material deposition during use of the second sputtering cathode assembly 344B. A magnetron gas source 360B and an associated valve 362B are arranged to supply gas (preferably including a gas that is reactive with the metal atoms) to gas nozzles 342B arranged downstream of the second collimator assembly 348B. An additional (shower) gas source 356B and an associated valve 358B are arranged to supply additional gas to gas nozzles 340B arranged proximate to the second target 346B. The second sputtering cathode assembly 344B and the second collimator assembly 348B are preferably supported by (e.g., suspended from) a second large flange 350B and a second small flange 352B that is not coaxially aligned with the second large flange 350B, whereby the second large flange 350B may be repositioned to adjust distance between the second target 346B and the substrates 326, and the second small flange 352B may be repositioned to adjust a tilt angle of the second sputtering cathode assembly 344B (and the second collimator assembly 348B) relative to the substrates 326. As shown in FIG. 30A, the second sputtering cathode assembly 344B and the second collimator assembly 348B may be positioned at a steeper angle relative to the substrates 326, in order to promote growth of a hexagonal crystal structure piezoelectric material bulk layer including a c-axis having an orientation distribution predominantly in a range of from 25 degrees to 50 degrees (or in a subrange of from 30 degrees to 40 degrees) relative to normal of a face of the substrates 326. Further provided in sensory communication with the deposition enclosure 334 are pressure switches 372 and vacuum gauges 368, 374. The latter vacuum gauge 374 is arranged to provide feedback to a valve 388 arranged between the deposition enclosure 334 and a cryogenic pumping system 376, which includes a cryopump 380, an overpressure valve 384, a cryopumping exhaust valve 386, and a purge valve 382 coupled to a purge gas source 378. The cryopump 380 is further coupled with a cryocompressor 392. The cryopumping exhaust valve 386 and an enclosure exhaust valve 390 are both coupled to exhaust piping monitored by a vacuum gauge 396 and coupled to a roughing pump 394 arranged to remove gas to an exhaust 398.

Referring to FIG. 30B, the load lock chamber 302 of the deposition system 300 includes a substrate heater 312 arranged to receive power from a transformator 316 to heat the substrates 326 supported by the support surface 324 of the substrate table 322, and includes substrate table heaters 314 arranged to receive power from a transformator 318 to heat the substrate table 322. A load lock chamber heating controller 320 is arranged to receive temperature feedback signals from a substrate pyrometer 308 and a substrate table pyrometer 310 to provide control signals to the transformators 316, 318. The heaters 312, 314 may be used to eliminate any vapor (e.g., water vapor and/or cleaning solvent) from the substrates 326 and the substrate table 322 that may be present after loading the substrate table 322 and substrates 326 through the exterior door 304. After vapor removal is complete and appropriate subatmospheric conditions are established in the load lock chamber 302, the substrate table 322 and substrates 326 may be moved through the transition door 306 into the deposition enclosure 334, preferably to a first station 334A proximate to the first sputtering cathode assembly 344A. As noted previously, the deposition enclosure 334 may be subdivided into a first station 334A and a second station 334B, optionally divided by a wall or partition 336; alternatively, a first station may be provided in a first chamber, and a second station may be provided in a second chamber, wherein the respective stations are preferably selectively isolatable relative to one another. Continuing to refer to FIG. 30B, the deposition enclosure 334 includes a chamber heater 448 coupled to a heating element 446. Additionally, localized heating of the substrate table 322 may be accomplished with heaters (e.g., infrared heaters) 424A-424C each coupled to a corresponding heating transformator 426A-426C that is controlled by a deposition enclosure heating controller 430 that receives temperature feedback signals from pyrometers 436A-436C arranged proximate to the heaters 424A-424C. A first DC generator 442A coupled to a reactive sputtering controller 440 is arranged to supply power to the first sputtering cathode assembly 344A, and a first crystal oscillator monitor 428A coupled to a first oscillator 438A is provided to monitor the first target 346A to provide information regarding material deposition rate during operation of the first sputtering cathode assembly 344A. A second DC generator 442B coupled to the reactive sputtering controller 440 is arranged to supply power to the second sputtering cathode assembly 344B, and a second crystal oscillator monitor 428B coupled to a second oscillator 438B is provided to monitor the second target 346B to provide information regarding material deposition rate during operation of the second sputtering cathode assembly 344B. Thickness of one or more material films deposited over the substrates 326 is monitored with a film thickness monitor 444. A radio frequency generator 432 and a transformator 434 are coupled to electrical biasing hardware associated with a movable truck 338 arranged proximate to the substrate table 322 to bias the substrate table 322 to an electrical potential other than ground to enhance control of material deposition during use of the second sputtering cathode assembly 344B. The first sputtering cathode assembly 344A and the first collimator assembly 348A are preferably supported by (e.g., suspended from) a first large flange 350A and a first small flange 352A that is not coaxially aligned with the first large flange 350A, and the second sputtering cathode assembly 344B and the second collimator assembly 348B are preferably supported by (e.g., suspended from) a second large flange 350B and a second small flange 352B that is not coaxially aligned with the second large flange 350B.

Preferably, a crystalline seed layer as described herein is grown over the substrates 326 at the first station 334A using the first sputtering cathode assembly 344A (optionally in conjunction with the first collimator assembly 348A), then the substrate table 322 supporting the substrates 326 is moved (e.g., translated) to the second station 334B, and a hexagonal crystal structure piezoelectric material bulk layer as described herein is grown over the crystalline seed layer at the second station 334B. In this manner, a second growth step (for growing a piezoelectric material bulk layer such as aluminum nitride or zinc oxide) may be performed in a sequential manner in a subatmospheric environment following the first growth step (for growing the crystalline seed layer) without any need for removing the at least one resonator device complex into an atmospheric pressure environment before the second growth step (e.g., which would otherwise require significant time and energy to establish subatmospheric conditions at the second station 334B, and may otherwise require performance of additional steps to avoid introduction of particulates and other contaminants that could lead to defects in finished devices).

Various embodiments disclosed herein relate to use of at least one linear sputtering apparatus and at least one multi-aperture collimator for depositing a crystalline seed layer over a substrate, and for depositing a tilted c-axis hexagonal crystal structure piezoelectric material bulk layer over the crystalline seed layer (with the c-axis hexagonal crystal structure piezoelectric material bulk layer being compositionally matched to the crystalline seed layer in preferred embodiments). It has been determined that providing a crystalline seed layer below the piezoelectric material bulk layer beneficially enables a greater angle of c-axis distribution range than can be achieved in the absence of a crystalline seed layer (as apparent by comparison of FIGS. 31 and 32), and that increasing pressure during deposition of the crystalline seed layer increases uniformity of the c-axis angular distribution range of the piezoelectric material bulk layer (as apparent by comparison of FIGS. 32 and 33). Such points are further detailed below.

FIG. 31 is a plot of intensity versus c-axis angle for X-ray diffraction analysis of a tilted c-axis AlN bulk layer formed over a substrate without an intervening seed layer. As shown, peak intensity is shown at a c-axis angle of about 7 degrees, with the angular distribution declining in a nearly asymptotic manner for c-axis angles greater than about 16 degrees, exhibiting negligible intensity for c-axis angles above about 20 degrees. FIG. 32 is a plot of intensity versus c-axis angle for X-ray diffraction analysis of a tilted c-axis AlN bulk layer formed over an AlN seed layer supported by a substrate (of the same type used in FIG. 31 and grown in the same apparatus under similar AlN layer growth conditions), with the seed layer formed at a deposition pressure of 5 mT. In contrast to FIG. 31, FIG. 32 shows attainment of peak intensity at a c-axis angle of about 30 degrees, with a substantially smaller secondary peak visible around 7 degrees, wherein the intensity value of the secondary peak is less than about one eighth the intensity value of the primary peak visible at about 30 degrees. FIGS. 31 and 32 in combination therefore evidence that presence of crystalline AlN seed material enables growth of an AlN bulk layer having a greater c-axis tilt angle than can be attained by depositing an AlN bulk layer over a substrate without an intervening seed layer. As noted above, increasing deposition pressure for growth of the crystalline seed layer has been found to increase uniformity of the c-axis angular distribution range of the piezoelectric material bulk layer. FIG. 33 is a plot of intensity versus c-axis angle for X-ray diffraction analysis of a tilted c-axis AlN bulk layer formed over an AlN seed layer supported by a substrate, with the seed layer formed at a comparatively higher pressure of 15 mT. Growth of crystalline AlN seed material at 15 mT takes significantly longer than growth of the same thickness of crystalline AlN seed material at 5 mT, but leads to attainment of higher quality in a subsequently deposited AlN bulk layer. In contrast to FIG. 32, FIG. 33 shows near-zero intensity values (i.e., less than about 3 percent) for c-axis angles in a range of from about 0 to 15 degrees. The absence of a significant secondary peak in a c-axis tilt angle range of from about 0 to 15 degrees is expected to increase the ratio of shear coupling coefficient relative to longitudinal coupling coefficient for the piezoelectric bulk material, thereby providing increased shear coupling for enhanced response of resonator devices useable in liquids or other viscous media. Thus, in certain embodiments, less than about 3 percent of a c-axis orientation distribution of a hexagonal crystal structure piezoelectric material bulk layer is in a range of from 0 degrees to 15 degrees relative to normal of a face of the substrate of a bulk acoustic wave resonator device.

FIG. 34 is a plot of squared shear coupling coefficient over squared longitudinal coupling coefficient (shear/long ratio) versus c-axis angle of inclination for AlN, with such plot being derivable from the plot of FIG. 3. As shown in FIG. 34, the shear/long ratio increases more than threefold by increasing the c-axis angle of inclination of AlN from 20 degrees to 30 degrees. For biochemical sensing applications incorporating bulk acoustic wave resonator devices, shear/long ratios are preferably greater than 1, more preferably at least 1.25, more preferably at least 2, and still more preferably at least 3.

FIG. 35 is a plot of squared shear coupling coefficient over squared longitudinal coupling coefficient (shear/long ratio) for a first set of eight AlN film samples (including AlN bulk material) grown according to three growth conditions (i.e., no seed layer, presence of an AlN seed layer grown at 5 mT, and presence of an AlN seed layer grown at 15 mT). The horizontal dashed line represents a desired minimum shear/long ratio value of 1.25. As shown, the shear/long ratio was less than 0.5 for all four samples with no seed layer, and was also less than 0.5 for the single sample including a seed layer grown at 5 mT. In contrast, the shear/long ratio values for all samples that included a seed layer grown at 15 mT were greater than 1.5. This data set shows that shear/long ratio may be enhanced by the presence of an AlN seed layer grown at 15 mT.

FIG. 36 is a plot of squared shear coupling coefficient over squared longitudinal coupling coefficient (shear/long ratio) for a second set of twenty-four AlN film samples grown according to three growth conditions (i.e., no seed layer, presence of an AlN seed layer grown at 5 mT, and presence of an AlN seed layer grown at 15 mT). The horizontal dashed line represents a desired minimum shear/long ratio value of 1.25. As shown, the shear/long ratio was less than 0.5 for all five samples with no seed layer, while shear/long ratio values varied from a minimum of about 0.5 to a maximum of nearly 2.5 (with an average value closer to about 1.2) for the fourteen samples including a seed layer grown at 5 mT. Significant variability in shear/long ratio values was exhibited by the samples including a seed layer grown at 5 mT. In contrast, the shear/long ratio was greater than 1.25 for all five samples with a seed layer grown at 15 mT, demonstrating a higher average shear/long ratio and less variability in shear/long ratio as compared to the samples grown at 5 mT.

Hexagonal crystal structure piezoelectric materials, such as AlN grown utilizing systems and methods disclosed herein, preferably exhibit controlled stress and densely packed columnar grains or recrystallized grain structure. FIG. 37A is a cross-sectional scanning electrode microscopy (SEM) photograph (50,000× magnification) of an AlN bulk layer 450A deposited over an AlN seed layer (barely visible) grown at 5 mT and an aluminum thin film 452A over a substrate 454A. The AlN seed layer is vertically aligned, and a transition to the AlN bulk layer 450A is where tilted AlN grains initiate growth. FIG. 37B is a SEM photograph (50,000× magnification) of a top surface of the AlN bulk layer 450A of FIG. 37A. For comparison, FIG. 38A is a cross-sectional SEM photograph (50,000× magnification) of an AlN bulk layer 450B deposited over an AlN seed layer (barely visible) grown at 15 mT over an aluminum thin film 452B and over a substrate 454B, and FIG. 38B is a SEM photograph (50,000× magnification) of a top surface of the AlN bulk layer 450B of FIG. 38A. As shown in the foregoing four figures, the AlN bulk layer 450B provided over an AlN seed layer at 15 mT exhibits a denser and more regular grain structure than the AlN bulk layer 450A grown over an AlN seed layer grown at 5 mT. This appears consistent with a comparison between FIGS. 32 and 33, in which less variability in c-axis tilt angle was found for an AlN bulk layer provided over an AlN seed layer grown at 15 mT than for an AlN bulk layer provided over an AlN seed layer grown at 5 mT.

FIG. 39 is a cross-sectional view SEM photograph (50,000× magnification) of an AlN bulk layer having a c-axis tilted 35 degrees relative to normal of an underlying substrate. The AlN bulk layer was deposited using a collimator-to-substrate angle of 36 degrees utilizing a deposition reactor according to the design of FIGS. 9 and 10.

As noted previously, electrical biasing of the substrate table and/or the collimator to a potential other than ground may be utilized during deposition of piezoelectric material such as AlN. FIG. 40A is a cross-sectional SEM photograph (50,000× magnification) of a portion of an AlN bulk layer grown at 1.2 mT without the use of an AlN seed layer and without the use of collimator biasing. FIG. 40B is a cross-sectional SEM photograph (75,000× magnification) of a portion of the same film of FIG. 40A, with the AlN bulk layer exhibiting a c-axis tilt angle of 9.63 degrees relative to normal of a substrate. For comparison, FIG. 41A is a cross-sectional SEM photograph (50,000× magnification) of a portion of an AlN bulk layer grown at 0.6 to 0.8 mT with use of collimator biasing at 60V. FIG. 41B is a cross-sectional SEM photograph (75,000× magnification) of a portion of the same film of FIG. 41A with an AlN bulk layer grown without the use of an AlN seed layer but with the use of collimator biasing. The AlN bulk layer of FIG. 41B exhibits a c-axis tilt angle of 6.83 degrees relative to normal of a substrate. A visual comparison between FIGS. 40B and 41B suggests that the use of collimator biasing may result in more densely packed columnar grains or recrystallized grain structure. Separately, Applicant has found that collimator biasing tends to improve influence microstructure development of tilted c-axis piezoelectric bulk material in a bulk acoustic wave resonator device.

Embodiments as disclosed herein may provide one or more of the following beneficial technical effects: enablement of growing inclined c-axis hexagonal crystalline material films (preferably of high tilt angles) over large area substrates without significant variation in c-axis tilt angle, facilitating efficient manufacture of c-axis hexagonal crystalline material films of high tilt angles over large area substrates for production of bulk acoustic wave resonator structures; and enhanced control of deposition of inclined c-axis hexagonal crystalline material films.

Upon reading the following description in light of the accompanying drawing figures, those skilled in the art will understand the concepts of the disclosure and will recognize applications of these concepts not particularly addressed herein. Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A deposition system comprising:
   a first linear sputtering apparatus comprising a first target surface configured to eject metal atoms;
   a second linear sputtering apparatus comprising a second target surface configured to eject metal atoms;
   a substrate table comprising a support surface that is configured to receive at least one wafer and that is coupled to a translation element, wherein the translation element is configured to translate the substrate table and the at least one wafer in a first translation direction between a first position proximate to the first linear sputtering apparatus and a second position proximate to the second linear sputtering apparatus; and
   a collimator associated with the second linear sputtering apparatus, the collimator comprising a plurality of guide members defining a plurality of collimator apertures arranged between the second linear sputtering apparatus and the substrate table when the support surface is proximate to the second linear sputtering apparatus, the collimator being linearly translatable in a second translation direction substantially perpendicular to the first translation direction and parallel to the second target surface;
   wherein at least one of the first target surface or the second target surface is arranged non-parallel to the support surface.

2. The deposition system of claim 1, further comprising an additional collimator comprising a first plurality of guide members defining a first plurality of collimator apertures arranged between the first linear sputtering apparatus and the substrate table when the support surface is proximate to the first linear sputtering apparatus.

3. The deposition system of claim 1, further comprising a load lock chamber, wherein the translation element is configured to translate the substrate table and the at least one wafer from the load lock chamber to at least one of the first position or the second position.

4. The deposition system of claim 1, further comprising:
   an enclosure containing the first linear sputtering apparatus, the second linear sputtering apparatus, the collimator associated with the second linear sputtering apparatus, and the substrate table; and
   at least one vacuum pumping element configured to generate at least one subatmospheric pressure condition within the enclosure.

5. The deposition system of claim 1, further comprising a first vacuum pumping element configured to generate a first subatmospheric pressure condition in a first chamber containing the first linear sputtering apparatus, and comprising a second vacuum pumping element configured to generate a second subatmospheric pressure condition in a second chamber containing the second linear sputtering apparatus.

6. The deposition system of claim 1, wherein the second plurality of guide members is arranged non-perpendicular to the support surface.

7. The deposition system of claim 1, wherein the substrate table is electrically biased to a potential other than ground.

8. The deposition system of claim 2, wherein the additional collimator is electrically biased to a potential other than ground.

9. The deposition system of claim 1, wherein the first linear sputtering apparatus comprises a first linear magnetron that includes a first sputtering cathode operatively coupled to the first target surface to promote ejection of metal atoms from the first target surface, and wherein the second linear sputtering apparatus comprises a second linear magnetron that includes a second sputtering cathode operatively coupled to the second target surface to promote ejection of metal atoms from the second target surface.

10. The deposition system of claim 1, wherein the second plurality of guide members comprises a second plurality of longitudinal members and a second plurality of transverse members that form a second grid.

11. The deposition system of claim 1, wherein the collimator associated with the second linear sputtering apparatus is configured to translate linearly during operation of the second linear sputtering apparatus.

12. The deposition system of claim 1, wherein the second target surface is oriented 15 to 55 degrees apart from the support surface.

13. The deposition system of claim 1, wherein the support surface is configured to receive at least two wafers each having a diameter of at least 50 mm.

14. The deposition system of claim 1, wherein each of the first target surface and the second target surface comprises aluminum or zinc and is configured to eject aluminum atoms or zinc atoms.

15. The deposition system of claim 1, being configured to receive a supply of sputtering gas, wherein the sputtering gas comprises a gas species adapted to react with the metal atoms.

16. The deposition system of claim 1, including at least one wafer received by the support surface, wherein an acoustic reflector structure is arranged over the at least one wafer, and at least one electrode structure is arranged over at least a portion of the acoustic reflector structure.

17. The deposition system of claim 1, including at least one wafer received by the support surface, wherein the at least one wafer comprises a substrate defining a recess, a support layer is arranged over the recess, and an electrode structure is arranged over the support layer.

18. The deposition system of claim 2, further comprising:
a first deposition aperture arranged between the additional collimator and the substrate table;
a first uniformity shield configured to permit adjustment of dimensions of the first deposition aperture;
a second deposition aperture arranged between the collimator associated with the second linear sputtering apparatus and the substrate table; and
a second uniformity shield configured to permit adjustment of dimensions of the second deposition aperture.

19. The deposition system of claim 2, wherein:
the first linear sputtering apparatus, optionally in conjunction with the additional collimator, is configured for growth of a crystalline seed layer over the at least one wafer, the crystalline seed layer comprising a c-axis having an orientation distribution predominantly in a range of from 0 degrees to 35 degrees relative to normal of a face of the at least one wafer; and
the second linear sputtering apparatus and the collimator associated with the second linear sputtering apparatus are configured for growth of a hexagonal crystal structure piezoelectric material bulk layer over the crystalline seed layer, the hexagonal crystal structure piezoelectric material bulk layer comprising a c-axis having an orientation distribution predominantly in a range of from 30 degrees to 50 degrees relative to normal of a face of the at least one wafer.

20. The deposition system of claim 19, wherein:
the support surface is configured to receive the at least one wafer, said at least one wafer having a diameter of at least 50 mm;
the first linear sputtering apparatus, optionally in conjunction with the first collimator, is configured for growth of the crystalline seed layer covering at least about 50% of a face of the at least one wafer; and
the second linear sputtering apparatus and the collimator associated with the second linear sputtering apparatus are configured for growth of the hexagonal crystal structure piezoelectric material bulk layer covering at least about 50% of a face of the at least one wafer.

21. A deposition system comprising:
a linear sputtering apparatus comprising a target surface, the linear sputtering apparatus being rotatably supported by a first flange, the target surface being rotatable about a first rotating axis;
a collimator operably coupled with the linear sputtering apparatus and rotatably supported by a second flange, the second flange being non-coaxially aligned with the first flange, the collimator being rotatable about a second rotating axis parallel and non-coaxial with the first rotating axis; and
a substrate table comprising a support surface configured to receive at least one wafer, the substrate table being translatable in a first linear direction, and the collimator being translatable in a second linear direction substantially perpendicular to the first linear direction.

22. The deposition system of claim 21 further comprising:
a second linear sputtering apparatus comprising a second target surface, the second linear sputtering apparatus being rotatably supported by a third flange; and
a second collimator operably coupled with the second linear sputtering apparatus and rotatably supported by a fourth flange, the fourth flange being non-coaxially aligned with the third flange.

* * * * *